US010706885B2

(12) United States Patent
Aritsuka et al.

(10) Patent No.: US 10,706,885 B2
(45) Date of Patent: Jul. 7, 2020

(54) METHOD FOR MANUFACTURING INFORMATION RECORDING MEDIUM

(71) Applicant: DAI NIPPON PRINTING CO., LTD., Tokyo-to (JP)

(72) Inventors: Yuki Aritsuka, Tokyo (JP); Naoko Nakata, Tokyo (JP); Hirokazu Oda, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 89 days.

(21) Appl. No.: 15/761,407

(22) PCT Filed: Sep. 9, 2016

(86) PCT No.: PCT/JP2016/077352
§ 371 (c)(1),
(2) Date: Mar. 19, 2018

(87) PCT Pub. No.: WO2017/047725
PCT Pub. Date: Mar. 23, 2017

(65) Prior Publication Data
US 2018/0268858 A1    Sep. 20, 2018

(30) Foreign Application Priority Data

Sep. 18, 2015    (JP) .................................. 2015-185640

(51) Int. Cl.
*G11B 7/26*    (2006.01)
*G11B 7/0033*  (2006.01)
(Continued)

(52) U.S. Cl.
CPC .......... *G11B 7/263* (2013.01); *B29C 33/3878* (2013.01); *B29C 43/02* (2013.01);
(Continued)

(58) Field of Classification Search
CPC ........... G11B 7/263; G11B 7/261; G11B 7/26; G11B 7/2531; G11B 7/0033;
(Continued)

(56) References Cited

U.S. PATENT DOCUMENTS 4,264,551 A * 4/1981 Oonishi ................. G03C 1/705
                                                        264/107
5,238,786 A * 8/1993 Kashiwagi ............... G11B 7/26
                                                         216/24
(Continued)

FOREIGN PATENT DOCUMENTS

JP    S62-277641 A    12/1987
JP    3-108141 A       5/1991
(Continued)

OTHER PUBLICATIONS

May 13, 2019 Office Action issued in Japanese Patent Application No. 2018-146644.
(Continued)

*Primary Examiner* — Jeffrey M Wollschlager
(74) *Attorney, Agent, or Firm* — Oliff PLC

(57) ABSTRACT

The same digital data is recorded with highly integrated manner on a plurality of media able to durably hold information over long-term. A minute graphic pattern indicating data bit information is drawn on a resist layer formed on a quartz glass substrate by exposing a beam and developed so as to prepare a master medium (M1), which comprises the quartz glass substrate having a minute recess and protrusion structure formed by etching where the remaining resist are used as a mask (FIG. (a)). The recess and protrusion structure recorded on the master medium (M1) is shaped and transferred onto a flexible recording medium (G2) on which a UV curable resin layer (61) is formed, whereby an intermediate medium (M2) is prepared (FIGS. (b)-(d)). The inverted recess and protrusion structure transferred to the (Continued)

intermediate medium (M2) is shaped and transferred onto a recording medium (G3) comprising a quartz glass substrate (70) on which a UV curable resin layer (80) is formed, whereby a reproduction medium (M3) having the same recess and protrusion structure as that of the master medium (M1) is prepared (FIGS. (e)-(h)). In shaping and transferring process, the media are separated using the flexibility of the intermediate medium (M2).

17 Claims, 16 Drawing Sheets

(51) Int. Cl.
| | | |
|---|---|---|
| G11B 7/2531 | (2013.01) | |
| H01L 21/027 | (2006.01) | |
| B29C 59/02 | (2006.01) | |
| G03F 7/20 | (2006.01) | |
| G03F 9/00 | (2006.01) | |
| B29C 33/38 | (2006.01) | |
| B29C 43/02 | (2006.01) | |
| B29C 43/50 | (2006.01) | |
| G03F 7/00 | (2006.01) | |
| B29L 17/00 | (2006.01) | |

(52) U.S. Cl.
CPC .............. *B29C 43/50* (2013.01); *B29C 59/02* (2013.01); *G03F 7/0002* (2013.01); *G03F 7/20* (2013.01); *G03F 7/2053* (2013.01); *G03F 7/2059* (2013.01); *G03F 9/00* (2013.01); *G11B 7/0033* (2013.01); *G11B 7/2531* (2013.01); *G11B 7/26* (2013.01); *G11B 7/261* (2013.01); *H01L 21/027* (2013.01); *B29K 2909/08* (2013.01); *B29L 2017/001* (2013.01)

(58) Field of Classification Search
CPC .... G03F 7/2059; G03F 7/0002; G03F 7/2053; G03F 9/00; G03F 7/20; B29C 33/3878; B29C 43/02; B29C 43/50; B29C 59/02; H01L 21/027; B29K 2909/08; B29L 2017/001
See application file for complete search history.

(56) References Cited

U.S. PATENT DOCUMENTS

| | | | | |
|---|---|---|---|---|
| 2003/0017424 A1* | 1/2003 | Park | ...................... | B82Y 10/00 430/322 |
| 2004/0200368 A1* | 10/2004 | Ogino | .................. | B81C 1/0046 101/34 |
| 2008/0318170 A1* | 12/2008 | Lin | ...................... | B29C 33/424 430/324 |
| 2009/0116363 A1* | 5/2009 | Watanabe | ............ | G11B 7/0025 369/101 |
| 2009/0277574 A1 | 11/2009 | Sugimura et al. | | |
| 2011/0278772 A1* | 11/2011 | Inamiya | ................ | B29C 59/022 264/496 |
| 2014/0097250 A1* | 4/2014 | Antognini | ............ | G06K 7/1404 235/454 |
| 2014/0341009 A1* | 11/2014 | Carson | ............... | G11B 7/24094 369/275.1 |
| 2019/0147206 A1* | 5/2019 | Nakata | ............... | G06K 7/10722 235/451 |

FOREIGN PATENT DOCUMENTS

| | | |
|---|---|---|
| JP | H08-249408 A | 9/1996 |
| JP | 2000-029979 A | 1/2000 |
| JP | 2002-015474 A | 1/2002 |
| JP | 2004-288845 A | 10/2004 |
| JP | 2005-164655 A | 6/2005 |
| JP | 2007-216484 A | 8/2007 |
| JP | 2008-016154 A | 1/2008 |
| JP | 2008-123574 A | 5/2008 |
| JP | 2008-269724 A | 11/2008 |
| JP | 2008-282495 A | 11/2008 |
| JP | 2008282495 * | 11/2008 |
| JP | 2009-98370 A | 5/2009 |
| JP | 2009-163354 A | 7/2009 |
| JP | 2009-277267 A | 11/2009 |
| JP | 4991487 B2 | 5/2012 |
| JP | 5286246 B2 | 6/2013 |
| WO | 2012/032601 A1 | 3/2012 |
| WO | 2014/186738 A2 | 11/2014 |

OTHER PUBLICATIONS

Apr. 10, 2019 Extended Search Report issued in European Patent Application No. 16846596.1.
International Search Report (ISR) and Written Opinion (WO) dated Dec. 13, 2016 for International Application No. PCT/JP2016/077352.
J-PlatPat English abstract of JP 2008-282495 A.
J-PlatPat English abstract of JP 2009-277267 A.
J-PlatPat English abstract of JP 3-108141 A.
Espacenet English abstract of JP 2004-288845 A.
Espacenet English abstract of JP 2008-269724 A.
Espacenet English abstract of JP 2009-98370 A.
Espacenet English abstract of JP 2009-110634 A which corresponds to JP 4991487 B2.
Espacenet English abstract of JP 2011-138577 A which corresponds to JP 5286246 B2.
International Preliminary Report on Patentability (IPRP) dated Mar. 20, 2018 for Application No. PCT/JP2016/077352.
Japanese Office Action dated Mar. 6, 2018 in connection with corresponding Japanese Application No. 2017-100684.
Espacenet English abstract of JP H08-249408 A.
J-PlatPat English abstract of JP 2002-015474 A.
J-PlatPat English abstract of JP 2009-163354 A.
Espacenet English abstract of JP 2007-216484 A.
Espacenet English abstract of JP 2005-164655 A.
May 20, 2019 Office Action issued in Chinese Patent Application No. 201680054267.6.
Dec. 18, 2019 Office Action issued in Chinese Patent Application No. 201680054267.6.

* cited by examiner (a) S: SUBSTRATE TO BE EXPOSED (b)

(c)

(d)

(e)

(a)

(b)

US 10,706,885 B2

METHOD FOR MANUFACTURING INFORMATION RECORDING MEDIUM

RELATED APPLICATION

This application is an application under 35 U.S.C. 371 of International Application No. PCT/JP2016/077352 filed on Sep. 9, 2016, the entire contents of which are incorporated herein by reference.

TECHNICAL FIELD

The present invention relates to a method for manufacturing an information recording medium in which digital data has been recorded and in particular relates to technology which records the same digital data in a plurality of information recording media, with durability maintained.

BACKGROUND ART

Paper has been used as a medium for recording various types of information for a very long time, and many types of information are even now recorded on paper. On the other hand, with advancements in industries, films for recording image information and record disks for recording sound information have been made available. In recent years, due to wide use of computers, there have been used magnetic recording media, optical recording media, semiconductor recording media and others as media for recording digital data.

The above-described information recording media are provided with durability to such an extent that will not cause any trouble in using them, depending on individual use. It may be safe to say that information recording media, for example, printed matter of paper, film and record disks are media which are sufficiently durable when used on a time scale of several years. However, on a time scale of several decades, these information recording media will inevitably deteriorate with the lapse of time and may be unable to maintain recorded information. Further, they may be damaged not only with the lapse of time but also by water and thermal influences.

Further, magnetic recording media, optical recording media, semiconductor recording media and others for computers are provided with durability to such an extent that will not cause trouble in using general electronic devices. However, these media are not designed, with durability on a time scale of several decades taken into account and, therefore, not suitable as permanent information storage media.

On the other hand, in Patent Document 1 given below, as a method for recording information on a durable medium like quartz glass, with a recording capacity enhanced, there has been disclosed a method in which data is recorded three dimensionally at small cells within a cylindrical medium based on a difference in light transmittance, and while the medium is rotated, computer tomography technology is utilized to read out the information. Further, in Patent Document 2, there has been disclosed a method in which in order to attain the same purpose, a cylindrical recording medium is exposed to irradiation of electromagnetic waves by changing an irradiation angle to measure a difference in transmittance and read out information also by utilizing the computer tomography technology.

PRIOR ART DOCUMENTS

Patent Documents

Patent Document 1:
 Japanese Patent No. 4991487

Patent Document 2:
 Japanese Patent No. 5286246

SUMMARY OF THE INVENTION

Problems to be Solved by the Invention

As described above, information recording media currently in general use are designed to be durable for several years to several decades. These media are, therefore, not appropriate as media for passing down information to generations on a longer time scale of several hundred to several thousand years. Physically or chemically vulnerable information recording media, for example, paper, film and record disks, are not expected to be durable for a longer period of time such as several hundred to several thousand years. Of course, information recording media for computers such as magnetic recording media, optical recording media and semiconductor recording media are not appropriate either when used as described above.

In human history, there are stone monuments as information recording media which have passed a time scale of several hundred to several thousand years. It is, however, quite difficult to perform highly integrated recording of information on a stone plate. A stone plate is not appropriate as a medium for recording large capacity information such as digital data for computers.

On the other hand, as described in the technology disclosed in the previous Patent Documents 1 and 2, there is adopted a method in which cylindrical quartz glass is used as a medium to record information therein in a three-dimensional manner, thus making it possible to realize an information recording method which can be highly integrated, with long-term durability maintained. It is, however, necessary to extract information from three-dimensionally dispersed cells in a medium when the information is read out. This requires Fourier transform processing by utilizing computer tomography technology. In other words, unless the computer tomography technology the same as that available at the time of recording the information is taken over after passage of a long-time scale of several hundred to several thousand years, it will be impossible to read out the information.

Thus, an object of the present invention is to provide a method for manufacturing an information recording medium which is capable of recording digital data in a highly integrated manner on a medium which can maintain information with long-term durability and also in which a plurality of media which have recorded the same digital data can be prepared efficiently.

Means to Solve the Problems (1) The first feature of the present invention resides in a method for manufacturing an information recording medium which prepares a plurality of information recording media in which a same digital data has been recorded, the method comprising:

a master medium preparation step in which a process for recording digital data to be stored as a recess and protrusion structure pattern on a recording surface of a first recording medium is performed to prepare a master medium;

an intermediate medium preparation step in which a process for transferring the recess and protrusion structure pattern recorded at the master medium onto a recording surface of a second recording medium is performed to prepare an intermediate medium; and a reproduction medium preparation step in which a process for transferring the recess and protrusion structure pattern recorded at the intermediate medium on a recording surface of a third recording medium is performed to prepare a reproduction medium; wherein in the master medium preparation step, a medium which includes a quartz glass substrate as the first recording medium is used to form a resist layer on a surface of the first recording medium, beam exposure is performed on a surface of the resist layer to draw a graphic pattern which shows bit information of digital data to be stored, the resist layer is developed to remove a part thereof, etching processing is performed, with a remaining part of the resist layer given as a mask, thereby preparing the master medium which includes a quartz glass substrate having a first recess and protrusion structure pattern on a surface thereof, in the intermediate medium preparation step, a shape formation process which utilizes the first recess and protrusion structure pattern formed on the surface of the master medium is performed to form, on the recording surface of the second recording medium, a second recess and protrusion structure pattern which is reverse in recess and protrusion relationship to the first recess and protrusion structure pattern, in the reproduction medium preparation step, a medium which includes a quartz glass substrate as the third recording medium is used to form, on the recording surface of the third recording medium, a third recess and protrusion structure pattern which is reverse in recess and protrusion relationship to the second recess and protrusion structure pattern by a shape formation process which utilizes the second recess and protrusion structure pattern formed on the surface of the intermediate medium, and when the first recording medium and the third recording medium are referred to as a first attribute medium and the second recording medium is referred to as a second attribute medium, at least one of the first attribute medium and the second attribute medium has flexibility, and in the shape formation process of the intermediate medium preparation step and the shape formation process of the reproduction medium preparation step, a medium having flexibility is curved and peeled from another medium.

(2) The second feature of the present invention resides in the method for manufacturing an information recording medium according to the first feature, wherein a medium which includes a quartz glass substrate having a thickness which renders rigidity is used as the first attribute medium and a medium having flexibility is used as the second attribute medium, thereby preparing the master medium having rigidity and the reproduction medium having rigidity.

(3) The third feature of the present invention resides in the method for manufacturing an information recording medium according to the second feature, wherein in the master medium preparation step, a medium in which a chromium layer is formed on the upper face of the quartz glass substrate is used as the first recording medium, thereby forming a resist layer on a surface of the first recording medium, beam exposure is performed on a surface of the resist layer to draw a graphic pattern which shows bit information of digital data to be stored, and the resist layer is developed to remove a part thereof, etching processing is performed on the chromium layer, with a remaining part of the resist layer given as a mask, after the remaining part of the resist layer has been peeled and removed, etching processing is performed on the quartz glass substrate, with a remaining part of the chromium layer given as a mask, and the remaining part of the chromium layer is peeled and removed, thereby preparing the master medium composed of a quartz glass substrate having a recess and protrusion structure pattern on the surface thereof.

(4) The fourth feature of the present invention resides in the method for manufacturing an information recording medium according to the second or third feature, wherein in the intermediate medium preparation step, a resin layer having a property to cure by light irradiation is coated to give a thickness which renders flexibility after curing on an upper face of the recess and protrusion structure formed on a surface of the master medium, a resin supporting layer having flexibility is laminated on an upper face of the resin layer, and a laminated structure body composed of the resin layer and the resin supporting layer is utilized as the second recording medium, the resin layer is cured by light irradiation, and a laminated structure body composed of the cured resin layer and the resin supporting layer is curved by utilizing flexibility thereof and peeled from the master medium, thereby preparing the intermediate medium composed of the thus peeled laminated structure body.

(5) The fifth feature of the present invention resides in the method for manufacturing an information recording medium according to the second to fourth features, wherein in the reproduction medium preparation step, a medium in which a chromium layer is formed on an upper face of the quartz glass substrate is used as the third recording medium, and a resin layer having a property to cure by light irradiation is coated on a surface of the chromium layer of the third recording medium, the intermediate medium is covered on an upper face of the resin layer and pressed so that a resin of the resin layer is filled into a recess on the recess and protrusion structure surface, the resin layer is cured by light irradiation, the intermediate medium is curved by utilizing flexibility thereof and peeled from the cured resin layer, a thick part which is formed by a recess and protrusion structure of the cured resin layer is utilized as a mask to perform etching processing on the chromium layer, and a part thereof is removed, after the remaining part of the resin layer is peeled and removed, etching processing is performed on the quartz glass substrate, with a remaining part of the chromium layer given as a mask, and the remaining part of the chromium layer is peeled and removed to prepare the reproduction medium composed of a quartz glass substrate having a recess and protrusion structure pattern on the surface thereof.

(6) The sixth feature of the present invention resides in the method for manufacturing an information recording medium according to the first feature, wherein a medium which includes a quartz glass substrate having a thickness that renders flexibility is used as the first attribute medium and a medium that has rigidity is used as the second attribute medium, thereby preparing the master medium having flexibility and the reproduction medium having flexibility.

(7) The seventh feature of the present invention resides in the method for manufacturing an information recording medium according to the first feature, wherein a medium which includes a quartz glass substrate having a thickness that renders flexibility is used as the first attribute medium and a medium having flexibility is used as the second attribute medium, thereby preparing the master medium having flexibility and the reproduction medium having flexibility.

(8) The eighth feature of the present invention resides in the method for manufacturing an information recording medium according to the first to seventh features, wherein the master medium preparation step includes, a data input step in which a computer inputs digital data to be stored, a unit data creating step in which the computer divides the digital data by a prescribed bit length unit to create a plurality of unit data, a unit bit matrix creating step in which the computer arranges data bits which constitute individual unit data in a two-dimensional matrix form to create a unit bit matrix, a unit bit graphic pattern creating step in which the computer converts the unit bit matrix to a geometrical pattern arranged inside a predetermined bit recording domain, thereby creating a unit bit graphic pattern, a unit recording graphic pattern creating step in which the computer adds an alignment mark to the unit bit graphic pattern, thereby creating a unit recording graphic pattern, a drawing data creating step in which the computer creates drawing data for drawing the unit recording graphic pattern, a beam exposure step in which beam exposure which uses electron beams or laser light is performed on a substrate in which the resist layer is added on the first recording medium, thereby conducting drawing on the basis of the drawing data, and a patterning step in which patterning processing is performed on the substrate which has been exposed, thereby creating the master medium having a physically structured pattern depending on the drawing data.

(9) The ninth feature of the present invention resides in the method for manufacturing an information recording medium according to the eighth feature, wherein in the unit bit graphic pattern creating step, one of individual bits "1" and individual bits "0" which constitute the unit bit matrix is converted to individual bit figures composed of a closed domain, in the drawing data creating step, there is created drawing data which shows a contour line of the individual bit figures, in the beam exposure step, beam exposure is performed on a part inside the contour line of the individual bit figures, and in the patterning step, there is formed a physically structured pattern which has a recess and protrusion structure composed of a recess which shows one of a bit "1" and a bit "0" and a protrusion which shows the other of them.

(10) The tenth feature of the present invention resides in the method for manufacturing an information recording medium according to the ninth feature, wherein in the patterning step, patterning processing is performed so as to form the master medium in which an interior of each bit figure is given as a recess and an exterior thereof is given as a protrusion.

(11) The eleventh feature of the present invention resides in the method for manufacturing an information recording medium according to the eighth to tenth features, wherein in the unit data creating step, the digital data is divided into unit data composed of (m×n) bits, in the unit bit matrix creating step, there is formed a unit bit matrix composed of m rows and n columns, and in the unit bit graphic pattern creating step, individual bits which constitute the unit bit matrix are allowed to correspond to grid points arranged in an m-row and n-column matrix form, a predetermined-shaped bit figure is arranged on a grid point corresponding to a bit "1" or a bit "0," thereby creating a unit bit graphic pattern.

(12) The twelfth feature of the present invention resides in the method for manufacturing an information recording medium according to the eleventh feature, wherein in the unit bit graphic pattern creating step, there is created a unit bit graphic pattern arranged inside a rectangular bit recording domain, in the unit recording graphic pattern creating step, an alignment mark is added outside the rectangular bit recording domain, thereby creating a unit recording graphic pattern arranged inside a rectangular unit recording domain which includes the bit recording domain and the alignment mark, and in the drawing data creating step, the rectangular unit recording domain is arranged in a two-dimensional matrix form, thereby creating a drawing pattern which includes a plurality of unit recording graphic patterns and also creating drawing data for drawing the drawing pattern.

(13) The thirteenth feature of the present invention resides in the method for manufacturing an information recording medium according to the eleventh feature, wherein in the unit bit graphic pattern creating step, there is created a unit bit graphic pattern which is arranged inside a rectangular bit recording domain, in the unit recording graphic pattern creating step, an alignment mark is added outside the rectangular bit recording domain, thereby creating a unit recording graphic pattern which is arranged inside a rectangular unit recording domain including the bit recording domain and the alignment mark, in the drawing data creating step, the rectangular unit recording domain is partially overlapped vertically and laterally and arranged in a two-dimensional matrix form, thereby creating a drawing pattern which includes a plurality of unit recording graphic patterns and creating the drawing data for drawing the drawing pattern, and at a domain overlapped by a pair of unit recording domains adjacently arranged laterally, an alignment mark which is included at a right end of a unit recording domain on a left side is overlapped with an alignment mark which is included at a left end of a unit recording domain on a right side to form a common alignment mark on left and right sides, and at a domain overlapped by a pair of unit recording domains adjacently arranged vertically, an alignment mark which is included at a lower end of a unit recording domain on an upper side is overlapped with an alignment mark which is included at an upper end of a unit recording domain on a lower side to form a common alignment mark on upper and lower sides.

Effects of the Invention

According to the present invention, digital data to be stored is at first recorded as a recess and protrusion structure pattern in a master medium which includes a quartz glass substrate, an intermediate medium is prepared by a transfer step using the master medium and also a reproduction medium which includes a quartz glass substrate is prepared by a transfer step using the intermediate medium. Each of the master medium and the reproduction medium is a medium which includes the quartz glass substrate and able to continuously maintain the same digital data with long-term durability, as a physical recess and protrusion structure.

Further, the recess and protrusion structure is a minute structure which is formed by beam exposure which uses electron beams or laser light and, therefore, able to perform highly integrated recording of information. Although the above-described physical recess and protrusion structure in itself is a three-dimensional structure, information stored therein is available in a two-dimensional pattern and can be read out in a universal method.

As described above, according to the present invention, it is possible to perform highly integrated recording of digital data on a medium capable of maintaining information with long-term durability. Further, the recess and protrusion structure is transferred by a shape formation process, thus making it possible to prepare a reproduction medium from a master medium. It is, therefore, possible to prepare efficiently a plurality of media which have recorded the same digital data.

BEST MODE FOR CARRYING OUT THE INVENTION

Hereinafter, the present invention will be described by referring to an embodiment which illustrates the present invention. The present invention is based on technology by which a substrate is subjected to beam exposure and patterning processing, thereby recording information as a minute physically structured pattern. One example of the above-described technology has been described in Japanese Patent Publication No. 2015-185184 as a former invention. Therefore, for the sake of convenience of description, the former invention will be described in Section 1 to Section 5. It is noted that the following details of Section 1 to Section 5 and those of FIG. 1 to FIG. 12 are substantially the same as those of Section 1 to Section 5 and those of FIG. 1 to FIG. 12 in "Best Mode for Carrying Out the Invention" described in the Publication of the former invention.

<<<Section 1. Basic Embodiment of the Information Storage Device According to the Former Invention>>>

Figure 1:
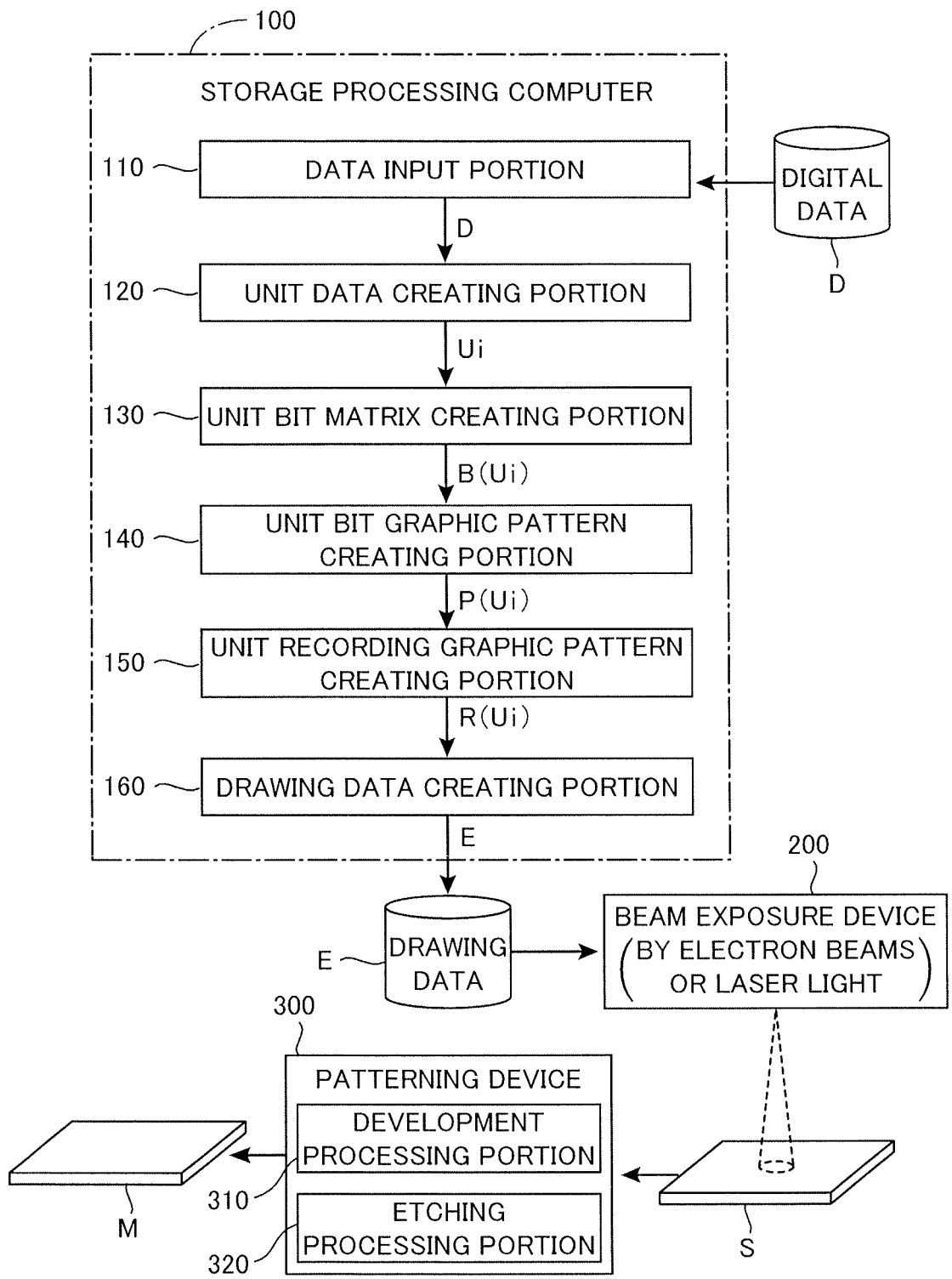
FIG. 1 is a block diagram which shows a constitution of an information storage device which is used in a master medium preparation step of the method for manufacturing an information recording medium according to the present invention.

FIG. 1 is a block diagram which shows a constitution of a basic embodiment of the information storage device according to the former invention. The information storage device of the embodiment is a device which performs functions to write digital data onto an information recording medium and store the data. As shown in the drawing, the device is constituted with a storage processing computer 100, a beam exposure device 200 and a patterning device 300.

Here, the storage processing computer 100 executes processing for creating drawing data E on the basis of digital data D to be stored. The beam exposure device 200 is a device for executing drawing by beam exposure on a substrate 5, which is an information recording medium, by using electron beams or laser light on the basis of this drawing data E, and a drawing pattern is formed on the substrate S by the beam exposure. The patterning device 300 performs pattern processing on the substrate S which has been subjected to exposure, thereby forming a physically structured pattern depending on the drawing data E to prepare an information recording medium M. Finally, information depending on the digital data D is recorded in the information recording medium M as a physically structured pattern.

The storage processing computer 100 is, as shown in the drawing, provided with a data input portion 110, a unit data creating portion 120, a unit bit matrix creating portion 130, a unit bit graphic pattern creating portion 140, a unit recording graphic pattern creating portion 150 and a drawing data creating portion 160. Hereinafter, a sequential description will be given of functions of these individual portions. However, these portions are in reality constituents which are realized by installing dedicated programs into a computer. The storage processing computer 100 can be constituted by installing a dedicated program into a general-purpose computer.

First, the data input portion 110 is a constituent which has functions to input the digital data D to be stored and also has functions to temporarily house the thus input digital data D. The digital data D to be stored may include any type of data such as document data, image data and voice data.

The unit data creating portion 120 is a constituent which creates a plurality of unit data by dividing the digital data D input by the data input portion 110 by a prescribed bit length unit. Here, for the sake of convenience of description, the following description will be given by taking an example in which, as shown at an upper part of FIG. 2, the digital data D is divided by a unit of bit length u to create four sets of unit data, and the i-th unit data is indicated with a symbol of Ui (in this example, i=1 to 4). Hereinafter, any term having the word "unit" used in the following explanation indicates that all of the data is generated for "one unit data."

Each of the unit data Ui is not necessarily made equal in bit length and there may be created a plurality of unit data different with each other in bit length. However, it is in practice preferable that a bit recording domain Ab to be described later is given as a domain identical in shape and equal in area. For this reason, it is preferable that a common bit length u is determined in advance to give data in which all the unit data Ui have the same bit length u.

Figure 2:
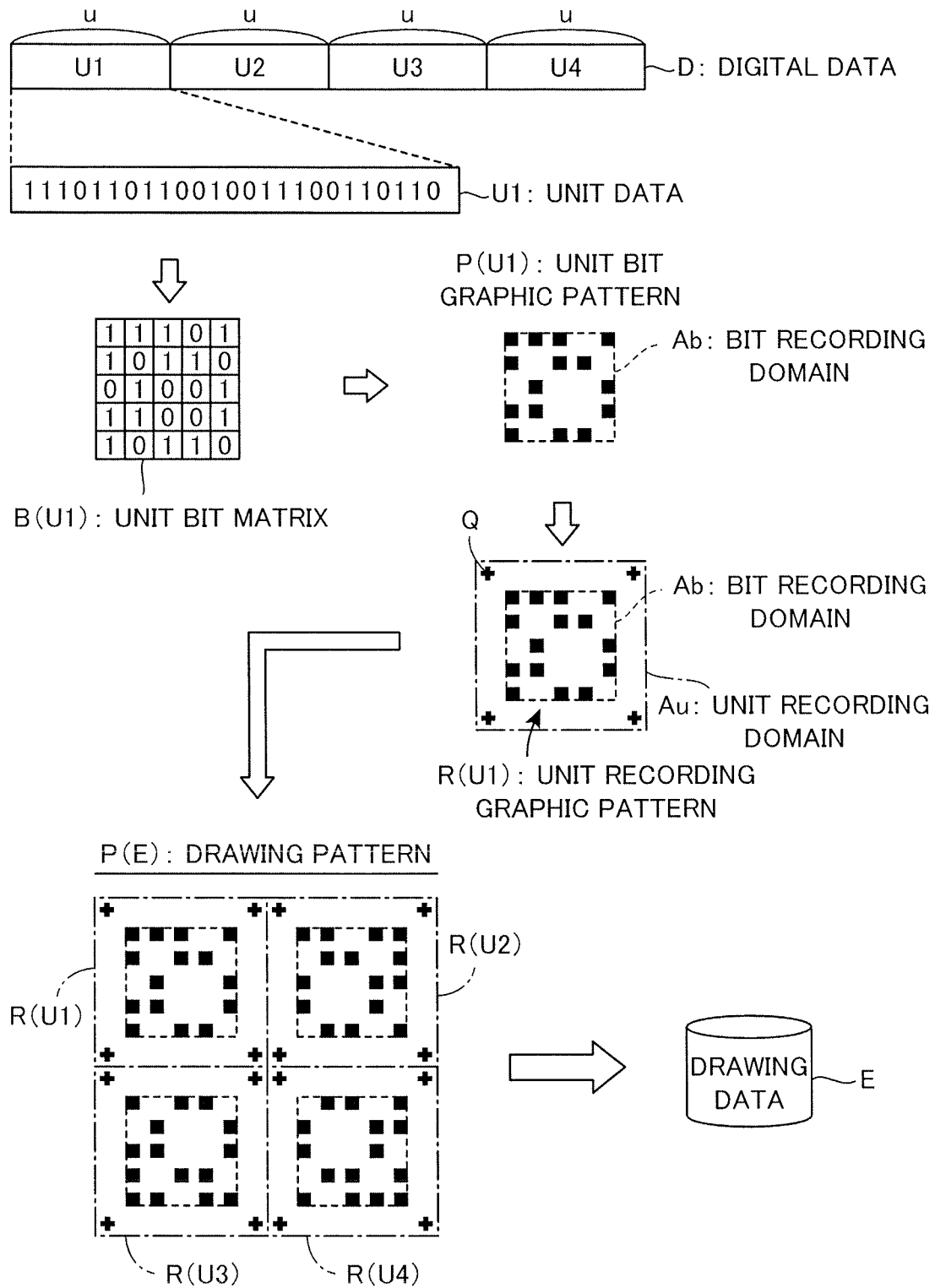
FIG. 2 is a schematic diagram which shows one example of a specific information storage process by the information storage device shown in FIG. 1.

The common bit length u may be set at any given value. However, in practice, u=m×n is set so as to constitute a unit bit matrix which is composed of m rows and n columns, and the unit data creating portion 120 may divide digital data into unit data composed of (m×n) bits. Here, for the sake of convenience of description, there is shown an example in which u is set equal to 25 bits so that m=n=5 is set to constitute a unit bit matrix composed of 5 rows and 5 columns (in practice, the u value is preferably set to give a greater value). The first unit data U1 shown in FIG. 2 is unit data created on the basis of the above-described setting and constituted with 25-bit data.

The unit data creating portion 120 may divide, for example, thus input digital data D by every u bits separately from the leading end, thereby giving unit data U1, U2, U3, etc., individually. In this case, unless an entire length of the digital data D is given as an integral multiple of the bit length u, the length of the last unit data will be less than the bit length u. Thus, where the length of all unit data is desired to be made equal to a common bit length u, a dummy bit may be added to a trailing end of the digital data to adjust so that an entire length is an integral multiple of the bit length u.

It is noted that a method for dividing the digital data D shall not be necessarily restricted to a method in which the data is divided from the leading end thereof by every prescribed bit length u and, for example, where the data is divided into four, there can be adopted such a dividing method that the 1st, 5th, 9th, . . . bits are extracted to give a first unit data U1, the 2nd, 6th, 10th, . . . bits are extracted to give a second unit data U2, the 3rd, 7th, 11th, . . . bits are extracted to give a third unit data U3, the 4th, 8th, 12th, . . . . bits are extracted to give a fourth unit data U4.

Each unit data Ui created by the unit data creating portion 120 is given to the unit bit matrix creating portion 130. The unit bit matrix creating portion 130 performs processing by which data bits which constitute individual unit data Ui are arranged in a two-dimensional matrix form composed of m rows and n columns, thereby creating a unit bit matrix B(Ui).

In FIG. 2, there is shown an example in which 25-bit data that constitutes the first unit data U1 is separated from the leading end thereof by every 5 bits to form 5 groups consisting of "11101," "10110," "01001," "11001" and "10110," thereby creating a unit bit matrix B(U1) composed of a 5-row and 5-column matrix in which individual groups are arranged on one line. Of course, the unit data U2, U3, U4 are also processed in a similar manner to create unit bit matrixes B(U2), B(U3) and B(U4).

Individual unit bit matrixes B(Ui) thus created by the unit bit matrix creating portion 130 are given to the unit bit graphic pattern creating portion 140. The unit bit graphic pattern creating portion 140 performs processing by which each of the unit bit matrixes B(Ui) is converted to a geometrical pattern which is arranged inside a predetermined bit recording domain on a two-dimensional plane, thereby creating a unit bit graphic pattern P(Ui).

At a middle part of FIG. 2, there is shown an actual example of a unit bit graphic pattern P(U1) which has been prepared on the basis of the unit bit matrix B(U1) composed of a 5-row and 5-column matrix. In the case of this actual example, a square bit recording domain Ab (a domain indicated with a broken line in the drawing) is defined on the two-dimensional plane and small square-shaped dots painted in black (hereinafter, referred to as a bit figure) are arranged therein, by which the unit bit graphic pattern P(U1) is formed.

Here, each of the bit figures corresponds to a bit "1" which constitutes the unit bit matrix B(U1). In other words, a 5-row and 5-column matrix is defined inside the bit recording domain Ab so as to correspond to the unit bit matrix B(U1) and a bit figure is arranged only at a position corresponding to a bit "1" inside the unit bit matrix B(U1), with nothing arranged at a position corresponding to a bit "0." Therefore, the unit bit graphic pattern P(U1) is to express 25-bit information which constitutes the unit bit matrix B(U1) by the presence or absence of the bit figure at each position which constitutes the 5-row and 5-column matrix.

Of course, individual bit figures may be arranged so as to correspond to bits "0" which constitute the unit bit matrix B(U1). In this case, the bit figure is arranged only at a position corresponding to a bit "0" inside the unit bit matrix B(U1) and nothing is arranged at a position corresponding to a bit "1." That is, the unit bit graphic pattern creating portion 140 may perform processing by which, of individual bits "1" and individual bits "0," one of them which constitute the unit bit matrix B(U1) is converted to individual bit figures in a closed domain. A data format which indicates individual bit figures may be given any format. For example, where one bit figure is constituted with a rectangle, as data showing the unit bit graphic pattern P(U1), there can be used data which shows coordinate values of four apexes of each bit figure (coordinate values of two apexes of opposite angles will do). There can also be used data which shows a coordinate value of a center point of each bit figure (a lower left corner point will do) and data which shows lengths of vertical and horizontal sides of a bit figure having a common rectangular shape. Alternatively, where a circular bit figure is adopted, there can be used data which shows a coordinate value of a center point of each bit figure and data which shows a common radius value.

Of course, the unit bit matrixes B(U2), B(U3) and B(U4) created for the respective unit data U2, U3, U4 are also converted to a geometrical pattern by a similar method to create unit bit graphic patterns P(U2), P(U3) and P(U4). Each of the thus created unit bit graphic patterns P(U1) to P(U4) is formed on a medium by a certain method, thus making it possible to record information of the digital data D in a medium. However, in the former invention, with consideration given to the convenience of readout processing to be performed later, an alignment mark is added to each of the unit bit graphic patterns P(U1) to P(U4).

The unit recording graphic pattern creating portion 150 is a constituent which adds the alignment mark, and in the application concerned, the unit bit graphic pattern P(Ui) in a state that the alignment mark is added is referred to as a unit recording graphic pattern R(Ui). Finally, the unit recording graphic pattern creating portion 150 performs processing by which an alignment mark is added to the unit bit graphic pattern P(Ui) created by the unit bit graphic pattern creating portion 140 to create a unit recording graphic pattern R(Ui).

At the middle part of FIG. 2, there is shown an example in which a cross-shaped alignment mark Q is added to each of four corners outside the unit bit graphic pattern P(U1) to create a unit recording graphic pattern R(U1). Here, a domain which includes a bit recording domain Ab (a square enclosed with a broken line) at which the unit bit graphic pattern P(U1) has been formed and the alignment marks Q arranged outside thereof at four corners is referred to as a unit recording domain Au (a square enclosed with a single dotted and dashed line). The unit recording graphic pattern R(U1) is a graphic pattern which is formed inside the unit recording domain Au.

The alignment marks Q are used for recognizing individual bit recording domains Ab in readout processing described in Section 3. Therefore, the alignment marks Q are arranged at a specific position in relation to the bit recording domain Ab (in the example shown in the drawing, positions at four corners outside the bit recording domain Ab). In the drawing, there is shown an example in which cross-shaped alignment marks Q are used. However, any shaped-figure may be used as long as it is a figure which can be distinguished from a bit figure for indicating individual bits (a small square painted in black in the example shown in the drawing).

Further, although in the example shown in the drawing, the alignment marks Q are arranged outside the bit recording domain Ab, it is possible to arrange the alignment marks Q inside the bit recording domain Ab. However, where the marks are arranged inside the bit recording domain Ab, they may interfere with a bit figure which expresses individual bits. Therefore, as shown in the example shown in the drawing, it is in practice preferable that the alignment marks Q are arranged outside the bit recording domain Ab. A description will be again given in Section 4 of a shape of the alignment mark Q and a variation of the arrangement thereof.

In this way, after creation of four sets of unit recording graphic patterns R(U1) to R(U4) by the unit recording graphic pattern creating portion 150, the drawing data creating portion 160 performs processing which creates drawing data E for drawing them. Specifically, as shown at the lower part of FIG. 2, the drawing data creating portion 160 performs processing by which four sets of the unit recording domains R(U1) to R(U4) are arranged in a two-dimensional matrix form (in this example, two rows and two columns) to create a drawing pattern P(E) which includes all four sets of the unit recording graphic patterns R(U1) to R(U4), thereby creating the drawing data E for drawing the drawing pattern P(E).

A description has been so far given of processing functions of the individual constituents of the storage processing computer 100 shown in FIG. 1. The thus created drawing data E is given to the beam exposure device 200. The beam exposure device 200 is a device which performs beam exposure on a substrate S to be exposed on the basis of the drawing data E, and it can be constituted by using an electron beam lithography system or a laser lithography system for semiconductor photolithography used in a manufacturing process of various types of electronic devices. Where an electron beam lithography system is used as the beam exposure device 200, the drawing pattern P(E) is depicted on a surface of the substrate S to be exposed by electron beams. Where a laser lithography system is used as the beam exposure device 200, a drawing pattern P(E) is depicted on a surface of the substrate S to be exposed by laser beams.

In FIG. 2, for the sake of convenience of description, a contour line of the bit recording domain Ab is indicated by a broken line and a contour line of the unit recording domain Au is indicated by a single dotted and dashed line. However, these lines are not constituents of the drawing pattern P(E). A graphic pattern actually depicted on the substrate S to be exposed is a bit figure expressing individual bits (in the case of the example shown in the drawing, a small square painted in black) and a cross-shaped alignment mark Q.

As described above, the drawing data E is data which is given to the beam exposure device 200 to draw the drawing pattern P(E) on the substrate S to be exposed. Therefore, a data format thereof is required to be dependent on the beam exposure device 200 to be used. At present, where an electron beam lithography system or a laser lithography system used in designing a general LSI is used to draw any given graphic pattern, vector-format drawing data is used which indicates a contour line of the graphic pattern. Therefore, in practice, the drawing data creating portion 160 may create drawing data E which shows the contour lines of individual bit figures and alignment marks.

Figure 3:
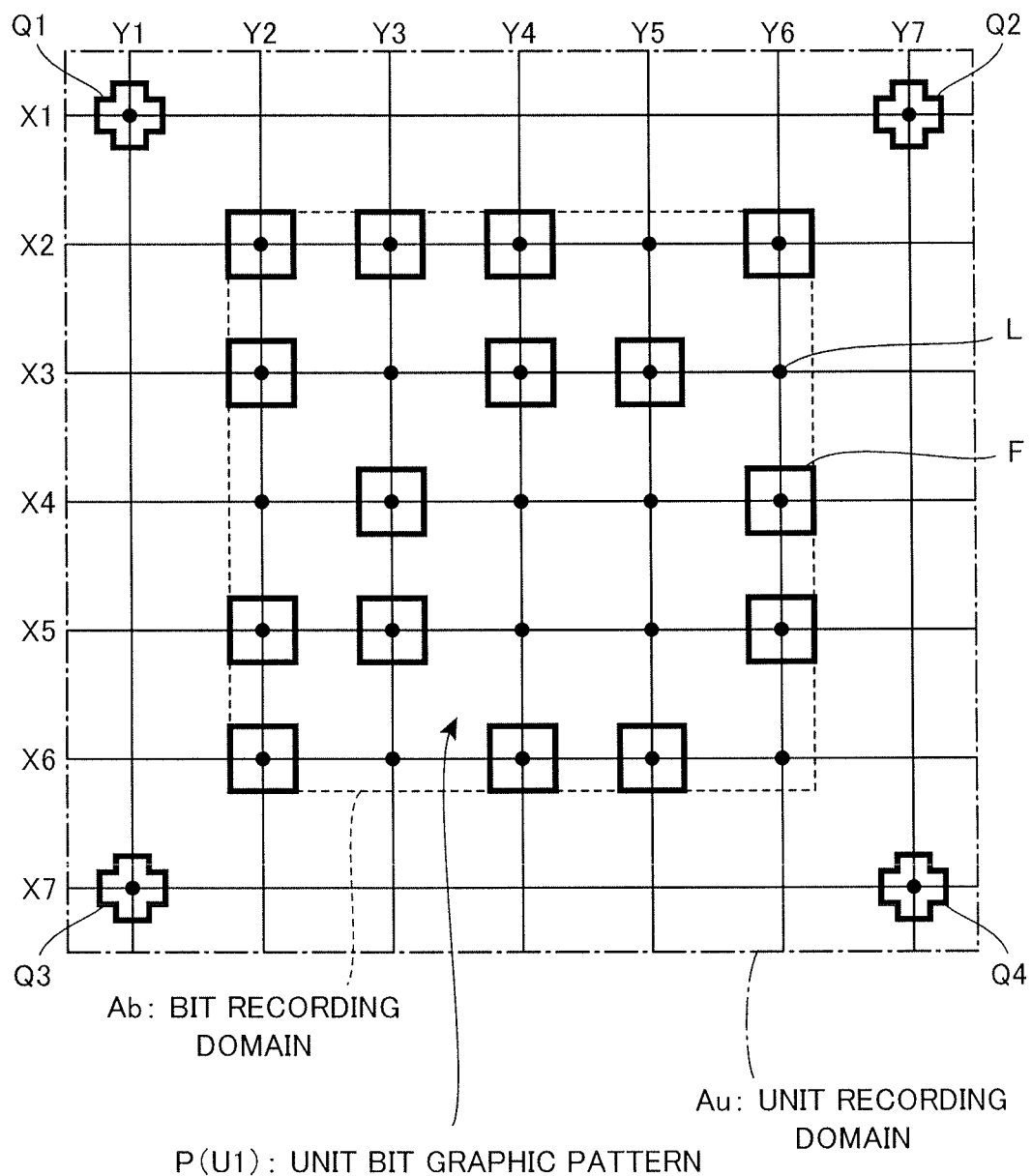
FIG. 3 is an enlarged view of a unit recording graphic pattern R (U1) shown in FIG. 2.

FIG. 3 is an enlarged view of the unit recording graphic pattern R(U1) shown in FIG. 2. In FIG. 2, there is shown an example in which the small square painted in black is used as a bit figure which indicates a bit "1." In the example shown in FIG. 3, each of bit figures F is expressed as vector data which indicates a square contour line. Similarly, each of alignment marks Q1 to Q4 arranged at four corners is expressed as vector data which gives a cross-shaped contour line. On the basis of the drawing data E which shows a contour line of each of the bit figures F and each of the alignment marks Q1 to Q4, the beam exposure device 200 performs processing in which beam exposure is performed on the interior of the contour line thereof. Therefore, as shown in FIG. 2, there are formed square graphic patterns or cross-shaped graphic patterns which are painted in black on the substrate S to be exposed.

In FIG. 3, depicted are horizontal grid lines X1 to X7 arranged at equal intervals and longitudinal grid lines Y1 to Y7 arranged at equal intervals. Each of the grid lines plays a role in determining arrangement positions of individual bit figures F and alignment marks Q1 to Q4. That is, when each of intersection points between the horizontal grid lines X1 to X7 and the longitudinal grid lines Y1 to Y7 is referred to as a grid point L, the individual bit figures F and the alignment marks Q1 to Q4 are arranged so that the centers thereof are positioned at any of the grid points L.

For example, the alignment mark Q1 is arranged on a grid point at which the grid lines X1 and Y1 intersect with each other, the alignment mark Q2 is arranged on a grid point at which the grid lines X1 and Y7 intersect with each other, the alignment mark Q3 is arranged on a grid point at which the grid lines X7 and Y1 intersect with each other, and the alignment mark Q4 is arranged on a grid point at which the grid lines X7 and Y7 intersect with each other.

Further, 25 grid points at which the five horizontal grid lines X2 to X6 intersect individually with the five longitudinal grid lines Y2 to Y6 correspond to the unit bit matrix B(U1) composed of 5 rows and 5 columns shown at the middle part of FIG. 2, and a bit figure F is arranged at a grid point position corresponding to a bit "1" in the unit bit matrix B(U1) (as described previously, the bit figure F may be arranged at a grid point position corresponding to a bit "0").

In general terms, the unit bit graphic pattern creating portion 140 may perform processing by which individual bits which constitute a unit bit matrix B(Ui) composed of m rows and n columns are allowed to correspond to grid points L arranged in a matrix form composed of m rows and n columns to arrange a bit figure F with a predetermined shape on a grid point L corresponding to a bit "1" or a bit "0," thereby creating a unit bit graphic pattern P(Ui).

Of course, figures which are contained in actual drawing data E, that is, figures contained in a drawing pattern P(E), are only individual bit figures F and individual alignment marks Q1 to Q4. In reality, there will not be drawn each of the grid lines X1 to X7 and Y1 to Y7, a contour line of the bit recording domain Ab (a broken line) and a contour line of the unit recording domain Au (a single dotted and dashed line) which are shown in the drawing.

Information which shows actual dimensions of the drawing pattern P(E) drawn on the substrate S to be exposed is also included in the drawing data E. However, the actual dimensions may be set, with consideration given to drawing accuracy of the beam exposure device 200 to be used.

At present, in pattern processing that uses a highly-accurate electron beam lithography system used in a general LSI design, it is possible to stably form a figure having a size of about 40 nm on the substrate S. Therefore, the above-described electron beam lithography system is used as the beam exposure device 200, thus making it possible to set intervals between grid lines shown in the drawing (a pitch of grid points L) to about 100 nm. It is substantially possible to form a bit figure F having one side of about 50 nm. Where a minute graphic pattern is drawn as described above, the bit figure F will not assume in reality an exact square or the alignment marks Q1 to Q4 will not assume an exact cross-shaped form. This will not, however, pose any practical problems.

Originally, it will be sufficient that the bit figure F plays a role in judging a binary state, namely, whether a figure is present at a position of a grid point L. Thus, the bit figure F may assume any shape such as a rectangle or a circle. It is also sufficient that the alignment marks Q1 to Q4 each play a role in indicating a position of the bit recording domain Ab and they may assume any shape as long as they can be distinguished from a bit figure F. Therefore, an electron beam lithography system capable of stably forming a figure having a size of about 40 nm is used, by which, as described above, bit figures F can be arranged at a pitch of about 100 nm on both sides and highly integrated recording of information can be performed.

On the other hand, where a laser lithography system is used as the beam exposure device 200, a spot diameter of laser beams depends on a wavelength of laser light to be used, and a minimum value thereof is approximately equal to the wavelength. For example, where ArF excimer laser is used, a spot diameter thereof will be about 200 nm, and recording of information is thus slightly decreased in degree of integration, as compared with the use of an electron beam lithography system. Nevertheless, it is possible to perform recording of information with the degree of integration similar to that of a generally-used optical recording medium.

In the example shown in FIG. 3, the unit bit graphic pattern P(U1) is a pattern which is arranged inside the rectangular (square-shaped) bit recording domain Ab. The unit recording graphic pattern R(U1) which is constituted by adding the alignment marks Q1 to Q4 thereto is also a pattern which is arranged inside the rectangular (square-shaped) unit recording domain Au. In executing the former invention, it is not always necessary that the bit recording domain Ab or the unit recording domain Au is given as a rectangular domain. However, as shown at the lower part of FIG. 2, when consideration is given to creation of the drawing pattern P(E) by arranging a plurality of unit recording graphic patterns R(U1) to R(U4), it is efficient that the bit recording domain Ab and the unit recording domain Au are both formed into rectangular domains.

Therefore, it is in practice preferable that the unit bit graphic pattern creating portion 140 creates unit bit graphic patterns P(Ui) arranged inside the rectangular bit recording domain Ab, and the unit recording graphic pattern creating portion 150 adds the alignment marks Q1 to Q4 to the exterior of the rectangular bit recording domain Ab, thereby creating unit recording graphic patterns R(Ui) arranged inside the rectangular unit recording domain Au which includes the bit recording domain Ab and the alignment marks Q1 to Q4. Accordingly, the drawing data creating portion 160 arranges these rectangular unit recording domains Au in a two-dimensional matrix manner, thereby creating a drawing pattern P(E) which includes a plurality of unit recording graphic patterns R(U1) to R(U4), thus making it possible to create the drawing data E for drawing the drawing pattern P(E).

The unit recording domain Au may be set to any size. For example, in the example of FIG. 3, there is defined the unit recording domain Au composed of a square having one side of 50 µm and bit figures F are arranged at a pitch of about 100 nm on both sides, thus making it possible to record information of about 30 KB inside one unit recording domain Au. Thus, for example, a square-shaped substrate with one side of about 150 mm is used as an information recording medium, and unit recording domains Au, each composed of a square having one side of 50 µm, are arranged on a two-dimensional matrix on the substrate, by which it is possible to record data as large as 270 GB in one sheet of the information recording medium.

<<<Section 2. Formation of Physically Structured Pattern on Medium>>>

Here, a more detailed description will be given of exposure process by the beam exposure device 200 and patterning process by the patterning device 300 shown in FIG. 1. As described in Section 1, the beam exposure device 200 is a device which performs drawing by beam exposure on the substrate S which is an information recording medium by using electron beams or laser light on the basis of drawing data E. The patterning device 300 is a device which performs pattern processing on the substrate S which has been exposed, thereby creating an information recording medium in which a physically structured pattern (drawing pattern P(E)) has been formed depending on the drawing data E.

In reality, semiconductor lithography systems used in an LSI manufacturing process can also be used, as they are, for the above-described devices. In other words, the beam exposure process by the beam exposure device 200 and the patterning process by the patterning device 300 can be executed by utilizing a general LSI manufacturing process as it is. However, drawing data used in manufacturing LSIs is data which shows graphic patterns for constituting individual domains of semiconductor elements, for example, a channel domain, a gate domain, a source domain, a drain domain and a wiring domain. In contrast, the drawing data E used in the former invention is data which shows a bit figure F indicating a data bit "1" or "0" and a graphic pattern for constituting an alignment mark Q used on readout.

Figure 4:
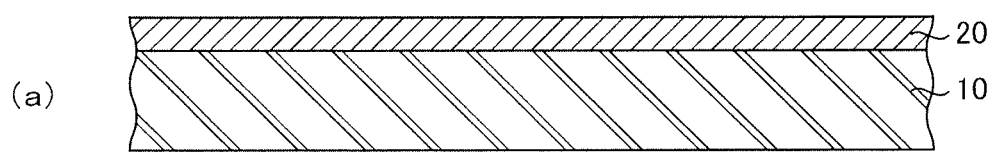
FIG. 4 is s set of side cross-sectional views which show a specific example of an exposure process by a beam exposure device 200 and a patterning process by a patterning device 300 shown in FIG. 1 (only a cross section is shown and a structure at the back is not illustrated).
Figure 4:
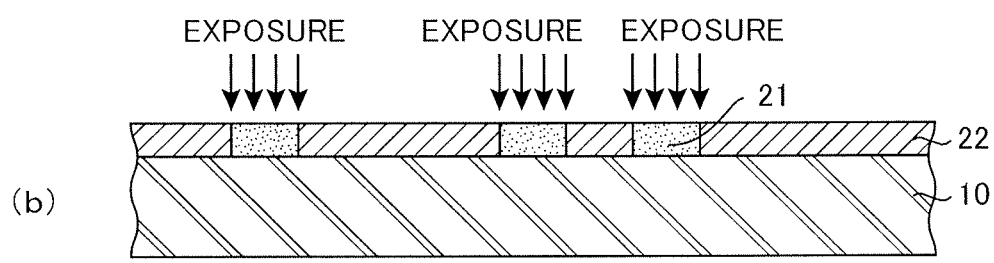
Figure 4:
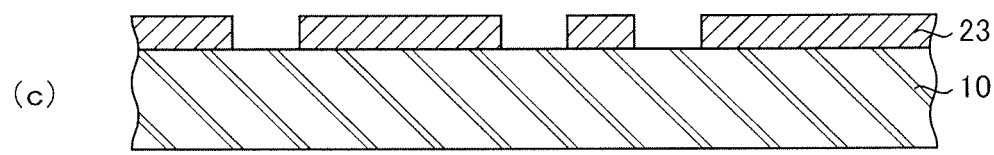
Figure 4:
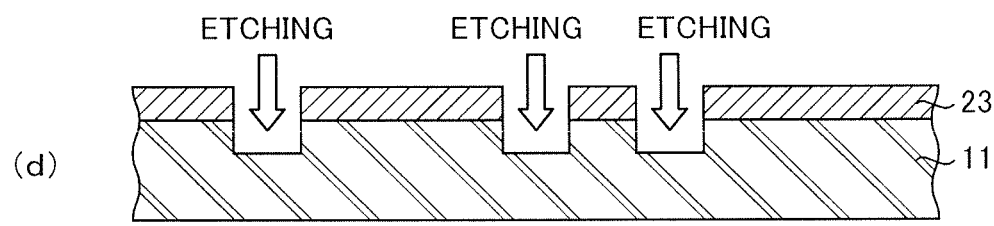
Figure 4:
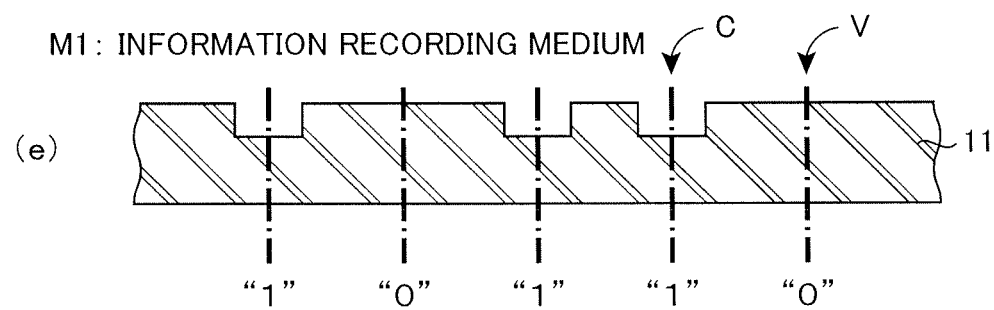

FIG. 4 is s set of side cross-sectional views, each of which shows a specific example of exposure steps by the beam exposure device 200 and patterning steps by the patterning device 300 given in FIG. 1 (only a cross section is shown and a structure at the back is not illustrated). First, there is provided a substrate S to be exposed as shown in FIG. 4(a). In this example, the substrate S to be exposed is constituted with an underlying layer 10 and a resist layer 20. Here, there is shown an example in which the resist layer 20 made up of one layer is used. However, there may be used a resist layer made up of two or more layers where needed in a patterning step to be described later. Further, not only an organic film such as a resist but also an inorganic film such as a metal film (what-is-called, a hard mask which functions as an etching stopper) may be used together.

Here, the underlying layer 10 is a layer which is to be formed in the patterning step and it is finally a part which acts as an information recording medium M in which digital data has been recorded. As already described, an object of the former invention, which is the same as an object of the present invention, is to attain the recording of information, with long-term durability maintained. Therefore, there may be used a substrate made of a material suitable in attaining the above-described object as the underlying layer 10. Specifically, regarding transparent materials, a glass substrate, in particular, a quartz glass substrate is optimally used as the underlying layer 10. A quartz glass substrate is a material which is less susceptible to physical damage and contaminated chemically to a lesser extent, and it is an optimum material to be used to record digital data as minute physical structure. Of course, it is also possible to use an opaque material such as a silicon substrate as the underlying layer 10.

On the other hand, as the resist layer 20, there may be used a material suitable in giving patterning to the underlying layer 10. That is, there may be used a material having such properties that it undergoes a change in composition on exposure to electron beams or laser beams and it also functions as a protective film in an etching step given to the underlying layer 10. Of course, there may be used a positive-type resist having such properties that an exposed part will dissolve at the time of development or a negative-type resist having such properties that a non-exposed part will dissolve at the time of development.

It is noted that the substrate to be exposed S may assume any shape or may be any arbitrary dimension. A quartz glass substrate which has been now generally used as a photomask is in most cases a rectangular substrate with a standard specification of 152×152×6.35 mm. Further, as a silicon substrate, in most cases, there is used a disk-shaped wafer having about 1 mm thickness according to specifications of 6, 8 or 12 inches in diameter. As the substrate S to be exposed, there may be used a standard substrate formed as the underlying layer 10 and the resist layer 20 on an upper face thereof.

Hereinafter, for the sake of convenience of description, there will be given an example in which a quartz glass substrate is used as the underlying layer 10 and a positive-type resist is used as the resist layer 20. Therefore, the substrate S to be exposed shown in FIG. 4(a) is a substrate in which a positive-type resist layer 20 is formed on a quartz glass substrate 10. Of course, the underlying layer 10 shall not be limited to a quartz glass substrate made of a single layer, but it may be made of a substrate with multiple-layers in which, for example, a chromium layer is formed on a quartz glass substrate as an embodiment described later.

The beam exposure device 200 shown in FIG. 1 performs beam exposure on a surface of the resist layer 20 in the substrate S to be exposed having the underlying layer 10 and the resist layer 20 which is covered thereon. FIG. 4(b) shows an exposure process by the beam exposure device 200. As described in Section 1, exposure by the beam exposure device 200 is given only to the interior of a bit figure F and the interior of each of the alignment marks Q. Therefore, the resist layer 20 is subjected to the exposure process and thereby separated into an exposed part 21 and a non-exposed part 22. Here, the non-exposed part 22 keeps a chemical composition as it is, whereas the exposed part 21 is changed in chemical composition.

The patterning device 300 is a device which gives patterning to the substrate S after completion of the exposure process. As shown in FIG. 1, the device is provided with a development processing portion 310 and an etching processing portion 320.

The development processing portion 310 performs development processing by which the substrate S after exposure is immersed into a developing fluid having properties that will dissolve the exposed part 21 (where a positive-type resist is used) or the non-exposed part 22 (where a negative-type resist is used) of the resist layer, and a part thereof is performed as a remaining portion. FIG. 4(c) shows a state in which the above-described development processing has been given to the substrate S shown in FIG. 4(b). Since the positive-type resist is used in the example shown here, the exposed part 21 will dissolve in the developing fluid and the non-exposed part will remain as a remaining portion 23 by the development processing.

On the other hand, the etching processing portion 320 performs etching to the substrate S after development. In the example of FIG. 4(c), the remaining portion 23 is used as a mask to give etching to the underlying layer 10. Specifically, the substrate S shown in FIG. 4(c) may be immersed into an etching fluid, the corrosiveness of which is greater against the underlying layer 10 than that against the remaining portion 23 of the resist layer (of course, there may be adopted a method such as dry etching in which a substrate is not immersed into an etching fluid).

FIG. 4(d) shows a state that etching has been performed by the etching processing portion 320. Of an upper face of the underlying layer 10, a part which is covered with the remaining portion 23 acting as a mask is not influenced by corrosion but a part which is exposed is influenced by corrosion to form a recess. In this way, the underlying layer 10 is processed into an underlying layer 11 having a recess and protrusion structure on the upper face. The etching processing portion 320 has processing functions to thereafter peel and remove the remaining portion 23 of the resist layer and wash and dry the underlying layer 11.

By way of the above-described processes, there is finally obtained the underlying layer 11 after being processed as shown in FIG. 4(e). The thus obtained underlying layer 11 is nothing but the information recording medium M onto which digital data has been written by the information storage device according to the former invention. As shown in the drawing, a physical recess and protrusion structure is formed on the upper face of the information recording medium M, and a bit "1" and a bit "0" are expressed respectively by a recess C and a protrusion V. Therefore, a bit "1" and a bit "0" can be read out by detecting whether the surface of the medium is constituted with a recess C or a protrusion V at a position indicated with a thick single dotted and dashed line in the drawing (a position corresponding to a grid point L shown in FIG. 3).

Of course, in reverse to the example shown in the drawing, it is possible to adopt a recording method in which the recess C is given as a bit "0" and the protrusion V is given as a bit "1." Whether one of them is given as a bit "0" and the other is given as a bit "1" is to be determined depending on the process described above. For example, in the case of the example described in Section 1, in the unit bit graphic pattern creating portion 140, bit figures F are arranged at positions of the grid points L corresponding to bits "1" of a unit bit matrix. On the contrary, bit figures F are arranged at positions of the grid points L corresponding to bits "0," by which bit information on the recess and the protrusion is reversed. Where a negative-type resist is used in place of a positive-type resist as the resist layer 20, a relationship between the recess and the protrusion is also reversed.

The thus prepared information recording medium M is characterized in that it is able to perform highly integrated recording of information with long-term durability and it is also able to read out the information in a universal method.

That is, where materials such as a quartz glass substrate and a silicon substrate are used as the underlying layer 10, they are less susceptible to deterioration with the lapse of time or damage resulting from water and thermal influences than conventional information recording media such as paper, film and record disks, thereby providing durability in a semi-permanent time scale of several hundred years as with stone plates in ancient times. Of course, as compared with magnetic recording media, optical recording media and semiconductor recording media which are generally used as data recording media for computers, the information recording medium M is able to provide durability over a much longer period of time. Therefore, the former invention can be optimally used in storing information, for example, official documents in which the information is desired to be recorded semi-permanently.

Further, as described in Section 1, the beam exposure device 200 is able to perform subtle exposure by use of electron beams or laser light, thus making it possible to perform extremely highly-integrated recording of information. For example, a high-definition electron beam lithography system can be used to write bit figures F at a pitch of about 100 nm, by which it is possible to store information with a capacity of about 100 GB to 1 TB in the above-described photomask or silicon substrate with a standard size.

Further, the information recording medium according to the former invention is characterized in that since binary information of bits is directly recorded as a physical structure such as a recess and a protrusion, the information can be read out in a universal method. That is, in Patent Documents 1 and 2 described previously, there has been disclosed such technology that the cylindrical quartz glass is used as a medium to record information therein in a three-dimensional manner. In order to read out the information recorded inside the medium in a three-dimensional manner, a dedicated readout device using computer tomography or others is needed and special computation processing such as Fourier transform processing is also needed. Therefore, even if the cylindrical recording medium remains intact, for example, after several hundred years, it will be impossible to read out information without transfer of technology on a dedicated readout device.

In contrast, in the information recording medium prepared by the information storage device according to the former invention, binary information of bits is directly recorded as a physical structure. And, if a recording surface can be magnified by a certain method and recognized as an image, it is possible to read out at least the information of bits in itself. In other words, the information recording medium according to the former invention is in itself a three-dimensional structure body but recording of the bit information is definitely performed in a two-dimensional manner. Therefore, even if the information recording medium according to the former invention is found after several hundred years or several thousand years, it will be possible to read out the bit information by a universal method.

A description has been so far given of the example in which the information storage device according to the former invention is used to form a physically structured pattern having a recess and protrusion structure composed of a recess indicating one of bit "1" and bit "0" and a protrusion indicating the other of them on a surface of a quartz glass substrate or that of a silicon substrate. However, in executing the former invention, the physical structure indicating bit information is not necessarily limited to a recess and protrusion structure. Thus, a description will be given of some variations of a method in which the physical structure is formed on a medium by referring to the side cross-sectional views of FIG. 5 (only a cross section is shown and a structure at the back is not illustrated).

FIG. 5(a) is a side cross-sectional view which shows an example in which the patterning device 300 is used to form a physically structured pattern having a network structure composed of a through hole H which indicates one of bit "1" and bit "0" and a non-hole part N which indicates the other of them. In a network structure body 12 shown in the drawing, a position indicated by a thick single dotted and dashed line corresponds to a grid point L shown in FIG. 3, and a bit "1" and a bit "0" are expressed as shown in the drawing, depending on whether the position concerned is a through hole H or a non-hole part N (a part at which no through hole is formed).

As described above, in the case of the information recording medium shown in FIG. 5(a), a bit is expressed by the presence or absence of the through hole in place of the recess and protrusion structure and, therefore, the medium in itself constitutes a network structure body. However, a fundamental principle of recording bit information at the position of a grid point L is exactly the same as that of the basic example shown in FIG. 4(e). Of course, the through hole H may be used to express a bit "0" and the non-hole part N may be used to express a bit "1." Where the network structure body 12 shown in FIG. 5(a) is used as the information recording medium M, etching may be performed in an etching step by the etching processing portion 320 (FIG. 4(*d*)) until penetrating to a lower face of the underlying layer 10, thereby forming the through hole H.

Figure 5:
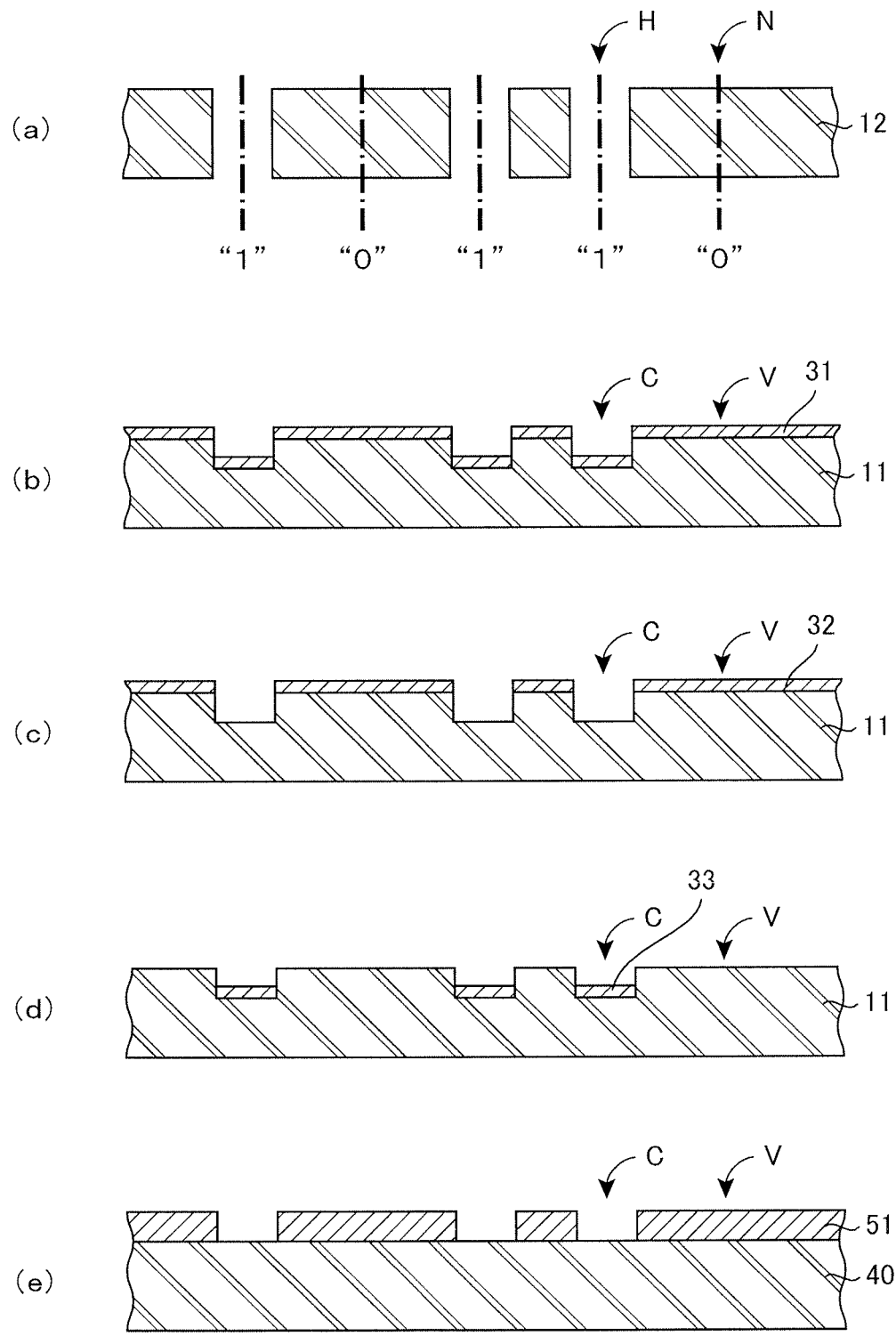
FIG. 5 is s set of side cross-sectional views which show a variation of an information recording medium in which information has been written by the present invention (only a cross section is shown and a structure at the back is not illustrated).

On the other hand, FIG. 5(*b*) to FIG. 5(*d*) are side cross-sectional views, each of which shows a modified example in which an added layer is formed on a surface of a recess C or a protrusion V or both surfaces of them in the information recording medium M shown in FIG. 4(*e*). In the modified example shown in FIG. 5(*b*), an added layer 31 is formed on both surfaces of the recess C and the protrusion V. In the case of the modified example shown in FIG. 5(*c*), an added layer 32 is formed only on the surface of the protrusion V. In the case of the modified example shown in FIG. 5(*d*), an added layer 33 is formed on the surface of the recess C.

As the added layers 31, 32, 33, the following materials may be used; light-reflective materials (for example, metals such as aluminum, nickel, titanium, silver, chromium, silicon, molybdenum and platinum as well as alloys, oxides and nitrides thereof) or light-absorbing materials (for example, materials composed of a compound such as an oxide and a nitride of metal, in the case of chromium, chromium oxide and chromium nitride). Formation of an added layer made of a light-reflective material makes it possible to distinguish a recess C from a protrusion V based on a difference in behavior of reflected light on readout. And, formation of an added layer made of a light-absorbing material makes it possible to distinguish a recess C from a protrusion V based on a difference in light absorption mode on readout. Therefore, these added layers are formed to obtain an effect that information can be read out more easily.

Further, a similar effect can be obtained by doping impurities on a surface of a recess C or that of a protrusion V in place of forming another layer having a clear border face like the added layer. For example, an information recording medium having a recess and protrusion structure is constituted with quartz, and on the surface of the medium, boron, phosphorus, rubidium, selenium and copper are doped to make the impurity concentrations different on the surface thereof. Thereby, as with a case where the added layer is provided, the surface can be given light reflectivity or light absorbency to obtain an effect of reading out information more easily. Specifically, in the case of the above-described impurities, there is obtained an effect of absorbing ultraviolet rays at concentrations of about 100 ppm or more, and there is obtained an effect of increasing reflectance at concentration of about 1000 ppm or more.

In particular, as shown in the example of FIG. 5(*c*), where the added layer 32 made of a light-reflective material or a light-absorbing material is formed only at a protrusion V, it is possible to easily distinguish a bit "1" from a bit "0" due to a clear difference between reflected light or scattered light obtained from a recess C and reflected light or scattered light obtained from a protrusion V at the time of readout. Similarly, as shown in the example of FIG. 5(*d*), where the added layer 33 made of a light-reflective material or a light-absorbing material is formed only at a recess C, it is also possible to easily distinguish the bits from each other due to a clear difference between reflected light or scattered light obtained from a recess C and reflected light or scattered light obtained from a protrusion V at the time of readout.

As shown in the example of FIG. 5(*b*), in order to form the added layer 31 on both surfaces of a recess C and a protrusion V, there may be performed processing by which etching is performed to obtain the information recording medium M shown in FIG. 4(*e*) and, thereafter, the added layer 31 is deposited all over on an upper face of the recording medium. Further, as shown in the example of FIG. 5(*c*), in order to obtain a structure in which the added layer 32 is formed only on a surface of a protrusion V, in place of the substrate S to be exposed shown in FIG. 4(*a*), there may be used a substrate in which the added layer is held between the underlying layer 10 and the resist layer 20. Then, as shown in the example of FIG. 5(*d*), in order to obtain a structure in which the added layer 33 is formed only on a surface of a recess C, at the time of completion of the etching process shown in FIG. 4(*d*), processing is performed for depositing the added layer all over on an upper face thereof in a state that the remaining portion 23 of the resist layer remains as it is and, thereafter, the remaining portion 23 may be peeled and removed.

On the other hand, the modified example shown in FIG. 5(*e*) is such that an underlying layer 51 in itself which has been formed on an upper face of a supporting layer 40 is constituted with a light-reflective material or a light-absorbing material. For example, the supporting layer 40 is constituted with a quartz glass substrate, an added layer made of aluminum is formed on an upper face thereof, a resist layer is also formed on the upper face thereof, and processes similar to those shown in FIG. 4 are performed, thus making it possible to obtain the structure body shown in FIG. 5(*e*). In this case, etching process may be performed by using a corrosion liquid having corrosiveness against aluminum. In the structure body, the surface of a recess C is formed with quartz glass and that of a protrusion V is formed with aluminum, thereby also obtaining an effect that the bits can be easily distinguished from each other at the time of readout.

Where the modified example shown in FIG. 5(*a*) is actually adopted, it is preferable that the network structure body 12 is constituted with an opaque material. Accordingly, a part of the through hole H is given as a part which will transmit light, and a part of the non-hole part N is given as a part which will not transmit light. Therefore, a clear difference can be recognized at the time of readout which will be described later and also the bits can also be easily distinguished.

On the other hand, where the modified examples shown in FIG. 5(*c*) to FIG. 5(*e*) are adopted, it is preferable that the underlying layer 11 or the supporting layer 40 is constituted with a transparent material and the added layers 32, 33, 51 are constituted with an opaque material. Thereby, a part on which no added layer has been formed is given as a part which will transmit light, and a part on which the added layer has been formed is given as a part which will not transmit light. Thus, at the time of readout which will be described later, it is possible to recognize a clear difference in light transmittance and easily distinguish the bits.

<<<Section 3. Basic Embodiment of Information Readout Device According to the Former Invention>>>

In Section 1 and Section 2, a description has been given of the constitution and motions of the information storage device for storing information in the information recording medium. Here, a description will be given of a constitution and motions of the information readout device for reading out the thus recorded information.

Figure 6:
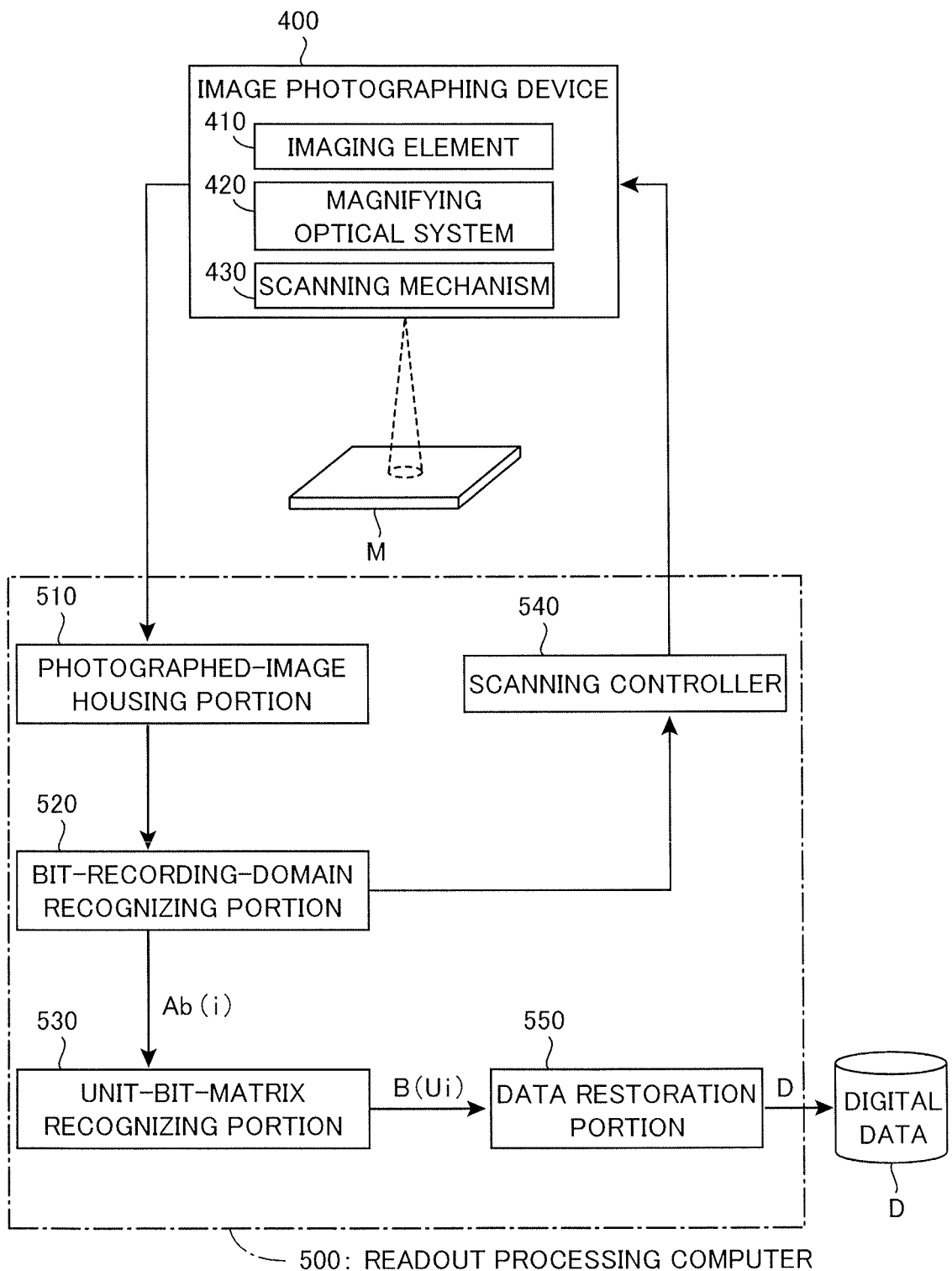
FIG. 6 is a block diagram which shows a constitution of an information readout device for reading out information from the information recording medium prepared by the method according to the present invention.

FIG. 6 is a block diagram which shows a constitution of the basic embodiment of the information readout device according to the former invention. The information readout device according to the embodiment is a device which performs functions to read out digital data stored in the information recording medium M by using the information storage device shown in FIG. 1. As shown in the drawing, the device is constituted with an image photographing device 400 and a readout processing computer 500.

Here, the image photographing device 400 is a constituent which magnifies and photographs a domain to be photographed which is a part of a recording surface of the information recording medium M and captures the thus photographed image as image data. As shown in the drawing, it is provided with an imaging element 410, a magnifying optical system 420 and a scanning mechanism 430.

The imaging element 410 can be constituted, for example, with a CCD camera and has functions to capture, as digital image data, images inside a predetermined domain to be photographed. The magnifying optical system 420 is constituted with optical elements such as lenses and plays a role in magnifying a predetermined domain to be photographed which constitutes a part of the recording surface of the information recording medium M and forming the magnified image on an image surface of the imaging element 410. Then, the scanning mechanism 430 plays a role in giving scanning processing (change in position and angle) to the imaging element 410 and the magnifying optical system 420 so that the domain to be photographed moves sequentially on the recording surface of the information recording medium M.

In FIG. 5, there are shown variations of the information recording medium M. The information recording medium M composed of the network structure body 12 shown in FIG. 5(*a*) is able to read out information on either an upper face or a lower face thereof, regardless of whether a material is transparent or opaque, and both the upper face and the lower face are to constitute a recording surface. In contrast, as shown in FIG. 4(*e*) and FIG. 5(*b*) to FIG. 5(*e*), in the case of the information recording medium M having a recess and protrusion structure formed on an upper face, the upper face is a recording surface. Therefore, where the underlying layer 11 and the supporting layer 40 are constituted with a transparent material, information can be read out by being photographed either from above or below. Where the layers are constituted with an opaque material, the information is always required to be photographed from above.

As shown in the drawing, the readout processing computer 500 is provided with a photographed-image housing portion 510, a bit-recording-domain recognizing portion 520, a unit-bit-matrix recognizing portion 530, a scanning controller 540 and a data restoration portion 550. Hereinafter, a description will be sequentially given of functions of these portions. However, the portions are constituents which are in reality provided by installing a dedicated program into a computer. The readout processing computer 500 can be constituted by installing a dedicated program into a general-purpose computer.

First, the photographed-image housing portion 510 is a constituent which houses photographed images photographed by the image photographing device 400. That is, it has functions to house, as digital image data, images photographed by the imaging element 410 inside a predetermined domain to be photographed. As described above, the image photographing device 400 is provided with the scanning mechanism 430, and the domain to be photographed moves sequentially on the recording surface of the information recording medium M to obtain a newly photographed image at every movement by the imaging element 410. The photographed-image housing portion 510 thus performs functions to house individual image data sequentially given from the imaging element 410.

On the other hand, the bit-recording-domain recognizing portion 520 performs processing by which individual bit recording domains Ab are recognized from photographed images housed in the photographed-image housing portion 510. In the former invention, as described by referring to FIG. 2, digital data D to be stored is divided into a plurality of unit data U1, U2, U3 and others, each of which is recorded as a unit bit graphic pattern P(U1), P(U2), P(U3) and others inside the individual bit recording domains Ab. Therefore, at the time of readout processing as well, first, after recognition of the individual bit recording domains Ab, each bit which constitutes the unit data Ui is to be read out on the basis of individual unit bit graphic patterns P(Ui) recorded therein.

As described in Section 2, alignment marks Q and bit figures F are recorded on the recording surface of the information recording medium M, as physically structured patterns which have a recess and protrusion structure or a structure in which through holes are present or absent. Resultantly, the alignment marks Q and bit figures F or their contours are expressed in terms of distribution of brightness and darkness on a photographed image. An existing pattern-recognizing technology can be used to recognize the alignment marks Q and bit figures F on the photographed image.

First, recognition of individual bit recording domains Ab is performed by detecting an alignment mark Q. Since a figure different from the bit figure F is used in the alignment mark Q, the bit-recording-domain recognizing portion 520 is able to detect the alignment mark Q by searching the interior of a photographed image housed in the photographed-image housing portion 510. For example, in the example shown at the lower part of FIG. 2, the bit figure F is a square, whereas the alignment mark Q is a cross-shape. Therefore, the existing pattern recognizing technology can be used to recognize the alignment mark Q on a photographed image and locate the position.

The alignment mark Q is arranged at a specific position in relation to the bit recording domain Ab. Therefore, if the alignment mark Q can be recognized on a photographed image, it is possible to identify the position of the bit recording domain Ab. For example, where the unit recording graphic pattern R(U1) shown in FIG. 3 is included inside the photographed image, four sets of alignment marks Q1 to Q4 can be recognized, by which it is possible to recognize a square-shaped bit recording domain Ab having four sets of the alignment marks Q1 to Q4 in the vicinities of four corners.

If the image photographing device 400 has functions to photograph a domain to be photographed with a size which can include at least one unit recording domain Au, search is conducted inside the photographed image, thus making it possible to recognize four sets of the alignment marks Q1 to Q4 shown in FIG. 3 and also recognize the bit recording domain Ab.

Of course, if the domain to be photographed is set at a position across mutually-adjacent unit recording domains Au, four sets of the alignment marks Q1 to Q4, each of which indicates the position of the same bit recording domain Ab, would not be correctly recognized. In this case, the bit-recording-domain recognizing portion 520 is able to understand a positional deviation of the domain to be photographed on the basis of a mutual relationship of the recognized alignment marks and performs processing by which the positional deviation is reported to the scanning controller 540.

When the positional deviation is reported, the scanning controller 540 controls the image photographing device 400 so as to adjust the positional deviation concerned. Specifically, the controller gives instructions to the scanning mechanism 430 so that the domain to be photographed is allowed to move only by a predetermined correction amount in a predetermined correction direction. The above-described correction makes it possible to obtain a correct photographed image where the alignment marks Q1 to Q4 are arranged at four corners appropriately as shown in FIG. 3 and also to give correct readout processing to a bit recording domain Ab. As described above, a primary role of the scanning controller 540 is to perform adjustment processing for correcting the positional deviation where the domain to be photographed undergoes positional deviation in relation to the unit recording domain Au.

A second role of the scanning controller 540 is to perform scanning processing for setting a next unit recording domain Au as a new domain to be photographed after completion of photography in which one unit recording domain Au is given as a domain to be photographed. For example, in the example shown at the lower part of FIG. 2, after completion of photography of a unit recording domain Au(U1) at which a unit recording graphic pattern R(U1) has been recorded, it is then necessary to take a photograph of a unit recording domain Au(U2) at which a unit recording graphic pattern R(U2) has been recorded. Thereafter, it is further necessary that a domain to be photographed is allowed to move sequentially from a unit recording domain Au(U3) at which a unit recording graphic pattern R(U3) has been recorded to a unit recording domain Au(U4) at which a unit recording graphic pattern R(U4) has been recorded.

Consequently, the scanning controller 540 is to be a constituent which controls the change of a domain to be photographed by the image photographing device 400 so that a photographed image can be obtained in all the bit recording domains to be read out. The control can be attained by feedback control on the basis of detection results of the alignment marks Q by the bit-recording-domain recognizing portion 520. A slight adjustment can also be made as described above even where the positional deviation takes place.

Then, when the bit-recording-domain recognizing portion 520 recognizes an i-th bit recording domain Ab(i) from a photographed image, information of the i-th bit recording domain Ab(i) is given to the unit-bit-matrix recognizing portion 530. The unit-bit-matrix recognizing portion 530 performs processing by which a unit bit matrix is recognized on the basis of a pattern inside the bit recording domain Ab(i). For example, in the example shown in FIG. 3, it is possible to recognize a unit bit matrix B(U1) composed of five rows and five columns as shown at the middle part of FIG. 2 on the basis of the unit bit graphic pattern P(U1) recorded inside a bit recording domain Ab.

In the example shown in FIG. 3, as described in Section 1, horizontal grid lines X1 to X7 arranged at equal intervals and longitudinal grid lines Y1 to Y7 arranged at equal intervals are defined, and a grid point L is defined as each of the intersection points thereof. The individual bit figures F and alignment marks Q1 to Q4 are all arranged so that the centers thereof are positioned at any of the grid points L. Therefore, the unit-bit-matrix recognizing portion 530 is able to perform processing for recognizing the unit bit matrix B(U1) by the following procedures.

First, the horizontal grid lines X1 and X7, and the longitudinal grid lines Y1 and Y7 are recognized on the basis of the center point positions of four sets of the alignment marks Q1 to Q4 recognized by the bit-recording-domain recognizing portion 520. Next, the horizontal grid lines X2 to X6 are defined so as to divide equally a space between the horizontal grid lines X1 and X7, and the longitudinal grid lines Y2 to Y6 are defined so as to divide equally a space between the longitudinal grid lines Y1 and Y7. Then, there may be performed processing by which positions of 25 grid points at which the horizontal grid lines X2 to X6 intersect with the longitudinal grid lines Y2 to Y6 are determined to judge whether a bit figure F is present at each position of these grid points or not. As described above, the bit figure F can be recognized on the basis of distribution of brightness and darkness on a photographed image. Therefore, a bit "1" is allowed to correspond to a position of a grid point at which the bit figure F is present and a bit "0" is allowed to correspond to a position of a grid point at which it is not present, thus making it possible to obtain the unit bit matrix B(U1) composed of five rows and five columns shown at the middle part of FIG. 2.

The unit-bit-matrix recognizing portion 530 thus performs processing by which an i-th unit bit matrix B(Ui) is recognized on the basis of an i-th unit bit graphic pattern P(Ui) recorded inside an i-th bit recording domain Ab(i) and gives the result thereof to the data restoration portion 550. The unit-bit-matrix recognizing portion 530 will repeatedly execute processing for recognizing a unit bit matrix by the same method with regard to all the bit recording domains recognized by the bit-recording-domain recognizing portion 520.

The data restoration portion 550 performs processing by which unit data Ui is created from individual unit bit matrixes B(Ui) recognized in this way by the unit-bit-matrix recognizing portion 530 to synthesize individual unit data Ui, thereby restoring the digital data D stored. For example, in the example shown in FIG. 2, four sets of unit data U1 to U4 are created from four sets of unit bit matrixes B(U1) to B(U4) to couple them together, by which original digital data D is restored.

A description has been so far given of the basic embodiment of the information readout device according to the former invention by referring to the block diagram of FIG. 6. The information readout device described above is not, however, necessarily used to read out information from the information recording medium M prepared by the information storage device according to the former invention. It is also possible to read out the information by using, for example, an optical measurement device, a scanning electron microscope or an atomic force microscope.

The information recording medium M prepared by the information storage device according to the former invention is, as described previously, provided with universality that binary information of bits is directly recorded as a physical structure. Then, if a recording surface can be magnified by some method to obtain an image showing the presence or absence of a bit figure F, bit information can be read out. Therefore, even if the information recording medium M is found after several hundred years or several thousand years and if some means for recognizing the physical structure is available at the age concerned, the bit information can be read out. Of course, where the medium is found in a state of being buried underground, a recording surface may be contaminated by attached foreign matter. However, the foreign matter can be easily removed by washing and the information can be read out without any difficulty.

Adoption of any readout method makes it possible to read out information in a non-contact state on an information recording surface (where an atomic force microscope is used, information can be read out in a non-contact state by use of a non-contact mode). At the time of readout processing, there is no chance that the recording surface may be physically damaged and even on repetition of readout processing, there is no fear that the information recording surface may wear away.

Further, the information readout device shown in FIG. 6 is combined with the information storage device shown in FIG. 1, by which information can be read out from a part of a recorded domain in the information recording medium M and also new information can be stored at a non-recorded domain adjacent to the recorded domain. It is, therefore, possible to provide a write-once type information storage device in which recording of new information is performed sequentially in one piece of information recording medium. Of course, in a device combining an information storage device with an information readout device, the information storage device can be used to perform storage processing in which information is written on a medium and, thereafter, the information readout device can be used to verify the stored information. Correction can also be made, whenever necessary.

<<<Section 4. Variations of Alignment Marks>>>

In Section 3, a description has been given of the basic embodiment of the information readout device. Thus, here, with consideration given to convenience at the time of reading out the information, a description will be given of variations of alignment marks recorded at the time of information storage. The bit figure F plays a role in indicating original information to be stored, whereas the alignment marks Q are to be meta information which is used for alignment at the time of reading out information.

In the embodiment described above, the unit recording graphic pattern creating portion 150 performs processing by which the cross-shaped alignment marks Q1 to Q4 are added respectively to four corners outside a rectangular bit recording domain Ab, for example, as shown in FIG. 3, thereby creating unit recording graphic patterns. These alignment marks Q1 to Q4 are used to make an alignment so that the bit-recording-domain recognizing portion 520 of the information readout device shown in FIG. 6 can recognize a bit recording domain Ab.

However, a shape, an arrangement position and a number of the alignment marks Q shall not be limited to those of the above-described embodiment. That is, each of the alignment marks Q may assume any shape as long as it can be distinguished from the bit figure F. Further, they are not necessarily required to be arranged at four corners outside a bit recording domain Ab and, for example, they may be arranged at a central position between four sides of the bit recording domain Ab. Still further, the number of the alignment marks Q is not necessarily limited to four sets.

Figure 7:
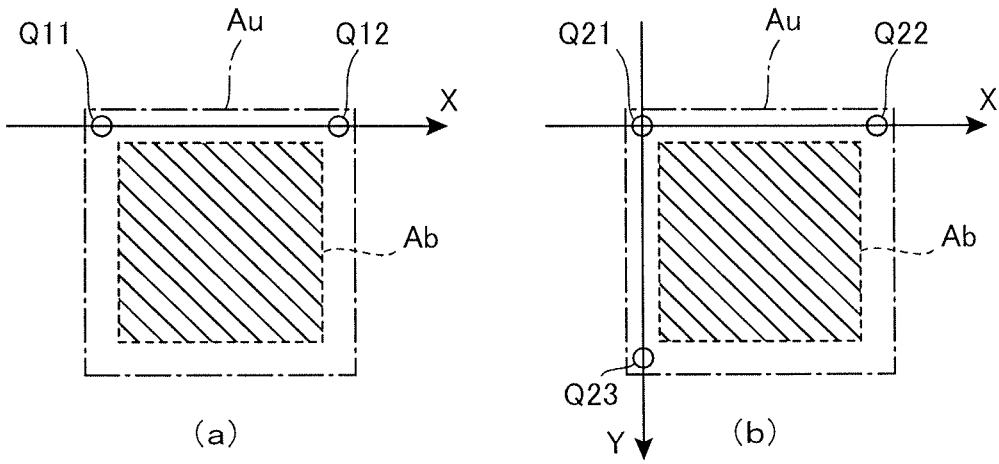
FIG. 7 is s set of plan views which show a variation of alignment marks which are used at the time of recording information by the present invention.

FIG. 7 includes plan views, each of which shows a variation of alignment marks Q used in the former invention. In each of the drawings, a square enclosed with a broken line indicates a bit recording domain Ab (for the sake of convenience, slanting lines are given inside in place of depicting a bit figure), and a square enclosed with a single dotted and dashed line indicates a unit recording domain Au, and circular marks arranged between them are the alignment marks Q.

FIG. 7(a) shows an example in which alignment marks Q11 and Q12 are arranged at an upper left corner and an upper right corner in the vicinity of the rectangular bit recording domain Ab. A direction which connects the center points of two sets of the alignment marks Q11, Q12 is defined as a horizontal coordinate axis X, thus making it possible to indicate one coordinate axis direction with regard to an arrangement of the bit recording domain Ab. At the time of readout, the horizontal coordinate axis X can be recognized on the basis of two sets of the alignment marks Q11, Q12. Further, a longitudinal coordinate axis Y can be defined as an axis orthogonal to the horizontal coordinate axis. Therefore, if the bit recording domain Ab assumes a correct rectangle, no problem will be found in readout processing of individual bits. From this point of view, where two sets of alignment marks are added with regard to one bit recording domain Ab, no problem will occur in practice in performing readout processing.

Of course, alignment marks may be individually arranged at an upper left corner and a lower left corner in the vicinity of the bit recording domain Ab to define a longitudinal coordinate axis Y. That is, the unit recording graphic pattern creating portion 150 may create a unit recording graphic pattern by adding a total of two sets of alignment marks to two corners not at a diagonal position, of four corners arranged outside in the vicinity of a rectangular bit recording domain Ab.

On the other hand, FIG. 7(b) shows an example in which a total of three sets of alignment marks Q21, Q22, Q23 are added so as to be arranged at three corners, of four corners outside in the vicinity of a rectangular bit recording domain Ab, thereby creating a unit recording graphic pattern. Thus, as shown in the drawing, both the horizontal coordinate axis X and the longitudinal coordinate axis Y can be defined by three sets of the alignment marks Q21, Q22, Q23 to further enhance the accuracy of readout processing of individual bits.

Figure 8:
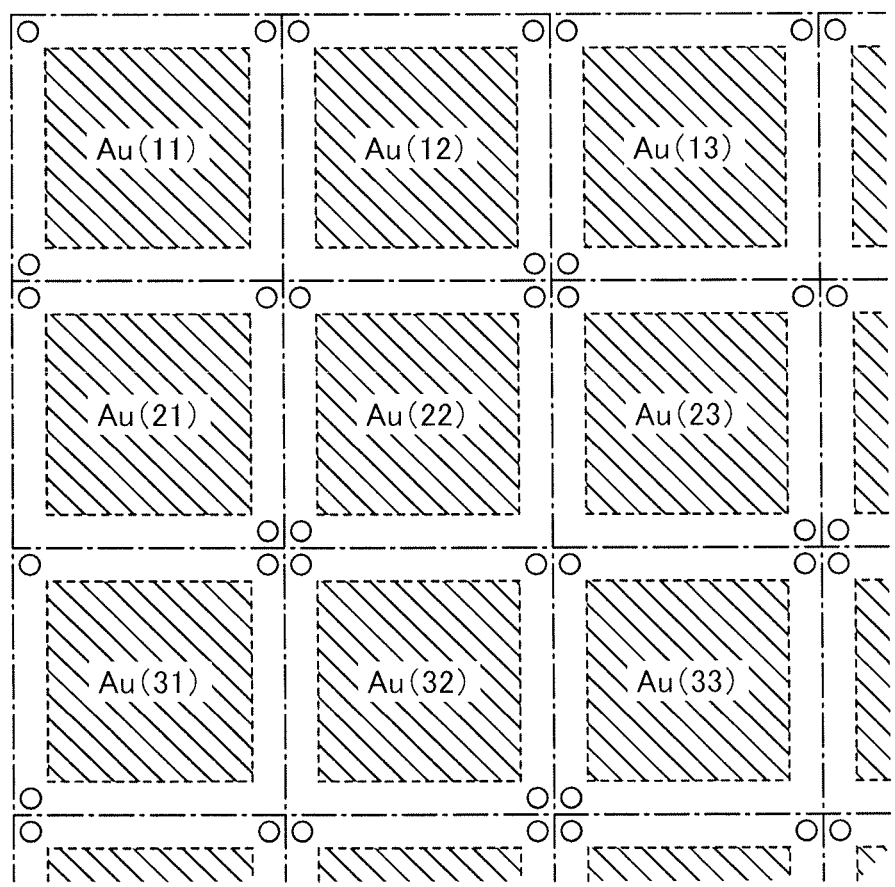
FIG. 8 is a plan view which shows a variation of an arrangement mode of the alignment marks shown in FIG. 7.

As described above, where three sets of alignment marks are used, as shown in the example of FIG. 8, it is preferable that mutually-adjacent unit recording graphic patterns are made different in arrangement mode of three sets of alignment marks. FIG. 8 shows a state in which a plurality of unit recording domains Au are arranged in a two-dimensional matrix form. Here, as for unit recording domains Au(11), Au(13), Au(22), Au(31) and Au(33), three sets of alignment marks are arranged in the arrangement mode shown in FIG. 7(b) (that is, an arrangement mode in which no mark is given only to a lower right corner). As to unit recording domains Au(12), Au(21), Au(23) and Au(32), three sets of alignment marks are arranged in an arrangement mode which is laterally reversed to the arrangement mode given in FIG. 7(b) (that is, an arrangement mode in which no mark is given only to a lower left corner).

That is, where a row number i (i=1, 2, 3, . . . ) and a column number j (j=1, 2, 3, . . . ) are defined for an arrangement of the unit recording domains Au to express individual unit recording domains as A (ij), as shown in the drawing, in a first group in which (i+j) is an even number, there is adopted an arrangement mode in which no alignment mark is given only to a lower right corner as shown in FIG. 7(b). And, in a second group in which (i+j) is an odd number, there is adopted an arrangement mode in which no alignment mark is given only to a lower left corner in such a manner that FIG. 7(b) is laterally reversed.

As described above, three sets of the alignment marks are defined in two types of arrangement modes and there is adopted a vertically- or laterally-adjacent unit recording graphic pattern in which the marks are arranged in a mutually different mode. Thereby, it is possible to prevent an error of omitting photography of an adjacent unit recording domain when the scanning controller 540 scans a domain to be photographed.

For example, in the example shown in FIG. 8, it is assumed that the scanning controller 540 has conducted such control that the unit recording domain Au(11) is at first photographed as a domain to be photographed, then, a domain to be photographed is allowed to move in a right direction in the drawing and the unit recording domain Au(12) adjacent to the right is given as the domain to be photographed. Normally, such control is performed that the unit recording domain Au is allowed to move only by a distance corresponding to a pitch thereof, by which a next domain to be photographed can be brought to a position of the unit recording domain Au(12). However, where a movement distance error is caused in a certain situation and a domain to be photographed has moved to a position of the unit recording domain Au(13), readout processing given to the unit recording domain Au(12) will be omitted.

If there is adopted the arrangement mode shown in FIG. 8, it is possible to detect an error even in the above situation. That is, on the assumption that after the unit recording domain. Au(11) has been photographed, photography of the unit recording domain Au(12) is omitted and the unit recording domain Au(13) is photographed, alignment marks will be made identical in arrangement mode. It is, therefore, possible to recognize that photography of the unit recording domain Au(12) has been omitted. Thus, there is performed processing by which a domain to be photographed is returned in the left direction in the drawing and amendment can be made so as to photograph the unit recording domain Au(12). Similar amendment can be made where a longitudinal omission takes place.

As a method for recognizing occurrence of the omission, there is a method for providing two types of arrangement modes. In addition, it is possible to adopt a method for changing the shape of an alignment mark. For example, FIG. 9(*a*) and FIG. 9(*b*) each show one example of a variation in which an alignment mark is changed in shape. In the example shown in FIG. 9(*a*), there are arranged a cross-shaped mark Q31, a triangular mark Q32 and a square mark Q33 at each position shown in the drawing. On the contrary, in the example shown in FIG. 9(*b*), there are arranged a circular mark Q41, a diamond shaped mark Q42 and an x-shaped mark Q43 at each position shown in the drawing. The above-described two modes of the alignment marks are provided alternately in a vertical direction and in a horizontal direction, by which it is possible to recognize occurrence of the omission, as with the example shown in FIG. 8.

Figure 9:
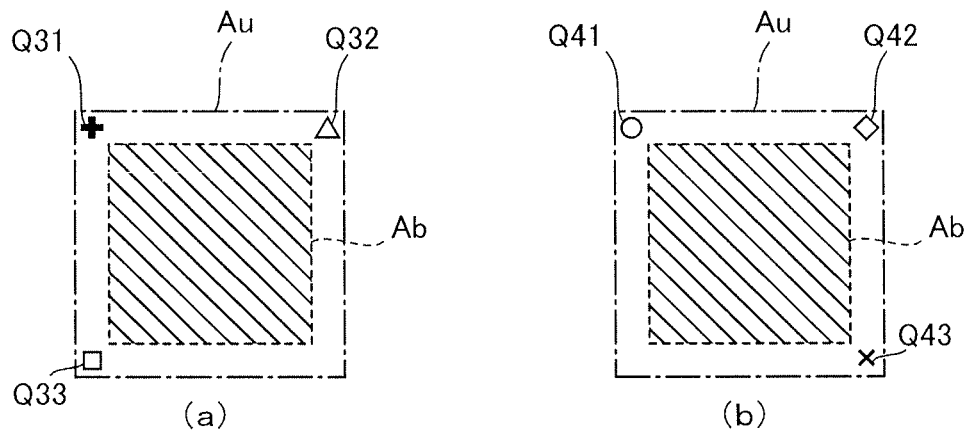
FIG. 9 is s set of plan views which show another variation of the alignment marks shown in FIG. 7.
Figure 10:
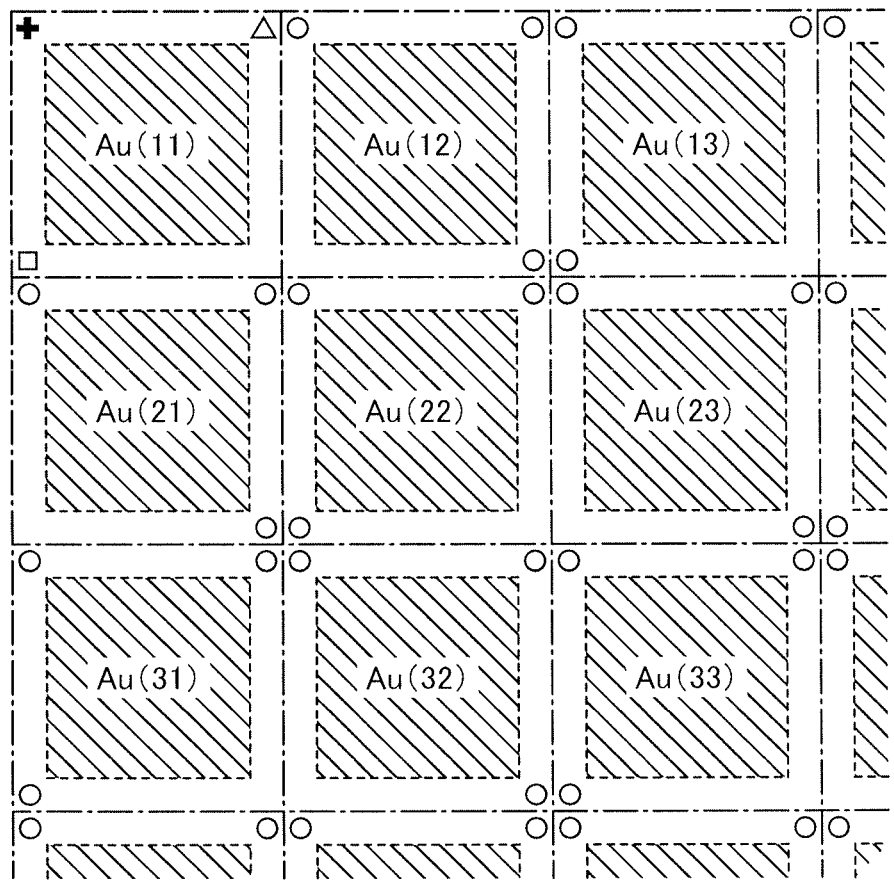
FIG. 10 is a plan view which shows a variation of an arrangement mode of the alignment marks shown in FIG. 9.

FIG. 10 is a plan view which shows still another variation in arrangement mode of the alignment marks in the former invention. In this variation, the alignment marks of the unit recording domain Au(11) in the example shown in FIG. 8 are changed to the alignment marks shown in FIG. 9(*a*). That is, of a plurality of unit recording domains Au arranged in a two-dimensional matrix form, only a unit recording domain Au(11) arranged at a first row and at a first column differs in shape of the alignment mark to be used. This is because of such consideration that the unit recording domain Au(11) arranged at the first row and at the first column is set as a reference unit recording domain to be read out at first, by which the reference unit recording domain can be easily distinguished at the time of readout processing.

Where the variation shown in FIG. 10 is adopted, the unit recording graphic pattern creating portion 150 may set a specific unit recording domain at the reference unit recording domain to create a unit recording graphic pattern which uses reference alignment marks different from those of other unit recording domains at the reference unit recording domain concerned. In the example shown in the drawing, the reference alignment marks shown in FIG. 9(*a*) are used in the reference unit recording domain Au(11), and ordinary alignment marks shown in FIG. 8 are used at other unit recording domains. Therefore, at the time of readout processing, first, processing is performed by which the reference alignment marks shown in FIG. 9(*a*) can be searched to identify the reference unit recording domain Au(11) which is to be read out at first.

That is, if the image photographing device 400 of the information readout device shown in FIG. 6 is provided with functions to photograph a domain to be photographed with a size capable of including at least one unit recording domain Au, it is possible to search the reference alignment marks shown in FIG. 9(*a*). Therefore, first, the scanning controller 540 may control the image photographing device 400 to adjust a domain to be photographed so that a photographed image of a domain including the reference unit recording domain Au(11) can be obtained on the basis of the reference alignment marks shown in FIG. 9(*a*). In this way, after completion of readout of correct bit information from the bit recording domain Ab(11) inside the reference unit recording domain Au(11), the scanning controller 540 may provide such control that a domain to be photographed is allowed to move sequentially depending on a pitch of arranged unit recording domains Au.

Of course, in this case as well, as described by referring to FIG. 8, even when such an error that omits photography of the unit recording domain Au(12) takes place in a certain situation, it is possible to recognize and correct the error. Further, upon occurrence of a minute positional deviation, the deviation can be adjusted accordingly.

Further, as a method for indicating the reference unit recording domain Au(11), there can be adopted a method in which bit figures F are not arranged at the bit recording domain Ab(11) inside the reference unit recording domain Au(11) but a unique identification mark is arranged, in place of adopting a method for using reference alignment marks different from those of other unit recording domains. The bit recording domain Ab is a domain which is originally used for recording data to be stored by arranging bit figures F. However, the unique identification mark is arranged only at the reference unit recording domain, thus making it possible to easily recognize the reference unit recording domain by confirming the unique identification mark.

For example, a large star mark is drawn in the domain Au(11) shown in FIG. 8, by which it can be easily recognized that the domain Au(11) is the reference unit recording domain. In this case, original information is not recorded inside the domain Au(11). However, first, such a positional adjustment is made that the reference unit recording domain Au(11) is given as a first domain to be photographed and, thereafter, scanning may be performed so that a domain to be photographed is allowed to move sequentially. If the reference unit recording domain Au is of such a size that can be macroscopically visible, the star mark can be confirmed visibly in the above example. Then, an operator is able to macroscopically perform manual alignment operation so that the reference unit recording domain Au (11) is made to a first domain to be photographed.

<<<Section 5. Information Storage Process and Information Readout Process According to the Former Invention>>>

In this section, a description will be given of basic processing procedures where the former invention is understood as an invention of process, that is, an information storage process and an information readout process.

Figure 11:
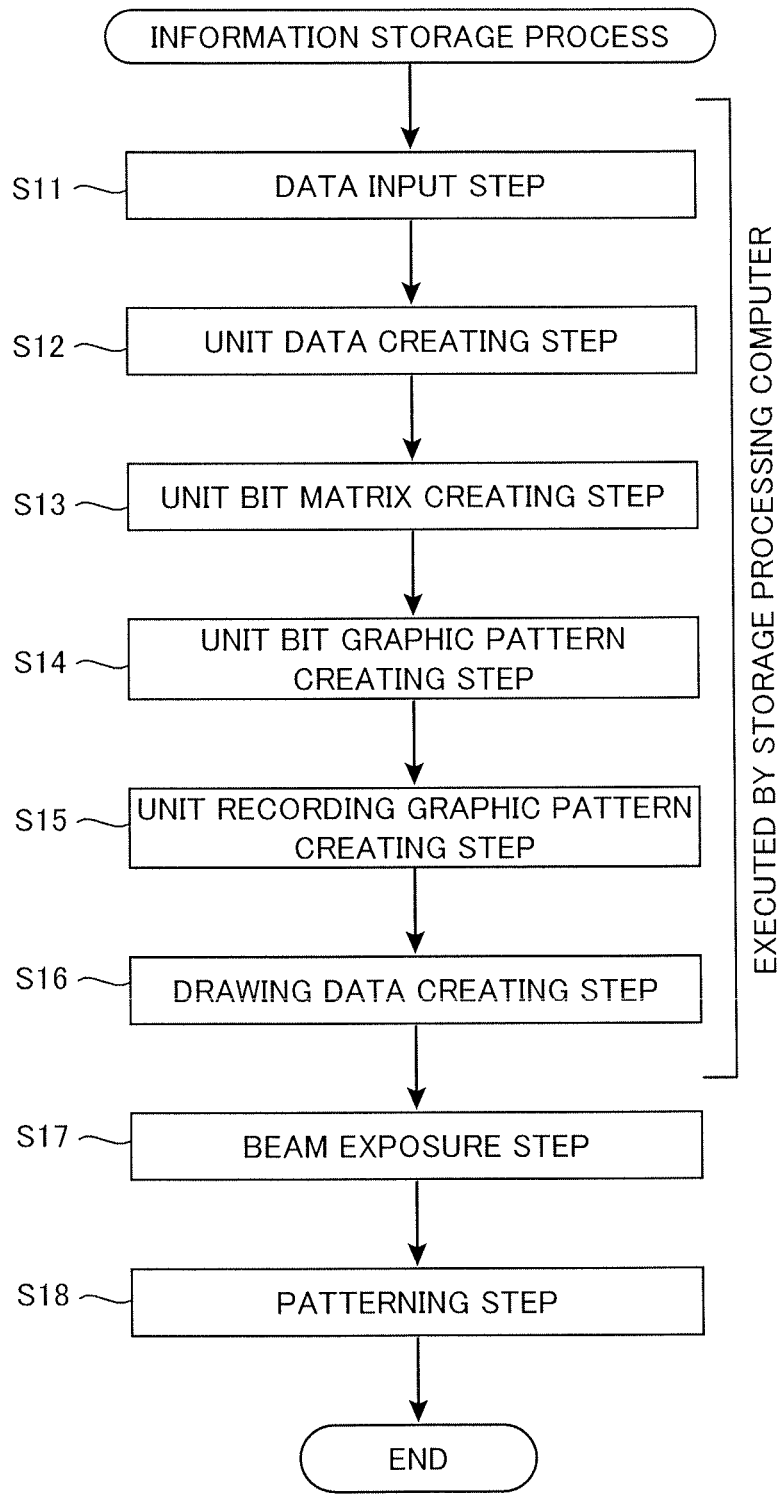
FIG. 11 is a flowchart which shows basic processing procedures of a master medium preparation step of the present invention.

FIG. 11 is a flowchart which shows basic processing procedures for information storage process according to the former invention. The procedures are those for executing an information storage process in which digital data is written onto an information recording medium and stored. Steps S11 to S16 are procedures executed by the storage processing computer 100 shown in FIG. 1, Step S17 is a procedure executed by the beam exposure device 200 shown in FIG. 1, and Step S18 is a procedure executed by the patterning device 300 shown in FIG. 1.

First, in Step S11, the storage processing computer 100 executes a data input step in which digital data D to be stored is input. In subsequent Step S12, the storage processing computer 100 executes a unit data creating step in which the digital data D is divided by a prescribed bit length unit to create a plurality of unit data Ui. Then, in Step S13, the storage processing computer 100 executes a unit bit matrix creating step in which data bits which constitute individual unit data Ui are arranged in a two-dimensional matrix form to create a unit bit matrix B(Ui). In Step S14, the storage processing computer 100 executes a unit bit graphic pattern creating step in which the unit bit matrix B(Ui) is converted to a geometrical pattern arranged inside a predetermined bit recording domain Ab to create a unit bit graphic pattern P(Ui).

Then, in Step S15, the storage processing computer 100 executes a unit recording graphic pattern creating step in which alignment marks Q are added to the unit bit graphic pattern P(Ui) to create a unit recording graphic pattern R(Ui). Then, in Step S16, the storage processing computer 100 executes a drawing data creating step which creates drawing data E for drawing the unit recording graphic pattern R(Ui).

Then, lastly, in Step S17, there is executed a beam exposure step in which drawing is made by beam exposure using electron beams or laser light on the substrate S which is an information recording medium on the basis of the drawing data E. In Step S18, there is executed a patterning step in which pattern processing is performed on the exposed substrate to create an information recording medium M in which a physically structured pattern is formed depending on the drawing data E.

Figure 12:
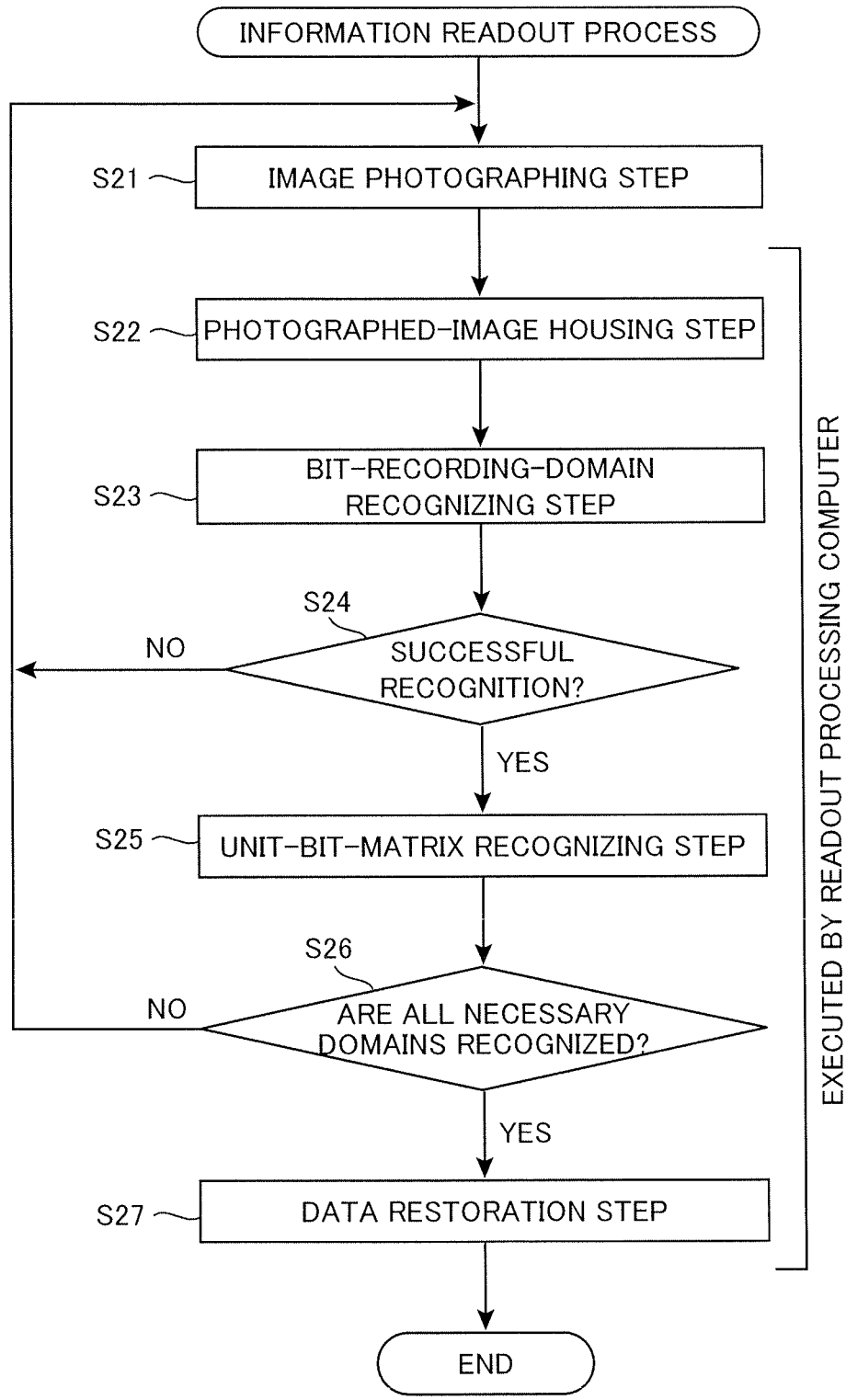
FIG. 12 is a flowchart which shows basic processing procedures which read out information from the information recording medium prepared by the method according to the present invention.

In contrast, FIG. 12 is a flowchart which shows basic processing procedures for the information readout process according to the former invention. The procedures are those for executing the information readout process for reading out digital data stored in the information recording medium M according to the procedures shown in FIG. 11. Step S21 is a procedure executed by the image photographing device 400 shown in FIG. 6, and Steps S22 to S27 are procedures executed by the readout processing computer 500 shown in FIG. 6.

First, in Step S21, there is executed an image photographing step in which the image photographing device 400 is used to magnify and photograph a domain to be photographed which is a part of a recording surface of the information recording medium M to capture the thus obtained photographed image as image data. Then, in Step S22, there is executed a photographed-image housing step in which the readout processing computer 500 houses the photographed-image. In Step S23, there is executed a bit-recording-domain recognizing step in which the readout processing computer 500 detects alignment marks from the photographed-image housed in the photographed-image housing step to recognize individual bit recording domains Ab.

Where a bit recording domain Ab has been successfully recognized in the bit-recording-domain recognizing step, procedures move to Step S25 by way of Step S24. Where there is a failure in recognizing a bit recording domain Ab, that is, where a positional deviation occurs at the time of taking a photograph and a complete bit recording domain Ab is not included in a photographed-image, the procedures return to Step S21 and the image photographing step is executed again. At this time, the image photographing device performs processing by which a domain to be photographed is changed so that a correct photographed image can be obtained.

In Step S25, there is executed a unit-bit-matrix recognizing step in which the readout processing computer 500 recognizes a unit-bit-matrix B(Ui) on the basis of a pattern inside the bit recording domain Ab. The processing is executed repeatedly by way of Step S26 until all necessary domains are completely recognized. That is, the change of domains to be photographed is controlled by the image photographing device so that photographed-images of all the bit-recording-domains Ab to be read out are obtained by the readout processing computer 500, thereby repeating a series of processing from Step S21 of the image photographing step.

Lastly, in Step S27, there is executed a data restoration step in which the readout processing computer 500 creates unit data Ui from individual unit-bit-matrixes B(Ui) recognized in the unit-bit-matrix recognizing step of Step S25 to synthesize individual unit data Ui, thereby restoring digital data D to be stored.

<<<Section 6. Method for Manufacturing Information Recording Medium According to the Present Invention>>>

In Section 1 to Section 5, a description has been so far given of the former invention (Japanese Patent Publication No. 2015-185184). According to the information storage process of the former invention, it is possible to perform highly integrated recording of digital data in an information recording medium with long-term durability. It is, however, impossible to completely avoid the loss of information, regardless of any extent of durability of the information recording medium concerned. Even a durable medium such as a quartz glass substrate may be broken or may be lost.

The present invention is characterized by utilizing an information recording medium prepared by the former invention as a master copy to prepare a reproduction thereof, thereby preparing a plurality of information recording media in which the same digital data has been recorded. Of course, the present invention is similar to the former invention in that an information recording medium with long-term durability is used as a medium used for recording and also similar in that data is recorded in the medium in a highly integrated manner. However, in the present invention, the same digital data is recorded each in the plurality of information recording media, thus resulting in an increased redundancy. Therefore, if one of the media is accidentally broken or lost, the data can be read out from another medium, thereby preventing the loss of information.

In the method for manufacturing an information recording medium according to the present invention, in order to prepare a plurality of information recording media, each of which records the same digital data, the following three steps will be executed, that is, a master medium preparation step, an intermediate medium preparation step and a reproduction medium preparation step. Here, the master medium preparation step is a step in which a process for recording digital data to be stored on a recording surface of a first recording medium G1 as a recess and protrusion structure pattern is carried out to prepare a master medium M1. The intermediate medium preparation step is a step in which a process for transferring the recess and protrusion structure pattern recorded in the master medium M1 onto a recording surface of a second recording medium G2 is carried out to prepare an intermediate medium M2. And the reproduction medium preparation step is a step in which a process for transferring the recess and protrusion structure pattern recorded in the intermediate medium M2 onto a recording surface of a third recording medium G3 is carried out to prepare a reproduction medium M3.

As described above, the method for manufacturing an information recording medium according to the present invention is constituted with the master medium preparation step for preparing the master medium M1, the intermediate medium preparation step for preparing the intermediate medium M2 and the reproduction medium preparation step for preparing the reproduction medium M3. Hereinafter, a description will be sequentially given of specific details of each of these steps.

First, the information storage process which has been described as the former invention in Section 1 to Section 5 can be utilized as it is, as the master medium preparation step. That is, as shown in FIG. 4(a), a quartz glass substrate 10 is used as the first recording medium G1, a resist layer 20 is formed on a surface of the first recording medium G1 (the quartz glass substrate 10). As shown in FIG. 4(b), beam exposure is performed on a surface of the resist layer 20 to draw a graphic pattern which shows bit information of digital data to be stored, thereby forming an exposed part 21 and a non-exposed part 22. Then, as shown in FIG. 4(c), the resist layer is developed to remove a part thereof (in the case of the example shown in the drawing, the exposed part 21). And, as shown in FIG. 4(d), etching processing may be performed, with a remaining part 23 of the resist layer given as a mask, to peel and remove the remaining part 23 of the resist layer, thereby preparing an information recording medium M composed of the quartz glass substrate.

As described in Section 2, a physical recess and protrusion structure is formed on an upper face of the information recording medium M, and a bit "1" and a bit "0" are expressed by a recess C and a protrusion V. Here, the thus obtained information recording medium M is referred to as a master medium M1, and the physical recess and protrusion structure pattern formed on the surface thereof is referred to as a first recess and protrusion structure pattern. In the example shown in FIG. 4(e), the master medium M1 is constituted with a quartz glass substrate 11 which forms on the upper face thereof the first recess and protrusion structure pattern showing digital data "10110."

Figure 13:
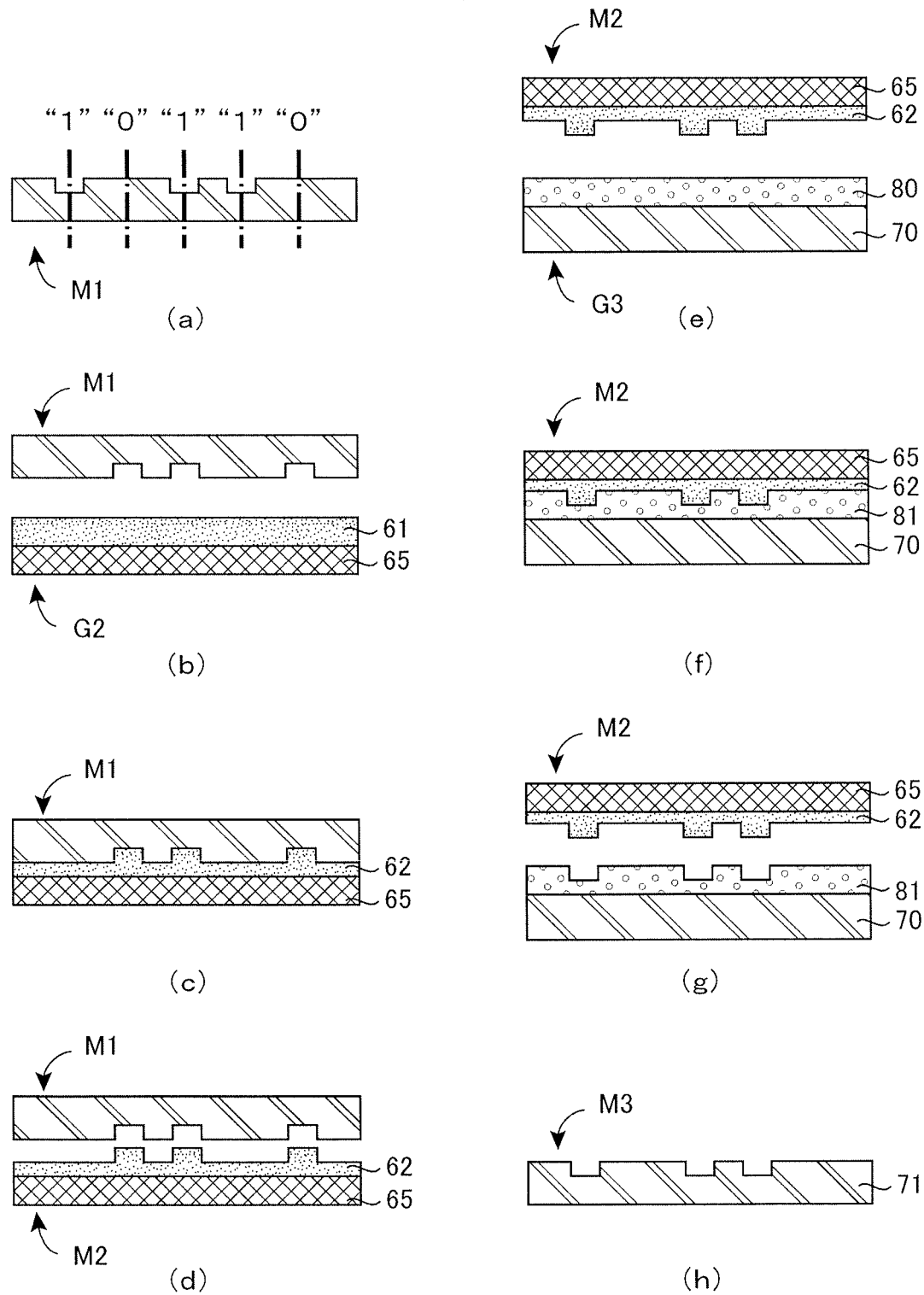
FIG. 13 is s set of side cross-sectional views which show an outline of an intermediate medium preparation step and a reproduction medium preparation step in the method for manufacturing an information recording medium according to the present invention (only a cross section is shown and a structure at the back is not illustrated).

As described above, after the master medium M1 is made available, there are then performed the intermediate medium preparation step and the reproduction medium preparation step. FIG. 13 is a side cross-sectional view which shows an outline of the intermediate medium preparation step and the reproduction medium preparation step (only a cross section is shown and a structure at the back is not illustrated). FIG. 13(a) shows the master medium M1 prepared by the method shown in FIG. 4. That is, the master medium M1 shown in FIG. 13(a) is the same as the information recording medium M shown in FIG. 4(e) (the quartz glass substrate 11 after processing), having on the upper face thereof the first recess and protrusion structure pattern showing digital data "10110."

FIG. 13(b) to (d) are side cross-sectional views, each of which shows a process of the intermediate medium preparation step. In this intermediate medium preparation step, a shape formation process, which utilizes the first recess and protrusion structure pattern formed on the surface of the master medium M1, is performed to form a second recess and protrusion structure pattern which is reverse in recess and protrusion relationship to the first recess and protrusion structure pattern, on the recording surface of the second recording medium G2, thereby carrying out a processing for preparing the intermediate medium M2.

In the case of the example shown in FIG. 13(b), there is provided, as the second recording medium G2, a two-layer structured medium in which an ultraviolet curable resin layer 61 before curing is coated on an upper face of a resin supporting layer 65. And, a recess and protrusion structure face of the master medium M1 is brought into contact with an upper face of the ultraviolet curable resin layer 61 and pressed, by which the first recess and protrusion structure pattern is shaped and transferred onto the upper face of the ultraviolet curable resin layer 61. As shown in FIG. 13(c), in this state, ultraviolet rays are irradiated to cure an ultraviolet curable resin, thereby forming an ultraviolet curable resin layer 62 which has been cured. Thereby, a transfer step of the recess and protrusion structure pattern is completely performed. As shown in FIG. 13(d), the master medium M1 is peeled to provide the intermediate medium M2 which is a two-layer structured medium composed of the cured ultraviolet curable resin layer 62 and the resin supporting layer 65. On the upper face of the intermediate medium M2, there is formed a second recess and protrusion structure pattern which is reverse in recess and protrusion relationship to the first recess and protrusion structure pattern.

Then, there is performed the reproduction medium preparation step shown in FIG. 13(e) to (h). In the reproduction medium preparation step, a quartz glass substrate 70 is used as the third recording medium G3, and a shape formation process which utilizes the second recess and protrusion structure pattern formed on the surface of the intermediate medium M2 is performed to form, on a recording surface of the third recording medium G3, a third recess and protrusion structure pattern which is reverse in recess and protrusion relationship to the second recess and protrusion structure pattern.

In the case of the example shown in FIG. 13(e), there is provided a two-layer structured body in which an ultraviolet curable resin layer 80 before curing is coated on the upper face of the quartz glass substrate 70 which constitutes the third recording medium G3, and the intermediate medium M2 is placed above the two-layered structured body, a recess and protrusion structure face of the intermediate medium M2 is brought into contact with the upper face of the ultraviolet curable resin layer 80 and pressed, by which the second recess and protrusion structure pattern is shaped and transferred onto the upper face of the second ultraviolet curable resin layer 80. As shown in FIG. 13(f), in this state, ultraviolet rays are irradiated to cure an ultraviolet curable resin, thereby forming an ultraviolet curable resin layer 81 which has been cured. And, a transfer step of the recess and protrusion structure pattern is completely performed.

Then, as shown in FIG. 13(g), the intermediate medium M2 is peeled to prepare a two-layer structured medium which is composed of the cured ultraviolet curable resin layer 81 and the quartz glass substrate 70. Here, the third recess and protrusion structure pattern which is reverse in recess and protrusion relationship to the second recess and protrusion structure pattern is formed on the upper face of the thus cured ultraviolet curable resin layer 81. Due to the recess and protrusion structure, a thick part and a thin part are formed on the ultraviolet curable resin layer 81. Thus, etching processing is performed on the quartz glass substrate 70, with the thick part utilized as a mask, and the ultraviolet curable resin layer 81 is peeled and removed, by which, as shown in FIG. 13(h), there is obtained the reproduction medium M3 which is composed of the quartz glass substrate 71 having the third recess and protrusion structure pattern on the surface thereof.

Here, the first recess and protrusion structure pattern formed on the master medium M1 shown in FIG. 13(a) is compared with the second recess and protrusion structure pattern formed on the intermediate medium M2 shown in FIG. 13(e) to find that due to transfer by the shape formation, they are reverse in recess and protrusion relationship to each other. Further, the second recess and protrusion structure pattern formed on the intermediate medium M2 shown in FIG. 13(e) is compared with the third recess and protrusion structure pattern formed on the reproduction medium M3 shown in FIG. 13(h) to find that they are also reverse in recess and protrusion relationship to each other due to transfer by the shape formation. Therefore, the first recess and protrusion structure pattern formed on the master medium M1 shown in FIG. 13(a) and the third recess and protrusion structure pattern formed on the reproduction medium M3 shown in FIG. 13(h) inevitably have the same recess and protrusion structure.

It is noted that arrangements of individual media shown in FIG. 13 are depicted for the sake of convenience of description. In an actual process, the media are not necessarily arranged in this manner (in particular, in a vertical relationship). For example, in a process of the intermediate medium preparation step shown each in FIG. 13(b) to (d), there is depicted an example in which the master medium M1 is placed above and the second recording medium G2 is placed below. However, they may be placed upside down. Similarly, in a process of the reproduction medium preparation step shown each in FIG. 13(e) to (g), there is depicted an example in which the intermediate medium M2 is placed above and the third recording medium G3 is placed below. They may also be placed upside down. In describing processes of the present invention, the word such as above, below, upper face or lower face shows a relative concept for the sake of convenience of description and does not show an absolute vertical relationship in an actual process.

Consequently, the reproduction medium M3 shown in FIG. 13(h) is literally a reproduction of the master medium M1 shown in FIG. 13(a), and the information read out from the reproduction medium M3 is identical with the information ("10110" in the case of the example shown in the drawing) read out from the master medium M1. Here, a process in which the reproduction medium M3 is prepared from the master medium M1 can be carried out repeatedly at any number of times. Further, a process in which the reproduction medium M3 is prepared from the intermediate medium M2 can also be carried out repeatedly at any number of times. Of course, in place of the master medium M1, the reproduction medium M3 can be used to prepare an intermediate medium M4 or a reproduction medium M5.

As described above, in the present invention, digital data to be stored is recorded as a recess and protrusion structure exposed on a surface of a medium. It is, therefore, possible to transfer the recess and protrusion structure to another medium by a shape formation process. The intermediate medium M2 obtained by the first transfer on the basis of the master medium M1 is to be provided with a recess and protrusion structure which has been reversed. The reproduction medium M3 obtained by the second transfer on the basis of the intermediate medium M2 is to be provided with the same recess and protrusion structure as that of the original master medium M1 by being reversed twice. Thus, the reproduction medium M3 is able to perform functions of the same information recording medium as the master medium M1.

In the example shown in FIG. 13, a quartz glass substrate is used as the master medium M1 and the reproduction medium M3, both of which can exhibit long-term durability. As described above, according to the present invention, a plurality of information recording media, each of which records the same digital data, are prepared to secure redundancy, and each of the information recording media is to have long-term durability.

The master medium M1 and the reproduction medium M3 are not necessarily required to be constituted with a single-layered quartz glass substrate. As shown in a modified example described in Section 8(1), there may be used a substrate composed of a plurality of layers in which a chromium layer is formed on an upper face of a quartz glass substrate. In short, in the master medium preparation step, a medium which includes a quartz glass substrate may be used as the first recording medium G1, thereby preparing a master medium which includes the quartz glass substrate. And, in the reproduction medium preparation step, a medium which includes a quartz glass substrate may be used as the third recording medium G3, thereby preparing a reproduction medium which includes the quartz glass substrate.

Further, in the example shown in FIG. 13, a flexible medium is used as the resin supporting layer 65 and the ultraviolet curable resin layer 61 is set at such thickness that renders flexibility after being cured. Therefore, the intermediate medium M2 prepared in the intermediate medium preparation step is given as a medium having flexibility (in the application concerned, individual drawings are deformed in terms of a dimensional ratio of each part for the sake of convenience of description and they do not faithfully show the actual dimensional ratio). Therefore, even if a rigid quartz glass substrate is used as the master medium M1 and the reproduction medium M3, it can be peeled by utilizing flexibility of the intermediate medium M2, thus making it possible to prevent breakage of a recess and protrusion structure formed on the surface of the master medium M1 and that of the reproduction medium M3.

Specifically, in the process shown in FIG. 13(d), the master medium M1 is required to be peeled from the intermediate medium M2 (the resin supporting layer 65 and the ultraviolet curable resin layer 62 which has been cured). The intermediate medium M2 which has flexibility can be curved and peeled from another medium easily. It is, therefore, possible to prevent breakage of a recess and protrusion structure formed on the surface of the master medium M1. Similarly, in the process shown in FIG. 13(g), it is necessary to peel the ultraviolet curable resin layer 81 after being cured from the intermediate medium M2. In this case as well, the flexible intermediate medium M2 can be curved and separated easily from another medium. It is, therefore, possible to prevent breakage of a recess and protrusion structure formed on the surface of the ultraviolet curable resin layer 81. Further, even if a foreign object is caught between the media, the damage of one of the media can be prevented, if the intermediate medium M2 has flexibility.

<<<Section 7. More Specific Example of the Present Invention>>>

Here, a description will be given of a more specific example of the present invention with reference to FIG. 14 to FIG. 17. In this example, there is used a substrate composed of a plurality of layers in which a chromium layer is formed on an upper face of a quartz glass substrate as the first recording medium G1 used in the master medium preparation step and as the third recording medium G3 used in the reproduction medium preparation step. As will be described later, by interposing a chromium layer it becomes possible to perform etching on the quartz glass substrate more appropriately.

Figure 14:
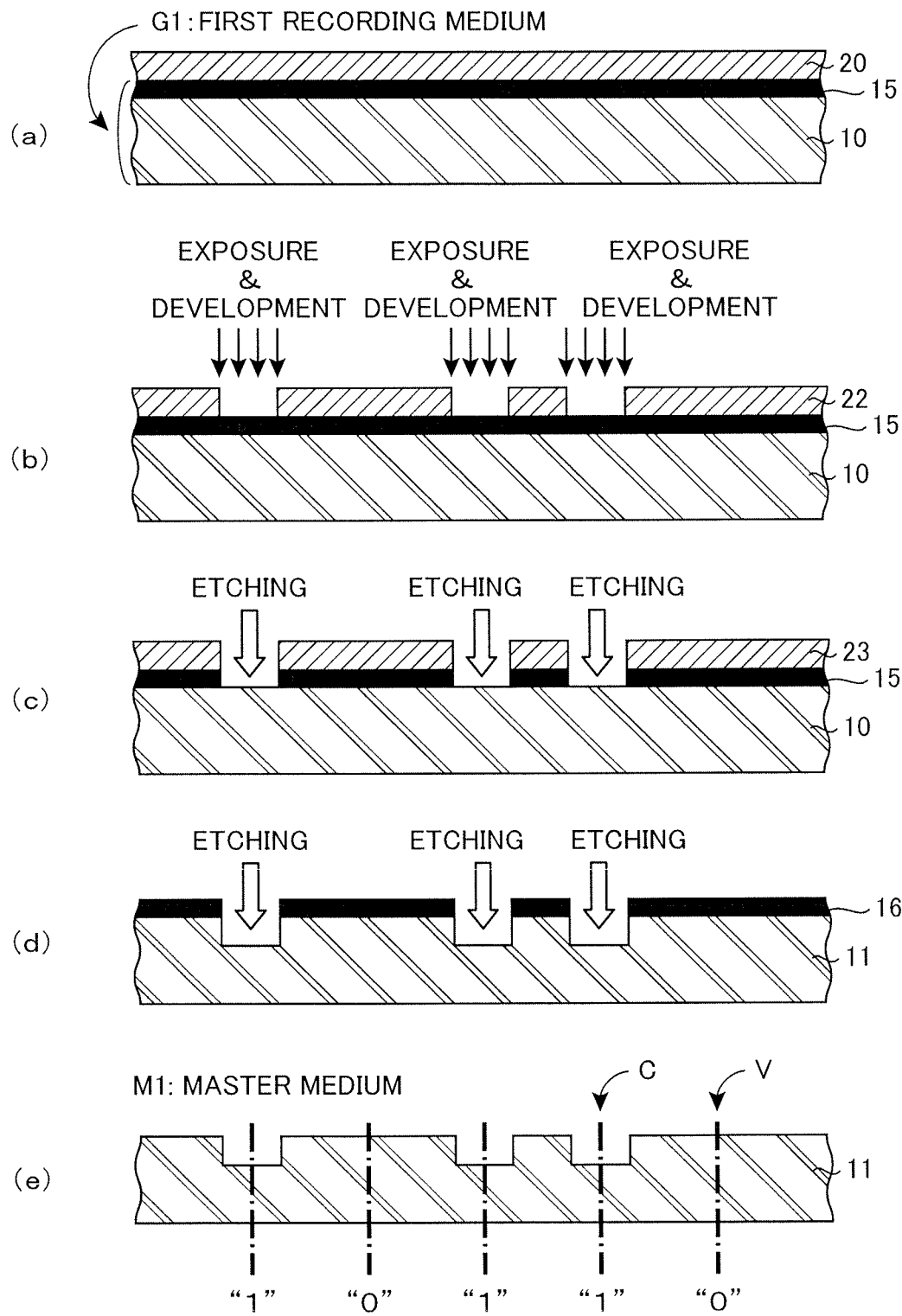
FIG. 14 is s set of side cross-sectional views which show a specific processing process of the master medium preparation step in the method for manufacturing an information recording medium according to the present invention (only a cross section is shown and a structure at the back is not illustrated).

FIG. 14 is a side cross-sectional view which shows a specific processing process of the master medium preparation step in the present invention (only a cross section is shown and a structure at the back is not illustrated). Basic procedures of the master medium preparation step are as already described in Section 2 by referring to FIG. 4. However, the procedures shown in FIG. 4 are those in which, as shown in FIG. 4(a), the single-layered quartz glass substrate 10 is used as the first recording medium G1. In contrast thereto, the procedures shown in FIG. 14 are those in which a plural-layered substrate in which a chromium layer 15 is formed on the upper face of the quartz glass substrate 10 is used as the first recording medium G1.

Therefore, in the processing process described here, first, as shown in FIG. 14(a), a medium in which the chromium layer 15 has been formed on the upper face of the quartz glass substrate 10 is provided as the first recording medium G1 and a resist layer 20 is formed on the upper face of the first recording medium G1 (the upper face of the chromium layer 15). In the case of the example shown here, the 100 nm-thick chromium layer 15 is formed on the upper face of the quartz glass substrate 10 which is a square having one side of 152 mm and thickness of 6.35 mm, and the positive-type resist layer 20 having thickness of 400 nm is also formed on the upper face thereof. The quartz glass substrate 10 having this thickness is able to act as a sufficiently rigid substrate.

Then, as shown in FIG. 14(b), the beam exposure device 200 shown in FIG. 1 is used to perform beam exposure by laser light on the surface of the resist layer 20, by which after drawing a graphic pattern showing bit information of digital data to be stored, the resist layer 20 is developed to remove a part thereof. Where a positive-type resist is used as the resist layer 20, an exposed part is dissolved by development and removed and, therefore, a non-exposed part 22 remains on the upper face of the chromium layer 15.

Then, as shown in FIG. 14(c), etching processing is performed on the chromium layer 15, with the remaining part 23 of the resist layer given as a mask. Specifically, for example, dry etching using chlorine gas ($Cl_2$) is performed, by which an exposed domain of the chromium layer 15 can be etched and removed. The remaining part 23 of the resist layer is thereafter peeled and removed.

Then, as shown in FIG. 14(d), etching processing is performed on the quartz glass substrate 10 at a predetermined depth, this time, with the remaining part 16 of the chromium layer given as a mask, thereby forming a quartz glass substrate 11 having a recess and protrusion structure pattern on the surface thereof. Specifically, for example, dry etching using carbon tetra-fluoride gas ($CF_4$) is performed, thus making it possible to etch and remove an exposed domain of the quartz glass substrate 10.

Lastly, the remaining part 16 of the chromium layer is peeled and removed, thus making it possible to prepare a master medium M1 composed of the quartz glass substrate 11 having a recess and protrusion structure pattern on the surface thereof, as shown in FIG. 14(e). The master medium M1 shown in FIG. 14(e) corresponds to the information recording medium M shown in FIG. 4(e), and the example shown in the drawing is a medium that has recorded digital data "10110." A recess is about 120 nm in depth.

Figure 15:
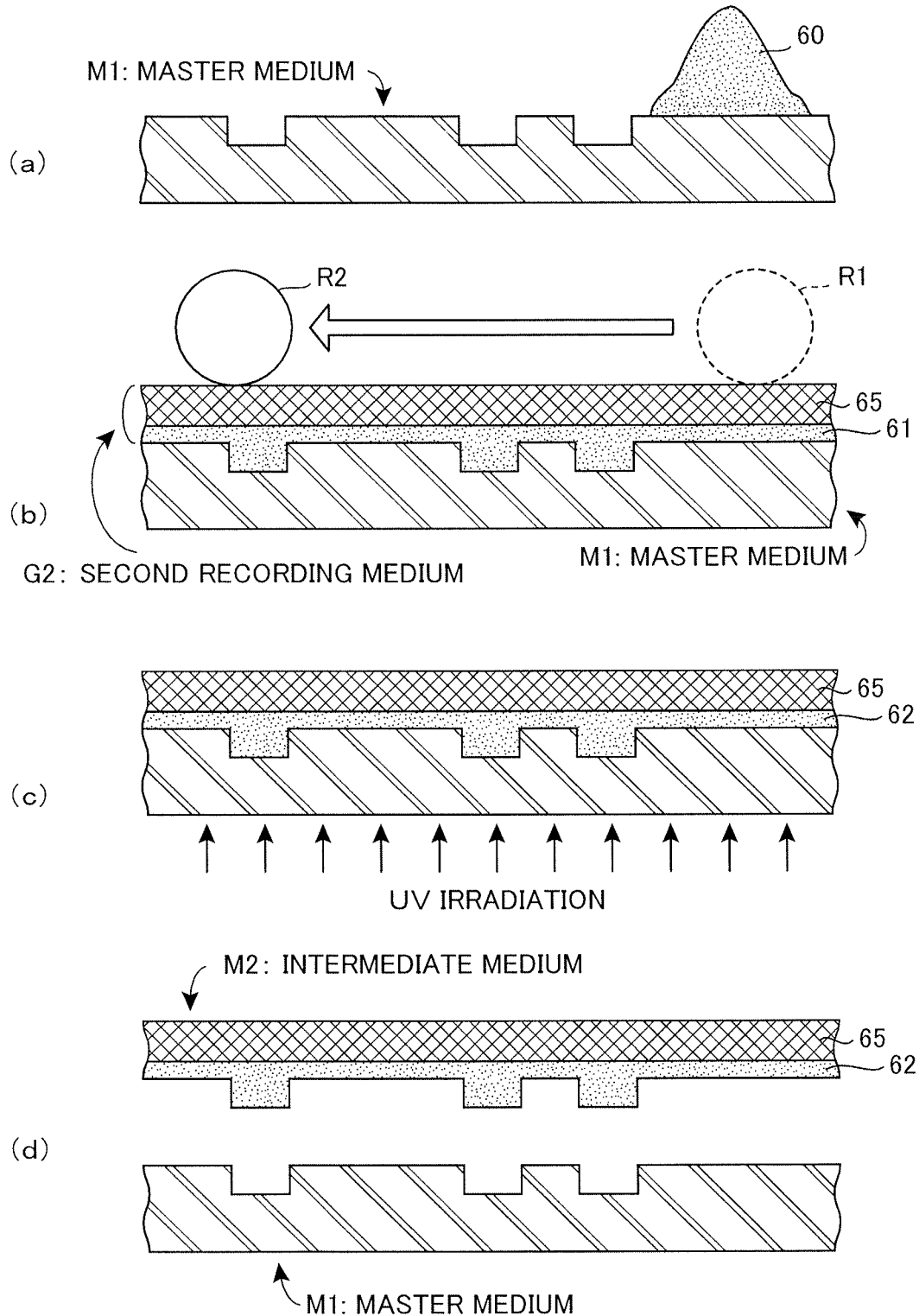
FIG. 15 is s set of side cross-sectional views which show a specific processing process of the intermediate medium preparation step in the method for manufacturing an information recording medium according to the present invention (only a cross section is shown and a structure at the back is not illustrated).

On the other hand, FIG. 15 is a side cross-sectional view which shows a specific processing process of the intermediate medium preparation step in the present invention (only a cross section is shown and a structure at the back is not illustrated). Basic procedures of the intermediate medium preparation step are as described in Section 6 by referring to FIG. 13(b) to (d). Here, a description will be given of a more specific processing process by using a pressing roller. In FIG. 15, a master medium M1 and a second recording medium G2 are depicted in such an arrangement that they are reverse in vertical relationship to those shown in FIG. 13(b) to (d).

As described previously, in the case of the example described here, the master medium M1 shown in FIG. 14(e) is a square-shaped quartz glass substrate. Here, there is formed an ultraviolet curable resin reservoir 60 as shown in FIG. 15(a) by coating an ultraviolet curable resin before curing in a linear manner along one side of the square which constitutes the upper face of the master medium M1 (in the case of the example shown in FIG. 15(a), the ultraviolet curable resin reservoir 60 serves as a bank extending in a perpendicular direction to the sheet). The ultraviolet curable resin includes any resin, as long as it is a resin having the property that will cure by irradiation of ultraviolet rays (UV). Further, it is not always necessary to use an ultraviolet curable resin, and there may be used a resin which will cure by irradiation of light with any given specific wavelength (in this case, in an UV irradiation step which will be described later, the light with a specific wavelength is to be irradiated).

Then, as shown in FIG. 15(b), a resin supporting layer 65 made of a sheet-like member having flexibility is placed above the master medium M1, and the upper face thereof is pressed by using a pressing roller. The drawing shows a state that the pressing roller is rolled from a right-end position R1 to a left-end position R2, by which the resin supporting layer 65 is pressed from the upper face. In the rolling process, the ultraviolet curable resin reservoir 60 is rolled and coated on an upper face of a recess and protrusion structure formed on the surface of the master medium M1 to form an ultraviolet curable resin layer 61. That is, the ultraviolet curable resin is coated on the surface of the master medium M1 by a pressing force of the pressing roller and also filled into a recess thereof. In the case of the example shown here, the pressing roller is pressed downward at a pressure of 0.3 MPa and rolled by being allowed to move at a velocity of 2.0 mm/sec. The ultraviolet curable resin may be heated, whenever necessary.

At this time, the ultraviolet curable resin layer 61 is adjusted for coating thickness so as to render flexibility after being cured. In short, in this rolling process, a resin layer having the property that will cure by irradiation of light may be coated on an upper face of the recess and protrusion structure formed on the surface of the master medium M1 so as to give the thickness which can render flexibility after being cured.

In practice, it is preferable that before the rolling process, certain releasing treatment is performed on a face of the master medium M1 on which the recess and protrusion structure is formed so that a subsequent process for peeling the intermediate medium M2 can be facilitated. Specifically, a releasing agent effective in peeling the ultraviolet curable resin may be coated on the face on which the recess and protrusion structure is formed.

The resin supporting layer 65 may be made of any material, as long as it is a sheet-like member having flexibility. Here, a PET (polyethylene terephthalate) film with thickness of 0.1 mm is used as the resin supporting layer 65.

The resin supporting layer 65 may be provided with any dimensions as long as it is able to cover sufficiently the face of the master medium M1 on which the recess and protrusion structure is formed. Here, since the master medium M1 is in the shape of a square with a side of 152 mm, a PET film with dimensions of 210×297 mm is used as the resin supporting layer 65 so as to sufficiently cover the medium.

Here, in practice, it is preferable that certain treatment for improving adhesion is performed on a lower face of the PET film (the resin supporting layer 65) for improving adhesion with the ultraviolet curable resin layer 61. For example, corona treatment for modifying the surface by corona discharge irradiation is effective in improving adhesion.

Consequently, in the rolling process shown in FIG. 15(b), the ultraviolet curable resin layer 61 is coated on the upper face of the master medium M1 in thickness which will render flexibility after being cured and the resin supporting layer 65 with flexibility is also laminated on the upper face of the ultraviolet curable resin layer 61. A laminated structure body composed of the ultraviolet curable resin layer 61 and the resin supporting layer 65 corresponds to the second recording medium G2 for preparing the intermediate medium M2 shown in FIG. 13(b).

Then, the ultraviolet curable resin layer 61 before curing is cured by irradiation of ultraviolet rays and, then, as shown in FIG. 15(c), there is obtained an ultraviolet curable resin layer 62 after curing. In the case of the example shown in the drawing, ultraviolet rays are irradiated from below (from the lower face of the master medium M1). However, ultraviolet rays can be irradiated from above or may be irradiated both from above and below. Since the master medium M1 is constituted with a quartz glass substrate, it has sufficient optical transparency with regard to ultraviolet rays. Irradiation of ultraviolet rays can be efficiently performed on the resin even when ultraviolet rays are irradiated from below.

Lastly, as shown in FIG. 15(d), the laminated structure body composed of the cured resin layer 62 and the resin supporting layer 65 is curved by utilizing the flexibility thereof and peeled from the master medium M1. The intermediate medium M2 is formed by the thus peeled laminated structure body.

In the example shown in FIG. 15, as shown in FIG. 15(b), the rolling process by the pressing roller is completed and the ultraviolet curable resin layer 61 is rolled and coated sufficiently on the master medium M1. And, thereafter, ultraviolet rays are irradiated as shown in FIG. 15(c). However, while the rolling process shown in FIG. 15(b) is performed, ultraviolet rays may also be irradiated.

Figure 16:
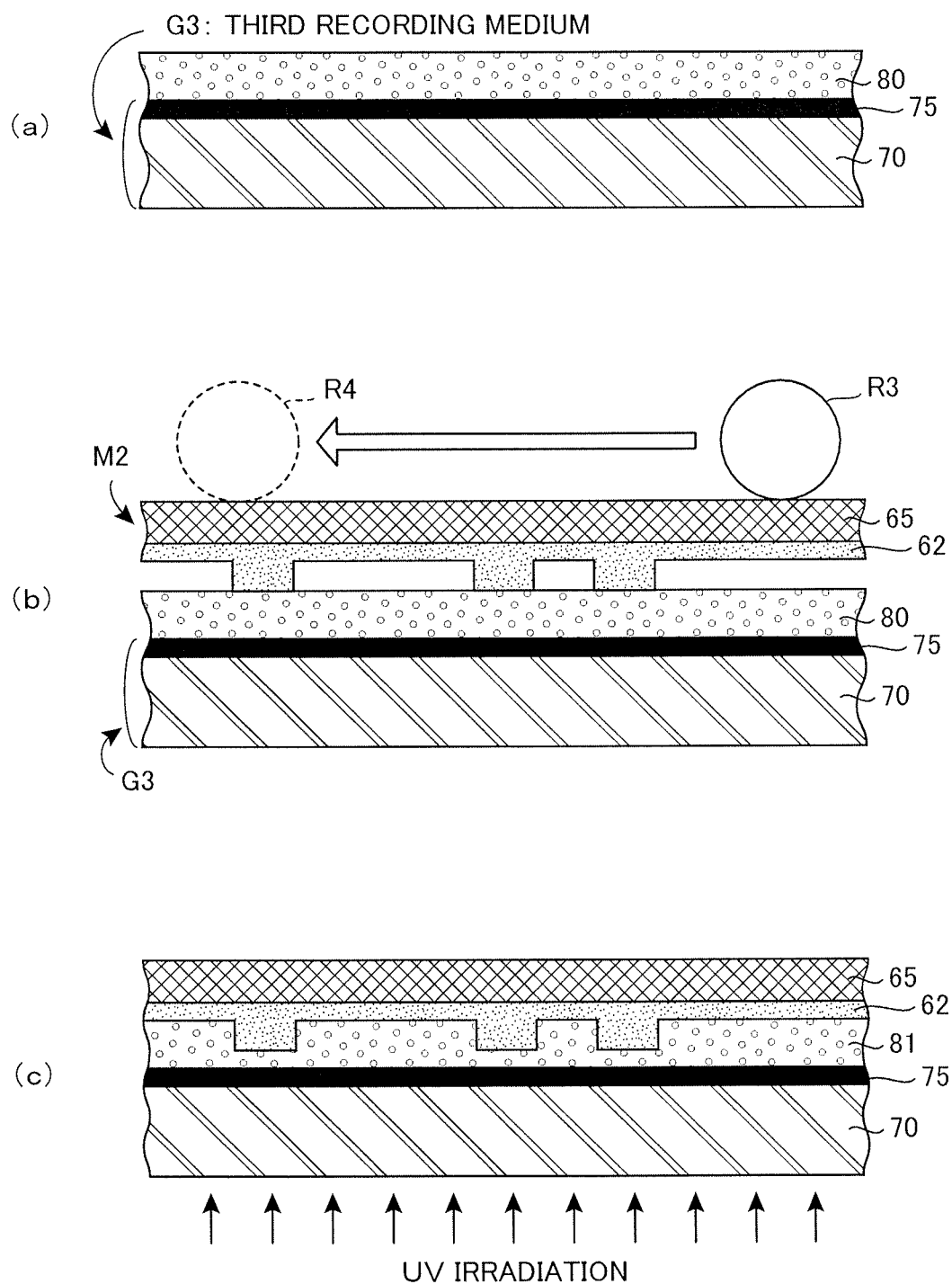
FIG. 16 is s set of side cross-sectional views which show a specific first-half processing process of the reproduction medium preparation step in the method for manufacturing an information recording medium according to the present invention (only a cross section is shown and a structure at the back is not illustrated).
Figure 17:
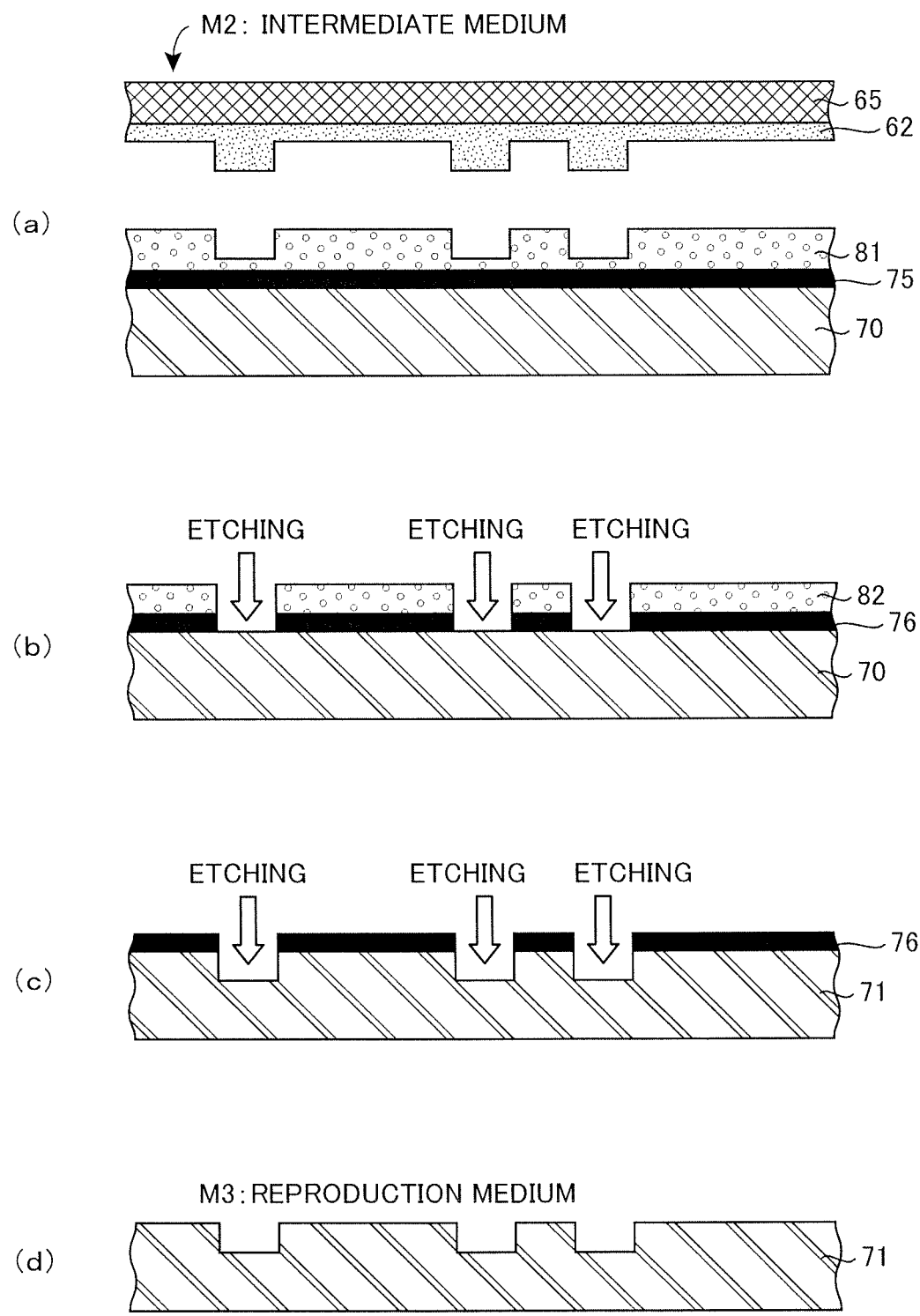
FIG. 17 is s set of side cross-sectional views which show a specific second-half processing process of the reproduction medium preparation step in the method for manufacturing an information recording medium according to the present invention (only a cross section is shown and a structure at the back is not illustrated).

Lastly, a description will be given of a specific processing process of the reproduction medium preparation step in the present invention by referring to the side cross-sectional views of FIG. 16 and FIG. 17 (only a cross section is shown and a structure at the back is not illustrated). Basic procedures of the reproduction medium preparation step are as described in Section 6 by referring to FIG. 13(e) to (h). Here, a description will be given of a processing process in which a chromium layer 75 is formed on an upper face of the quartz glass substrate 70 and a pressing roller is used.

First, as shown in FIG. 16(a), a medium in which a chromium layer 75 is formed on the upper face of the quartz glass substrate 70 is provided as a third recording medium G3, and an ultraviolet curable resin layer 80 is formed on the upper face of the third recording medium G3 (the upper face of the chromium layer 75). In the case of the example shown here, the 100 nm-thick chromium layer 75 is formed on the upper face of the quartz glass substrate 70 having thickness of 6.35 mm in the shape of a square with one side of 152 mm and an ultraviolet curable resin layer 80 with thickness of 85 nm is also coated on the upper face thereof. The quartz glass substrate 70 with the above-described thickness serves as a substrate with sufficient rigidity. A method for coating the ultraviolet curable resin layer 80 may include, for example, a method by spin, ink jet or spray coating as well as a method by using a squeegee (screen printing, specifically, a material coated on a perforated plate is allowed to fall through holes by using a squeegee).

Any resin may be coated as the ultraviolet curable resin layer 80, as long as it is a resin which has the property that will cure by irradiation of ultraviolet rays. Further, use of an ultraviolet curable resin is not necessarily required. Such a resin may be used that will cure by irradiation of light with any specific wavelength (in this case, in an ultraviolet-rays irradiation process which will be described later, light with a specific wavelength is to be irradiated).

Then, as shown in FIG. 16(b), the intermediate medium M2 (that shown in FIG. 15(d)) is placed above the ultraviolet curable resin layer 80, with a recess and protrusion structure surface thereof pointed below. Then, the upper face of the ultraviolet curable resin layer 80 is covered and pressed so that a resin of the ultraviolet curable resin layer 80 is filled into a recess on the recess and protrusion structure surface of the intermediate medium M2. Here, as shown in the drawing, there is adopted a method by which the upper face of the intermediate medium M2 is pressed downward by a pressing roller. The drawing shows a state that the pressing roller is placed at a right-end position R3. Thereafter, the pressing roller is placed downward and rolled to a left-end position R4, by which a protrusion of the intermediate medium M2 is embedded into the ultraviolet curable resin layer 80 and the resin can be filled into a recess of the intermediate medium M2. In the case of the example shown here, the pressing roller is pressed downward at a pressure of 0.3 MPa and allowed to move at a velocity of 2.0 mm/sec, thereby pressing the intermediate medium M2. The ultraviolet curable resin may be heated whenever necessary.

Then, the ultraviolet curable resin layer 80 before curing is cured by irradiation of ultraviolet rays, thereby obtaining the ultraviolet curable resin layer 81 after curing, as shown in FIG. 16(c). In the case of the example shown in the drawing, ultraviolet rays are irradiated from below (from the lower face of the quartz glass substrate 70). Ultraviolet rays can be irradiated from above or may be irradiated both from above and below. As described previously, the quartz glass substrate is sufficient in optical transparency with regard to ultraviolet rays and irradiation of ultraviolet rays can be performed efficiently on the resin when ultraviolet rays are irradiated from below.

Then, as shown in FIG. 17(a), the intermediate medium M2 is curved by utilizing the flexibility thereof and peeled from the cured ultraviolet curable resin layer 81, thereby obtaining a three-layer structure medium composed of the cured ultraviolet curable resin layer 81, the chromium layer 75 and the quartz glass substrate 70. A recess and protrusion structure pattern which has been transferred is formed onto the upper face of the cured ultraviolet curable resin layer 81, and a thick part and a thin part are formed on the ultraviolet curable resin layer 81 by the recess and protrusion structure. Therefore, etching processing is performed on a chromium layer 75, with the thick part utilized as a mask, thereby removing a part of the chromium layer 75.

Specifically, as shown at a lower part of FIG. 17(a), dry etching using chlorine gas ($Cl_2$) is performed from the upper face of the ultraviolet curable resin layer 81 having a thick part and a thin part, by which, as shown in FIG. 17(b), the thin part of the ultraviolet curable resin layer 81 is etched and removed and also an exposed domain of the chromium layer 75 can be etched and removed. In this case, the ultraviolet curable resin layer 81 undergoes corrosion at the thick part by etching which uses chlorine gas and decreases in thickness. However, the thick part will remain as a remaining ultraviolet curable resin layer 82 after complete removal of the thin part, thereby functioning as a mask for the chromium layer 75. As a result, a part which is covered with the remaining ultraviolet curable resin layer 82 remains as a remaining part 76 of the chromium layer.

As another method for etching the chromium layer 75 shown in FIG. 17(b) from a state shown at the lower part of FIG. 17(a), first, from the upper face of the ultraviolet curable resin layer 81 having a thick part and a thin part, oxygen gas ($O_2$) is used to perform dry etching on the ultraviolet curable resin layer 81, and at the time when the thin part is removed to expose the chromium layer 75, the etching gas is changed from oxygen gas ($O_2$) to chlorine gas ($Cl_2$) and the chromium layer 75 can be etched, with the remaining ultraviolet curable resin layer 82 given as a mask.

Then, after the remaining ultraviolet curable resin layer 82 has been peeled and removed, as shown in FIG. 17(c), at this time, with the remaining part 76 of the chromium layer given as a mask, the quartz glass substrate 70 is etched to a prescribed depth, thereby forming a quartz glass substrate 71 having a recess and protrusion structure pattern on the surface thereof. Specifically, for example, dry etching using carbon tetra-fluoride gas ($CF_4$) is performed to etch and remove an exposed domain of the quartz glass substrate 70.

Lastly, the remaining part 76 of the chromium layer is peeled and removed, thus making it possible to form a reproduction medium M3, which is made of the quartz glass substrate 71 having a recess and protrusion structure pattern on the surface thereof, as shown in FIG. 17(d). The reproduction medium M3 shown in FIG. 17(d) is to be a medium which records digital data "10110" which is the same as the master medium M1 shown in FIG. 14(e). A recess is about 120 nm in depth.

<<<Section 8. Modified Example of the Present Invention>>>

The present invention relates to a method for manufacturing an information recording medium in which prepared are a plurality of information recording media, each of which records the same digital data. A description has been so far given of a representative embodiment thereof by referring to the drawings. Here, there will be described some modified examples of the present invention.

(1) Handling of Chromium Layer

In the master medium preparation step shown in FIG. 14, as shown in FIG. 14(a), a medium in which the chromium layer 15 has been formed on the upper face of the quartz glass substrate 10 is used as the first recording medium G1. Similarly, in the reproduction medium preparation step shown in FIG. 16, as shown in FIG. 16(a), a medium in which the chromium layer 75 has been formed on the upper face of the quartz glass substrate 70 is used as the third recording medium G3. As described above, use of the chromium layer enables more appropriate etching to the quartz glass substrate.

For example, in the etching process performed on the quartz glass substrate 11 shown in FIG. 14(d), dry etching using carbon tetra-fluoride gas ($CF_4$) can be performed, with the remaining part 16 of the chromium layer given as a mask. In the etching process performed on the quartz glass substrate 71 shown in FIG. 17(c), similar dry etching can be performed, with the remaining part 76 of the chromium layer given as a mask.

In the example so far described, since the chromium layer is utilized as a mask on etching process performed on the quartz glass substrate, the remaining part 16 or 76 of the chromium layer after being used as the mask will be finally removed. However, removal of the remaining part 16 or 76 of the chromium layer is not necessarily required. For example, a two-layer structure medium composed of the quartz glass substrate 11 and the remaining part 16 of the chromium layer shown in FIG. 14(d) may be utilized, as it is, as the master medium M1. Similarly, a two-layer structure medium composed of the quartz glass substrate 71 and the remaining part 76 of the chromium layer shown in FIG. 17(c) may be utilized, as it is, as the reproduction medium M3.

In Section 2, by referring to FIG. 5(b) to (d), there is shown a modified example in which an added layer is formed on the surface of a recess C or a protrusion V of the information recording medium M or the surface of both of them. Therefore, the master medium M1 or the reproduction medium M3 according to the present invention is not necessarily constituted with a single-layered quartz glass substrate but may include another added layer, as long as it is a medium which includes a quartz glass substrate. Therefore, the two-layer structure body shown in FIG. 14(d) can be utilized, as it is, as the master medium M1, and the two-layer structure body shown in FIG. 17(c) can be utilized, as it is, as the reproduction medium M3.

Originally, where the master medium M1 and the reproduction medium M3 are prepared on the assumption that they are stored for several hundred years, it is preferable that, as described in the example so far given, the remaining part 16 or the remaining part 76 of the chromium layer is finally removed to prepare the master medium M1 composed of a single-layered quartz glass substrate shown in FIG. 14(e) or the reproduction medium M3 composed of a single-layered quartz glass substrate shown in FIG. 17(d). This is because, with consideration given to the fact that they are stored for several hundred years, the chromium layer made of metal may undergo corrosion by atmospheric components. A single-layered quartz glass substrate is expected to exhibit sufficient robustness even on the assumption of a storage period of several hundred years to several thousand years.

(2) Master Medium and Reproduction Medium which have Flexibility

In the example described in Section 7, as the first recording medium G1 (refer to FIG. 14(a)) used in the master medium preparation step, there is used a medium in which the chromium layer 15 is formed on the upper face of the quartz glass substrate 10 with thickness of 6.35 mm. Therefore, the finally obtained master medium M1 (refer to FIG. 14(e)) is a medium with sufficient rigidity. Similarly, as the third recording medium G3 (refer to FIG. 16(a)) used in the reproduction medium preparation step, there is used a medium in which the chromium layer 75 is formed on the upper face of the quartz glass substrate 70 with thickness of 6.35 mm and, therefore, the finally obtained reproduction medium M3 (refer to FIG. 17(d)) is a medium with sufficient rigidity.

In contrast, as the second recording medium G2 (refer to FIG. 15(b)) used in the intermediate medium preparation step, there is used a two-layer structure medium in which the ultraviolet curable resin layer 61 is coated on the resin supporting layer 65 made of a 0.1-mm thick PET film so as to give the thickness which will render flexibility after curing. Therefore, the finally obtained intermediate medium M2 (refer to FIG. 15(d)) is a medium with flexibility.

Consequently, the master medium M1 and the reproduction medium M3 are each a medium with rigidity, while the intermediate medium M2 is a medium with flexibility. This is to be the most preferable embodiment in executing the present invention. That is, the master medium M1 and the reproduction medium M3 are original targets to be prepared in the present invention (the media which constitute a plurality of information recording media, each of which records the same digital data), playing a role in maintaining information with long-term durability. In playing the above-described role, it is in general preferable that they are media with rigidity.

In contrast thereto, the intermediate medium M2 plays a role in copying temporarily the first recess and protrusion structure pattern recorded on the master medium M1 as a second recess and protrusion structure pattern and transferring it to the reproduction medium M3 as a third recess and protrusion structure pattern and does not play a role in maintaining information with long-term durability. Therefore, the intermediate medium M2 is not necessarily required to be a medium with rigidity. Further, where the master medium M1 and the reproduction medium M3 are each constituted with a medium having rigidity, the intermediate medium M2 is required to be a medium having flexibility.

This is because in the shape formation process of the intermediate medium preparation step or in the shape formation process of the reproduction medium preparation step, the intermediate medium M2 having flexibility can be curved and peeled from another medium. For example, in the intermediate medium preparation step shown in FIG. 15(d), when the intermediate medium M2 is peeled from the master medium M1, flexibility of the intermediate medium M2 can be used to curve the intermediate medium M2, by which it can be easily peeled from the master medium M1 which is made of a rigid body. Similarly, in the reproduction medium preparation step shown in FIG. 17(a), when the intermediate medium M2 is peeled from the ultraviolet curable resin layer 81 which has been cured, flexibility of the intermediate medium M2 can be used to curve the intermediate medium M2, by which it can be easily peeled from the ultraviolet curable resin layer 81 formed on the quartz glass substrate 70 which is a rigid body.

Further, even if a certain foreign object is caught between the media in the shape formation process of each step, damage of a counterpart medium can be avoided by using the flexibility of the intermediate medium M2. For example, even if a certain foreign object is mixed in a recess and protrusion structure surface of the master medium M1 in the rolling process of the intermediate medium preparation step shown in FIG. 15(b) and the foreign object is kept embedded into the ultraviolet curable resin layer 62 after curing, in the peeling process shown in FIG. 15(d), the master medium M1 can be peeled without damage of the recess and protrusion structure surface by the foreign object because the intermediate medium M2 has flexibility. This is also true for the peeling process of the reproduction medium preparation step shown in FIG. 17(a).

Consequently, the first recording medium G1 which is an original of the master medium M1 and the third recording medium G3 which is an original of the reproduction medium M3 are each referred to as a "first attribute medium" and the second recording medium G2 which is an original of the intermediate medium M2 is referred to as a "second attribute medium." In this case, "the first attribute medium" is a medium playing a role in maintaining information with long-term durability, while "the second attribute medium" is a medium playing a role in transferring a recess and protrusion structure pattern. Thus, in the example so far described, as the first attribute medium, there is used a medium which includes a quartz glass substrate having a thickness capable of rendering rigidity and, as the second attribute medium, there is used a medium having flexibility, thus resulting in preparation of the master medium M1 having rigidity and the reproduction medium M3 having rigidity.

Nevertheless, it is also possible to use a medium having flexibility as the master medium M1 and the reproduction medium M3. As described above, in general, a medium having rigidity is considered preferable as a medium for maintaining information, with long-term durability secured. However, with consideration given to a situation where an excessive physical force is applied, there may be a case where a medium having flexibility exhibits higher durability than a medium having rigidity. In this point of view, there may be used a medium having flexibility, as the master medium M1 and the reproduction medium M3.

In the previously described example, as the first recording medium G1 and the third recording medium G3, there is used a medium in which a chromium layer is formed on a quartz glass substrate having thickness of 6.35 mm. The medium with the thickness is available as a medium with sufficient rigidity. Even a quartz glass substrate renders flexibility if it is decreased in thickness to 350 µm or less. Therefore, it is possible to prepare the master medium M1 and the reproduction medium M3, each of which has flexibility, by using such a quartz glass substrate that has the thickness capable of rendering flexibility.

That is, as the first attribute medium (the first recording medium G1 and the third recording medium G3), there is used a medium which includes a quartz glass substrate having the thickness capable of rendering flexibility, and as the second attribute medium (the second recording medium G2), there is used a medium having rigidity (for example, in place of the above-described PET film, a synthetic resin plate is used), thus making it possible to prepare the master medium M1 having flexibility and the reproduction medium M3 having flexibility. In this case, the intermediate medium M2 is a medium having rigidity and, in a peeling process, a flexible medium which is a counterpart of the intermediate medium M2 can be curved and peeled therefrom.

Of course, all the media may be constituted with a flexible medium. That is, as the first attribute media (the first recording medium G1 and the third recording medium G3), there is used a medium which includes a quartz glass substrate having the thickness capable of rendering flexibility, and as the second attribute medium (the second recording medium G2), there is also used a medium having flexibility (for example, a medium which uses a PET film as described in the above example). Thereby, the master medium M1 having flexibility is prepared and the intermediate medium M2 having flexibility is also used, by which it is possible to prepare the reproduction medium M3 with flexibility.

In short, in executing the present invention, at least one of the first attribute media (the first recording medium G1 and the third recording medium G3) and the second attribute medium (the second recording medium G2) is to be a medium having flexibility. And, in the shape formation process of the intermediate medium preparation step and the shape formation process of the reproduction medium preparation step, a medium having flexibility may be curved and peeled from another medium.

(3) Method for Recording Bit Figure

In the master medium M1 shown in FIG. 14(e), the recess C which constitutes a recess and protrusion structure surface shows a bit "1," and the protrusion V shows a bit "0," thereby forming on the upper face thereof a recess and protrusion structure pattern which shows digital data "10110." This is also true for the reproduction medium M3 shown in FIG. 17(d). The digital data "10110" corresponds to data at a second row of the unit bit matrix B(U1) in FIG. 2, or the data which is recorded at five grid points L defined at intersection points between the horizontal grid line X3 and the longitudinal grid lines Y2 to Y6 defined in a unit recording graphic pattern R(U1) shown in FIG. 3.

In the case of the example shown in FIG. 3, a case where a bit figure F indicated by a thick-line square is arranged at a position of each grid point L shows a bit "1," and a case where no bit figure F is arranged shows a bit "0" (of course, they may be defined in a reverse manner). Then, the examples shown in FIG. 14(e) and FIG. 17(d) are each such an example that on the recess and protrusion structure surface of the master medium M1 or the that of reproduction medium M3, the interior of a bit figure F is expressed by the recess C and the exterior thereof is expressed by the protrusion V. In other words, the recess and protrusion structure surface of the master medium M1 or that of the reproduction medium M3 is observed to find that, in the pattern shown in FIG. 3, the interior of the bit figure F and the interiors of the alignment marks Q1 to Q4 which are each enclosed with a thick line are given as the recess C, and the exterior thereof is given as the protrusion V.

Of course, it is also possible to prepare, as a modified example, a master medium M1 or a reproduction medium M3 in which a relationship between a recess C and a protrusion V is reversed. A recess and protrusion structure surface of the master medium M1 or that of the reproduction medium M3 according to the modified example is observed to find that the interior of the bit figure F and those of the alignment marks Q1 to Q4 are given as the protrusion V and the exterior thereof is given as the recess C.

As described above, in theory, on the recess and protrusion structure surface of the master medium M1 or that of the reproduction medium M3, the interior of each bit figure F may be given as a recess and the exterior thereof may be given as a protrusion or in a reverse manner, the interior of each bit figure F (and the interior of each of the alignment marks Q1 to Q4) may be given as a protrusion and the exterior thereof may be given as a recess. However, it is, in practice, preferable that, as with the example so far described, drawing processing in the beam exposure step and the patterning processing in the patterning step are performed so as to form the master medium M1 in which the interior of each bit figure F (and each of the alignment marks Q1 to Q4) is given as a recess and the exterior thereof is given as a protrusion (a similar reproduction medium M3 is inevitably formed).

This is because the interior of each bit figure F (each of the alignment marks Q1 to Q4) is expressed as a recess, thereby providing such an advantage that will reduce possible readout of erroneous data resulting from breakage of a medium. A reason thereof can be understood by comparing a case where the interior of each bit figure F shown by a thick-lined square in FIG. 3 is given as a protrusion so as to protrude above the sheet with a case where it is reversely given as a recess so as to recess below the sheet to consider which is higher in durability on breakage of the medium.

First, in the former case, that is, where the interior of each bit figure F is given as a protrusion and protrudes upward, upon exertion of certain physical impact on the recess and protrusion structure surface, the protrusion is likely to receive a physical force and may be broken more easily than the recess. Therefore, if the interior of the bit figure F, that is, the protrusion is damaged and the height at a position of a grid point L is lost, erroneous data will be read out.

As described in Section 3, data is read out by such processing that judges whether a bit figure F is present at a position of each grid point L or not. In the case of the example shown in FIG. 3, where a bit figure F is present at a position of each grid point L, it is interpreted as a bit "1," and where a bit figure F is not present, it is interpreted as a bit "0." Therefore, in the case of the above example, if the interior of a bit figure F, that is, a protrusion, is damaged and the height of a position of a grid point L is lost, it should be essentially interpreted to be a bit "1" (a bit figure F is present) but it is erroneously interpreted to be a bit "0" (no bit figure F is present).

In contrast, in the latter case, that is, where the interior of each bit figure F is given as a recess and recesses downward, even upon exertion of a certain physical impact on the recess and protrusion structure surface, the recess in itself is less likely to receive a physical force and the surface is less likely to be damaged. In reality, a physical force is applied to a border wall (a contour part of the thick-lined square in FIG. 3) which constitutes a periphery of the recess and, therefore, there is a possibility that the border wall may be broken. However, even if the border wall is broken, the thick-lined square shown in FIG. 3 expands outside only slightly, with no change in height of the position of a grid point L (the bottom of the recess).

Therefore, a bit "1" is recorded as a recess, by which upon breakage of the border wall, the position of a grid point L (the bottom of the recess) is still recognized as the recess and a bit "1" is read out correctly. On the other hand, although the position of a grid point L which shows a bit "0" is a protrusion, it is less likely to have such damage that the position thereof is recessed by a physical force, because there is formed a flat plane together with a periphery thereof.

Due to the above-described reason, as with the example so far described, it is, in practice, preferable that recording is made so that the interior of each bit figure F is given as a recess and the exterior thereof is given as a protrusion on the recess and protrusion structure surface of the master medium M1 or that of the reproduction medium M3. In this case, on the recess and protrusion structure surface of the intermediate medium M2, a recess and protrusion relationship is reversed so that the interior of each bit figure F is given as a protrusion and the exterior thereof is given as a recess. However, the intermediate medium M2 will not play a role in maintaining long-term storage and, therefore, no problems will occur.

(4) Material of Intermediate Medium M2

In Section 7, a description has been given of the example in which a two-layer structured body composed of a PET film and an ultraviolet curable resin layer is used to constitute the intermediate medium M2. The intermediate medium M2 of the present invention may be such a medium that the shape formation process which utilizes a first recess and protrusion structure pattern formed on the surface of the master medium M1 is used to form on the surface thereof a second recess and protrusion structure pattern which is reverse in recess and protrusion relationship to the first recess and protrusion structure pattern. Therefore, the intermediate medium M2 used in the present invention shall not be limited to the above-described two-layer structured body. Here, a description will be given of a modified example on a material of the intermediate medium M2.

First, as a resin supporting layer which constitutes the intermediate medium M2, in place of the above-described PET (polyethylene terephthalate), there can be used a film composed of compositions such as polydimethylsiloxane (PDMS), polyolefin, cycloolefin, polycarbonate, polymethylmethacylate and cellulose acylate. Of course, there may be used a laminated structure in which these films are laminated.

Further, as an ultraviolet curable resin, there may be used a polymerizable monomer, for example, acrylate monomer, acryl acrylate, urethane acrylate, epoxy acrylate or polyester acrylate. And, as a photo-initiator, there may be used a radical polymerization resin which includes materials such as benzophenone-based, acetophenone-based and thioxanthone-based materials.

Alternatively, as a polymerizable monomer, there can be used vinyl ether monomer, vinyl ether oligomer, glycidyl ether epoxy or alicyclic epoxy. As a photo-initiator, there can be used an ultraviolet curable resin, that is, a cation polymerization resin which includes iodonium-based or sulfonium-based material.

As a resin supporting layer, there can be used glass such as quartz glass and soda lime glass or metals such as aluminum, nickel, iron and SUS. However, in order to prepare the intermediate medium M2 to which flexibility is rendered so as to be curved on peeling, the resin supporting layer is needed to be made thin so as to obtain flexibility.

Where a hard layer such as the above-described glass or metal is used as the resin supporting layer, it is preferable that the resin layer is made sufficiently thick. This is because in the shape formation process of the intermediate medium preparation step and that of the reproduction medium preparation step, where a certain foreign object is caught between the media and if the resin supporting layer is made of a hard layer such as glass or metal and also the resin layer is thin, one of the media may be damaged by the foreign object. If the resin layer is made sufficiently thick, stress caused by the foreign object which has been caught can be absorbed by the resin layer, thereby preventing possible damage of the medium.

<<<Section 9. Advantage of Use of Quartz Glass Substrate>>>

As described above, in the present invention, there is adopted a technique by which digital data is recorded as a recess and protrusion structure pattern on a medium which includes a quartz glass substrate (a single-layered quartz glass substrate and a medium in which a chromium layer is added on the substrate). The master medium M1 and the reproduction medium M3 which are prepared by the present invention are each constituted with a medium which includes a quartz glass substrate. Of course, in theory, in place of the quartz glass substrate, a silicone substrate or the like may be used to record digital data. However, in practice, as so far described, a medium which includes a quartz glass substrate is preferably used. Thus, hereinafter, a description will be given of advantages obtained by using a medium which includes a quartz glass substrate as the master medium M1 and the reproduction medium M3.

Here, the quartz glass substrate is a substrate which is constituted with a composition $SiO_2$ and substantially free of any impurities. Generally-used glass is made by adding various impurities to $SiO_2$ and more fragile than quartz glass and lower in heat resistance, corrosion resistance and transparency. To the best of the inventor's knowledge as concerns this application, the quartz glass substrate is optimal as a medium for recording digital data and storing the data for a long period of time in the process according to the present invention.

As already described, information recording media which have been currently available in general are not suitable in storing information on a longer time scale of several hundred to several thousand years. For example, cellulose acetate which is a generally-used raw material of microfilms is to have a durable life span of 30 years or less. Of course, although the durable life span varies depending on the storage conditions, the material will undergo decomposition by change in temperature and humidity. There is a phenomenon called vinegar syndrome in which acetic acid is formed on the surface and data readout is disabled, and this is a problem. In order to cope with this problem, use of polyester as a material makes it possible to extend the life span up to about 500 years. It is, however, necessary to store data under strict conditions set forth by standards such as ISO 18901: 2002 and JIS Z 6009:2011, and the storage conditions are still ubiquitous risk factors.

On the other hand, memory devices using a semiconductor are also limited in durable life. For example, in the case of EEPROM, the representative of which is a flash memory, memory is maintained by keeping charge to a floating gate, and the time of maintaining the memory will vary greatly depending on the storage conditions. Further, repetition of write processing will result in failure of charge due to breakage of an insulation layer, which leads to a problem. In contrast thereto, ROM is a semiconductor memory which is relatively long in durable life span. It is, however, quite difficult to make a reproduction thereof at a later stage. That is, when a reproduction is needed, it is necessary to conduct processes for producing again new ROM on the basis of digital data read out from the original ROM. A huge amount of cost is needed for production of ROM. Therefore, ROM is not suitable as a recoding medium of digital data in general.

Hard disk devices have found a wide application as devices for storing digital data used in a computer and are also able to reproduce information easily. However, the durable life span is several years or so. This is because a hard disk device is vulnerable to magnetism and constituted with a plurality of components, thereby having a common problem of higher risk of defective components. In reality, the device is constituted with an assembly of components, each of which has a durable life span, such as grease for smoothly driving a magnetic disk, semiconductor chips for drive control and mechanical parts such as a magnetic head and a suspension, thus inevitably resulting in risk of failure. Therefore, in order to maintain information in a reliable manner, it is necessary to build a RAID system or the like in which redundancy is added as a precondition. And, for long-term storage, there is needed such maintenance that devices are changed regularly.

Further, the above-described conventional information recording media have a common problem such as lower fire resistance or heat resistance. For example, ISO834 has stipulated fire conditions on a temperature which reaches about 930° C. in 60 minutes after occurrence of fire. A micro film will melt, a magnetic body will lose magnetism and a metal will start to flow at this high temperature. Therefore, the above-described conventional media are no longer able to maintain information.

With the above situation taken into account, it is apparent that the quartz glass substrate is an optimal medium for recording digital data and storing the data for a long period of time by the process according to the present invention. First, quartz glass is extremely high in heat resistance and, therefore, it is able to maintain information recorded as a recess and protrusion structure as it is and read out the information without any difficulty, even when the master medium M1 and the reproduction medium M3 prepared by the present invention are placed in an environment in excess of 1000° C. The quartz glass is also high in heat resistance and, therefore, no problems will occur even in contact with a high-temperature resin in a molten state as an ultraviolet curable resin before curing.

In general, quartz glass is low in thermal expansion coefficient which is about $1 \times 10^{-7}$ to $6 \times 10^{-7}$/K, that is, a material which is less likely to crack by thermal expansion. Therefore, quartz glass is less influenced by thermal impact resulting from a sudden change in temperature and less likely to crack resulting from sudden heating or sudden cooling. Further, quartz glass is an oxide and, therefore, will not undergo a change in chemical structure even when being heated in an atmosphere and is free of distortion of a recess and protrusion structure by volume expansion resulting from the change in chemical structure.

In reality, the inventor of the application concerned conducted an experiment in which the master medium M1 and the reproduction medium M3 according to the present invention were gradually heated up to 1170° C. and thereafter cooled for a duration of about 700 minutes and then tried to read out recorded digital data, finding that the data could be read out without any problem. Further, the inventor used an optical microscope to observe the recess and protrusion structure, finding no significant difference when the media were compared before and after the experiment. Therefore, the media prepared by the method according to the present invention are able to perform functions to store information without any problem even where they are exposed to the fire stipulated in ISO834.

Further, quartz glass is extremely high in corrosion resistance and will not undergo corrosion even when being submerged into a sulfate bath. In reality, materials which can corrode quartz are only alkali and hydrofluoric acid. Quartz will not undergo corrosion by a material other than the above-described materials. Hydrofluoric acid is produced on an industrial scale by mixing sulfuric acid with fluorite (calcium fluoride), and this is a compound which is not present in nature. Therefore, the quartz glass substrate is able to pass down information to generations on a longer time scale of several hundred to several thousand years.

The above-described high corrosion resistance is advantageous in giving a higher degree of freedom to a detergent to be used. For example, when a quartz glass substrate is heated up to a high temperature, with alkali or an alkali earth metal attached thereto, crystallization proceeds, resulting in possible cracking of the quartz glass substrate. Further, there is a case that a resin or the like may attach on the quartz glass substrate in the intermediate medium preparation step or in the reproduction medium preparation step. It is, therefore, preferable that the surface of the quartz glass substrate is washed, whenever necessary. And, in this connection, quartz glass is high in corrosion resistance and can be washed not only by using water but also by using various types of detergents such as acids and organic solvents.

Quartz glass is also highly resistant to electromagnetic waves such as ultraviolet rays and X-rays and will not undergo deterioration even upon exposure to the electromagnetic waves. Quartz glass may undergo deterioration by irradiation of gamma rays but will be free of any possibility of deterioration by irradiation of electromagnetic waves at least found in nature or by artificially irradiated X-rays (for example, possible irradiation at baggage inspection in an airport, etc.).

In Section 8(1), a description has been given of an example, as a modified example, in which the remaining part 16 or 76 of the chromium layer is allowed to remain as it is on the upper face of the quartz glass substrate. Chromium will undergo corrosion by acid, and where information is to be stored on a longer time scale of several hundred to several thousand years, it is preferable that the chromium layer is removed and a single-layered quartz glass substrate is used to prepare the master medium M1 and the reproduction medium M3.

Further, quartz glass which is high in transparency is advantageous in that light can be irradiated through the quartz glass substrate even where there is used a resin which will be cured by irradiation of light in the intermediate medium preparation step and in the reproduction medium preparation step. In the case of the quartz glass substrate (6.35 mm in thickness) used in the above-described example, light transmittance of 90% or higher is obtained over a wide range of wavelength from 260 to 1000 nm (for example, light transmittance of 94.3% at a wavelength of 650 nm and light transmittance of 93.5% at a wavelength of 300 nm). Therefore, even where ultraviolet rays are irradiated through a quartz glass substrate for curing an ultraviolet curable resin, a resin layer can be efficiently subjected to light irradiation. Further, since light transmittance is high over a wide range of wavelength, heat generation resulting from light absorption is scarce, and adverse influences on each process from the heat generation can be kept low.

A description has been so far given of reasons that a medium which includes a quartz glass substrate is preferably used as the master medium M1 and the reproduction medium M3. Further, in Section 8(2), a description has also been given of the fact that a quartz glass substrate having rigidity is in practice preferably used as the master medium M1 and the reproduction medium M3. On the other hand, the intermediate medium M2 which is used in the example so far described is a medium which has characteristics exactly reverse to those of the master medium M1 and reproduction medium M3.

In Section 7, there has been described an example in which a two-layer structure body composed of a 0.1 mm-thick PET film and an ultraviolet curable resin layer is used as the intermediate medium M2. The above-described intermediate medium M2 has flexibility and is, therefore, advantageous in that the medium can be curved and thereby easily peeled in a peeling process on preparation of the master medium M1 or the reproduction medium M3, each of which is made of a rigid body. And, this advantage has already been described.

Further, the intermediate medium M2 made of the above-described material is low in heat resistance and corrosion resistance and it will melt on heating and undergo deterioration by acid, etc. Therefore, the above-described intermediate medium M2 is not suitable for long-term storage. However, in executing the present invention, the intermediate medium M2 can be advantageously used, because the intermediate medium M2 is reverse in recess and protrusion structure to the master medium M1 or the reproduction medium M3 and, therefore, there is provided no such information that digital data to be stored is correctly recorded.

Of course, after recognition that the recess and protrusion structure has been reversed, it is possible to read out information from the intermediate medium M2. However, when the intermediate medium M2 is taken as a medium for passing down information to generations on a longer time scale of several hundred to several thousand years, the fact that the intermediate medium M2 still having the reversed recess and protrusion structure may cause confusion, and this is not desirable. In the above-described perspective, it is preferable that the intermediate medium M2 is constituted with a material low in heat resistance or corrosion resistance and can be discarded easily. In reality, the intermediate medium M2 which is composed of the above-described PET film and the ultraviolet curable resin layer is thermally deformed and dissolved in acid and, therefore, can be easily discarded.

<<<Section 10. Still Another Example of Alignment Marks>>>

Figure 18:
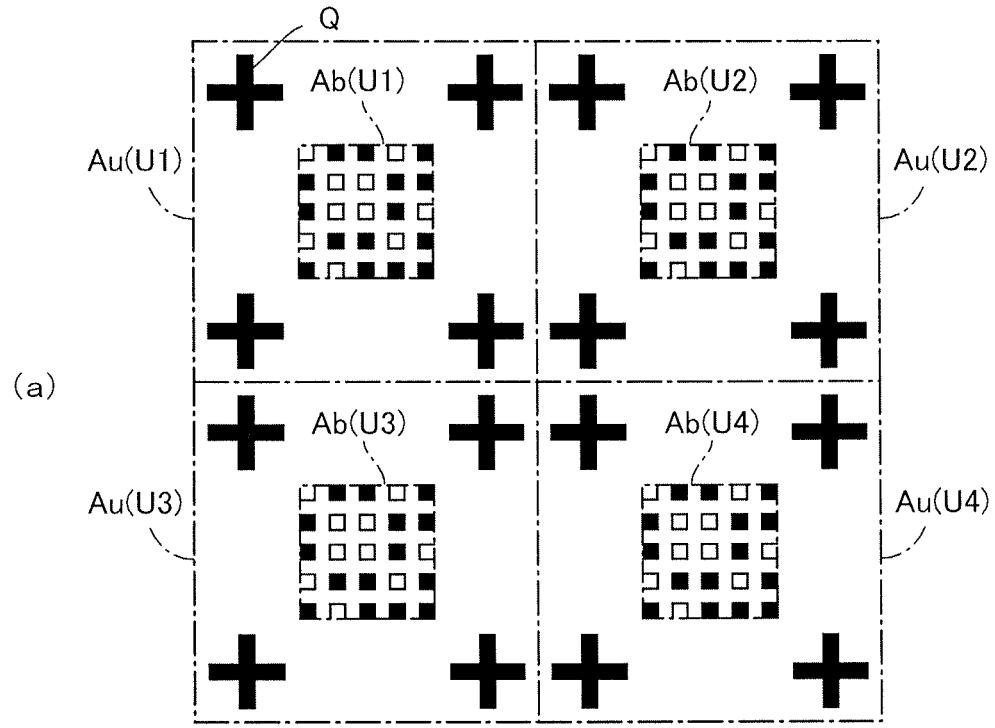
FIG. 18 is s set of plan views which show still another variation of the alignment marks.
Figure 18:
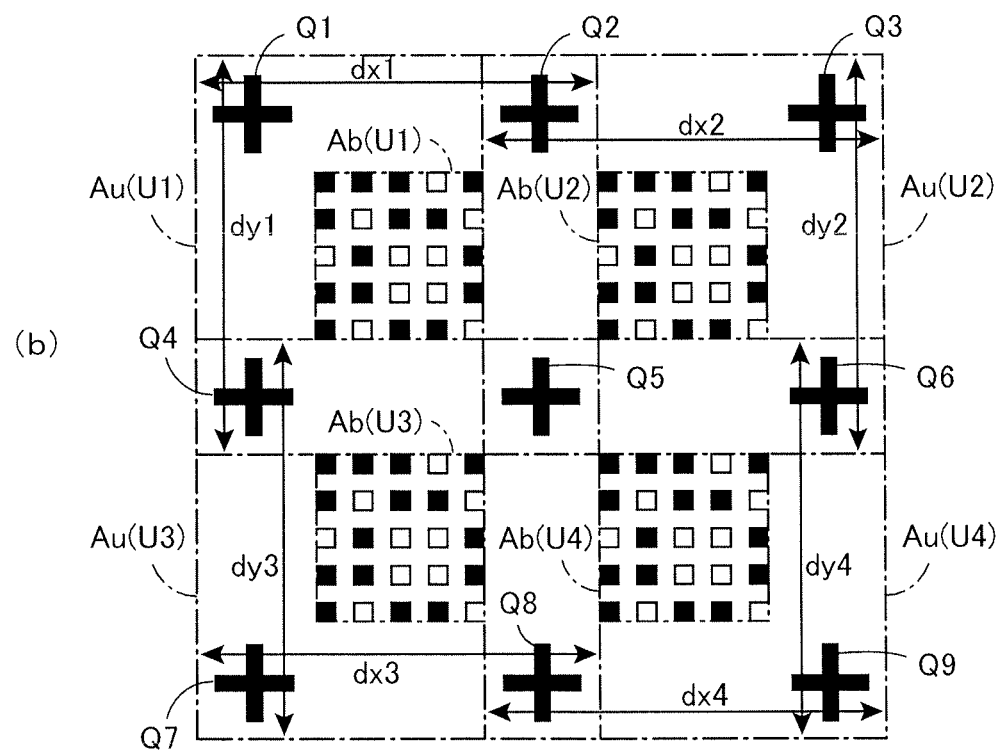

Lastly, a description will be given of some other examples of a method for forming alignment marks in the method for manufacturing an information recording medium according to the present invention. At a bottom part of FIG. 2, there is shown an example in which four sets of unit recording graphic patterns R(U1) to R(U4) are arranged in a two-dimensional matrix form to create a drawing pattern P(E). FIGS. 18(a) and (b) are each a plan view which shows a modified example of the drawing pattern P(E) shown in FIG. 2. In FIGS. 18(a) and (b), for the sake of convenience of description, a bit "1" is indicated by a small black square and a bit "0" is indicated by a small white square. In reality, the small white square is not drawn as an actual pattern.

The modified example shown in FIG. 18(a) is such that, as with the example shown in FIG. 2, four sets of unit recording graphic patterns are arranged in a two-dimensional matrix form. Four sets of square domains enclosed by a single dotted and dashed line are respectively unit recording domains Au(U1) to Au(U4), and the unit recording graphic patterns R(U1) to R(U4) are respectively arranged in the interiors of these domains. Further, bit recording domains Ab(U1) to Ab(U4) are provided respectively at center parts of the unit recording domains Au(U1) to Au(U4), and a unit bit graphic pattern at which small white and black squares are arranged in 5 rows and 5 columns is arranged at each of the center parts. Further, cross-shaped alignment marks Q are arranged at four corners around the respective bit recording domains Ab(U1) to Ab(U4).

In the modified example shown in FIG. 18(a), the cross-shaped alignment mark Q is rather large and conspicuous as compared with that in the example shown in FIG. 2. In the case of the example shown in FIG. 2, the cross-shaped alignment mark Q is substantially similar in size to a small square which indicates each bit. This is also true for the example shown in FIG. 3. In contrast thereto, in the example shown in FIG. 18(a), the alignment marks Q are set as rather large cross-shaped marks, by which the alignment marks Q can be recognized more easily in executing a bit recording domain recognizing step S23 of the information readout processing shown in FIG. 12.

As described above, the alignment mark Q can be set in any shape, any size and any arrangement, with consideration given to convenience of the information readout processing. There can be adopted various variations in shape, for example, as shown in FIG. 9. Further, as for the size, it is preferable to use the alignment marks Q which are as large as possible for making an easier recognition at the time of reading out information, as shown in FIG. 18(a). However, in order to increase the recording density of information, as shown in FIG. 2, it is preferable to use the alignment marks Q which are as small as possible. On the other hand, there is no particular restriction on the arrangement. In order to avoid possible confusion with individual bit figures, however, it is preferable that the alignment mark is arranged outside the bit recording domain Ab. In FIG. 3, there is shown an example in which four alignment marks Q1 to Q4 are arranged on the grid lines of X1, X7, Y1, Y7. If a positional relationship between each of the alignment marks Q and a bit figure is determined, the alignment marks Q are not necessarily required to be arranged each on a grid line.

On the other hand, the modified example shown in FIG. 18(b) is an example in which a plurality of unit recording domains are arranged so as to partially overlap vertically and laterally, thereby forming common alignment marks. Specifically, in FIG. 18(b), there is shown an example in which four sets of square-shaped unit recording domains Au(U1) to Au(U4) are allowed to partially overlap vertically and laterally and arranged in a two-dimensional matrix form, thereby creating a drawing pattern which contains four sets of the unit recording graphic patterns. It is noted that individual arrows dx1 to dx4 and dy1 to dy4 shown in the drawing are to indicate vertical and horizontal dimensions of each of the unit recording domains Au(U1) to Au(U4) and they are not factors which form the drawing pattern.

First, the first unit recording domain Au(U1) is a square-shaped domain having a horizontal dimension dx1 and a vertical dimension dy1, and the bit recording domain Ab(U1) is arranged at a center part thereof. Alignment marks Q1, Q2, Q4 and Q5 are arranged at four corners thereof. The above-described basic constitution is the same as that of the first unit recording domain Au(U1) shown in FIG. 18(a). Further, the second unit recording domain Au(U2) is a square-shaped domain having a horizontal dimension dx2 and a vertical dimension dy2, and the bit recording domain Ab(U2) is arranged at a center part thereof. Alignment marks Q2, Q3, Q5 and Q6 are arranged at four corners thereof. The above-described basic constitution is the same as that of the second unit recording domain Au (U2) shown in FIG. 18(a).

Similarly, the third unit recording domain Au(U3) is a square-shaped domain having a horizontal dimension dx3 and a vertical dimension dy3, and the bit recording domain Ab(U3) is arranged at a center part thereof. Alignment marks Q4, Q5, Q7 and Q8 are arranged at four corners thereof. The above-described basic constitution is the same as that of the third unit recording domain Au(U3) shown in FIG. 18(a). Further, the fourth unit recording domain Au(U4) is a square-shaped domain having a horizontal dimension dx4 and a vertical dimension dy4, and the bit recording domain Ab(U4) is arranged at a center part thereof. Alignment marks Q5, Q6, Q8 and Q9 are arranged at four corners thereof. The above-described basic constitution is the same as that of the fourth unit recording domain Au(U4) shown in FIG. 18(a).

The modified example shown in FIG. 18(b) is characterized in that the unit recording domains Au(U1) and Au(U2) adjacently arranged laterally are arranged so as to overlap partially (an overlapped zone by the arrows dx1, dx2), the unit recording domains Au(U3) and Au(U4) adjacently arranged laterally are arranged so as to overlap partially (an overlapped zone by the arrows dx3, dx4) and also that the unit recording domains Au(U1) and Au(U3) adjacently arranged vertically are arranged so as to overlap partially (an overlapped zone by the arrows dy1, dy3) and the unit recording domains Au(U2) and Au(U4) adjacently arranged vertically are arranged so as to overlap partially (an overlapped zone by the arrows dy2, dy4). As a result, it is possible to arrange an alignment mark which can be utilized in common to a lateral unit recording domain or a vertical unit recording domain at an overlapped domain.

Specifically, in the case of the example shown in FIG. 18(b), at a domain overlapped by the pair of unit recording domains Au(U1), Au(U2) adjacently arranged laterally, the alignment marks Q2, Q5 are arranged. These alignment marks Q2, Q5 are alignment marks which are included at the right end of the unit recording domain Au(U1) on the left side and also alignment marks which are included at the left end of the unit recording domain Au(U2) on the right side, that is, common alignment marks on left and right. Further, at a domain overlapped by the pair of unit recording domains Au(U3), Au(U4) adjacently arranged laterally, the alignment marks Q5, Q8 are arranged. These alignment marks Q5, Q8 are alignment marks which are included at the right end of the unit recording domain Au(U3) on the left side and also alignment marks which are included at the left end of the unit recording domain Au(U4) on the right side, that is, common alignment marks on left and right.

Similarly, at a domain overlapped by the pair of unit recording domains Au(U1), Au(U3) adjacently arranged vertically, the alignment marks Q4, Q5 are arranged. These alignment marks Q4, Q5 are alignment marks which are included at the lower end of the unit recording domain Au(U1) on the upper side and also alignment marks which are included at the upper end of the unit recording domain Au(U3) on the lower side, that is, common alignment marks on the upper and lower sides. Further, at a domain overlapped by the pair of unit recording domains Au(U2), Au(U4) adjacently arranged vertically, the alignment marks Q5, Q6 are arranged. These alignment marks Q5, Q6 are alignment marks which are included at the lower end of the unit recording domain Au(U2) on the upper side and also alignment marks which are included at the upper end of the unit recording domain Au(U4) on the lower side, that is, common alignment marks on the upper and lower sides.

As described above, a plurality of unit recording domains are arranged vertically and laterally so as to overlap partially, thereby forming a common alignment mark at an overlapped part, thus making it possible to reduce the number of alignment marks. It is, therefore, possible to improve the recording density of information. In reality, the example shown in FIG. 18(a) is compared with the example shown in FIG. 18(b) to find that a ratio of area occupied by the bit recording domain Ab is improved to a greater extent in the latter than in the former, thereby contributing to improvement in recording density of information.

INDUSTRIAL APPLICABILITY

The method for manufacturing an information recording medium according to the present invention can be used in an application that stores various types of digital data such as literal information, image information, motion image information and sound information permanently on a very long time scale of several dozens of years.

The invention claimed is:

1. A method for manufacturing an information recording medium which prepares a plurality of information recording media in which a same digital data has been recorded, the method comprising:
a master medium preparation step in which a process for recording digital data to be stored as a recess and protrusion structure pattern on a recording surface of a first recording medium is performed to prepare a master medium;
an intermediate medium preparation step in which a process for transferring the recess and protrusion structure pattern recorded at the master medium onto a recording surface of a second recording medium is performed to prepare an intermediate medium; and
a reproduction medium preparation step in which a process for transferring the recess and protrusion structure pattern recorded at the intermediate medium on a recording surface of a third recording medium is performed to prepare a reproduction medium; wherein
in the master medium preparation step, a medium which includes a quartz glass substrate as the first recording medium is used to form a resist layer on a surface of the first recording medium, beam exposure is performed on a surface of the resist layer to draw a graphic pattern which shows bit information of digital data to be stored, the resist layer is developed to remove a part thereof, etching processing is performed, with a remaining part of the resist layer given as a mask, thereby preparing the master medium which includes a quartz glass substrate having a first recess and protrusion structure pattern on a surface thereof,
in the intermediate medium preparation step, a shape formation process which utilizes the first recess and protrusion structure pattern formed on the surface of the master medium is performed to form, on the recording surface of the second recording medium, a second recess and protrusion structure pattern which is reverse in recess and protrusion relationship to the first recess and protrusion structure pattern,
in the reproduction medium preparation step, a medium which includes a quartz glass substrate as the third recording medium is used to form, on the recording surface of the third recording medium, a third recess and protrusion structure pattern which is reverse in recess and protrusion relationship to the second recess and protrusion structure pattern by a shape formation process which utilizes the second recess and protrusion structure pattern formed on the surface of the intermediate medium, and
wherein the first recording medium and the third recording medium are first attribute mediums and the second recording medium is a second attribute medium, and in the shape formation process of the intermediate medium preparation step and the shape formation process of the reproduction medium preparation step, the first attribute medium is curved and peeled from the second attribute medium.

2. The method for manufacturing an information recording medium according to claim 1, wherein
the first attribute medium includes a quartz glass substrate.

3. The method for manufacturing an information recording medium according to claim 1, wherein
the master medium preparation step includes,
a data input step in which a computer inputs digital data to be stored,
a unit data creating step in which the computer divides the digital data by a prescribed bit length unit to create a plurality of unit data,
a unit bit matrix creating step in which the computer arranges data bits which constitute individual unit data in a two-dimensional matrix form to create a unit bit matrix,
a unit bit graphic pattern creating step in which the computer converts the unit bit matrix to a geometrical pattern arranged inside a predetermined bit recording domain, thereby creating a unit bit graphic pattern, a unit recording graphic pattern creating step in which the computer adds an alignment mark to the unit bit graphic pattern, thereby creating a unit recording graphic pattern, a drawing data creating step in which the computer creates drawing data for drawing the unit recording graphic pattern, a beam exposure step in which beam exposure which uses electron beams or laser light is performed on a substrate in which the resist layer is added on the first recording medium, thereby conducting drawing on the basis of the drawing data, and a patterning step in which patterning processing is performed on the substrate which has been exposed, thereby creating the master medium having a physically structured pattern depending on the drawing data.

4. The method for manufacturing an information recording medium according to claim 3, wherein, in the unit bit graphic pattern creating step, one of individual bits "1" and individual bits "0" which constitute the unit bit matrix is converted to individual bit figures composed of a closed domain, in the drawing data creating step, there is created drawing data which shows a contour line of the individual bit figures, in the beam exposure step, beam exposure is performed on a part inside the contour line of the individual bit figures, and in the patterning step, there is formed a physically structured pattern which has a recess and protrusion structure composed of a recess which shows one of a bit "1" and a bit "0" and a protrusion which shows the other of them.

5. The method for manufacturing an information recording medium according to claim 4, wherein, in the patterning step, patterning processing is performed so as to form the master medium in which an interior of each bit figure is given as a recess and an exterior thereof is given as a protrusion.

6. The method for manufacturing an information recording medium according to claim 3, wherein in the unit data creating step, the digital data is divided into unit data composed of (m×n) bits, in the unit bit matrix creating step, there is formed a unit bit matrix composed of m rows and n columns, and in the unit bit graphic pattern creating step, individual bits which constitute the unit bit matrix are allowed to correspond to grid points arranged in an m-row and n-column matrix form, a predetermined-shaped bit figure is arranged on a grid point corresponding to a bit "1" or a bit "0," thereby creating a unit bit graphic pattern.

7. The method for manufacturing an information recording medium according to claim 6, wherein in the unit bit graphic pattern creating step, there is created a unit bit graphic pattern arranged inside a rectangular bit recording domain, in the unit recording graphic pattern creating step, an alignment mark is added outside the rectangular bit recording domain, thereby creating a unit recording graphic pattern arranged inside a rectangular unit recording domain which includes the bit recording domain and the alignment mark, and in the drawing data creating step, the rectangular unit recording domain is arranged in a two-dimensional matrix form, thereby creating a drawing pattern which includes a plurality of unit recording graphic patterns and also creating drawing data for drawing the drawing pattern.

8. The method for manufacturing an information recording medium according to claim 6, wherein, in the unit bit graphic pattern creating step, there is created a unit bit graphic pattern which is arranged inside a rectangular bit recording domain, in the unit recording graphic pattern creating step, an alignment mark is added outside the rectangular bit recording domain, thereby creating a unit recording graphic pattern which is arranged inside a rectangular unit recording domain including the bit recording domain and the alignment mark, in the drawing data creating step, the rectangular unit recording domain is partially overlapped vertically and laterally and arranged in a two-dimensional matrix form, thereby creating a drawing pattern which includes a plurality of unit recording graphic patterns and creating the drawing data for drawing the drawing pattern, and at a domain overlapped by a pair of unit recording domains adjacently arranged laterally, an alignment mark which is included at a right end of a unit recording domain on a left side is overlapped with an alignment mark which is included at a left end of a unit recording domain on a right side to form a common alignment mark on left and right sides, and at a domain overlapped by a pair of unit recording domains adjacently arranged vertically, an alignment mark which is included at a lower end of a unit recording domain on an upper side is overlapped with an alignment mark which is included at an upper end of a unit recording domain on a lower side to form a common alignment mark on upper and lower sides.

9. A method for manufacturing an information recording medium which prepares a plurality of information recording media in which a same digital data has been recorded, the method comprising:

a master medium preparation step in which a process for recording digital data to be stored as a recess and protrusion structure pattern on a recording surface of a first recording medium is performed to prepare a master medium;

an intermediate medium preparation step in which a process for transferring the recess and protrusion structure pattern recorded at the master medium onto a recording surface of a second recording medium is performed to prepare an intermediate medium; and a reproduction medium preparation step in which a process for transferring the recess and protrusion structure pattern recorded at the intermediate medium on a recording surface of a third recording medium is performed to prepare a reproduction medium; wherein in the master medium preparation step, a medium which includes a quartz glass substrate as the first recording medium is used to form a resist layer on a surface of the first recording medium, beam exposure is performed on a surface of the resist layer to draw a graphic pattern which shows bit information of digital data to be stored, the resist layer is developed to remove a part thereof, etching processing is performed, with a remaining part of the resist layer given as a mask, thereby preparing the master medium which includes a quartz glass substrate having a first recess and protrusion structure pattern on a surface thereof, in the intermediate medium preparation step, a shape formation process which utilizes the first recess and protrusion structure pattern formed on the surface of the master medium is performed to form, on the recording surface of the second recording medium, a second recess and protrusion structure pattern which is reverse in recess and protrusion relationship to the first recess and protrusion structure pattern, in the reproduction medium preparation step, a medium which includes a quartz glass substrate as the third recording medium is used to form, on the recording surface of the third recording medium, a third recess and protrusion structure pattern which is reverse in recess and protrusion relationship to the second recess and protrusion structure pattern by a shape formation process which utilizes the second recess and protrusion structure pattern formed on the surface of the intermediate medium wherein the recording surface of the third recording medium is etched, wherein the first recording medium and the third recording medium are first attribute mediums and the second recording medium is a second attribute medium, and in the shape formation process of the intermediate medium preparation step and the shape formation process of the reproduction medium preparation step, the second attribute medium is curved and peeled from the first attribute medium, wherein the master medium preparation step includes, a data input step in which a computer inputs digital data to be stored, a unit data creating step in which the computer divides the digital data by a prescribed bit length unit to create a plurality of unit data, a unit bit matrix creating step in which the computer arranges data bits which constitute individual unit data in a two-dimensional matrix form to create a unit bit matrix, a unit bit graphic pattern creating step in which the computer converts the unit bit matrix to a geometrical pattern arranged inside a predetermined bit recording domain, thereby creating a unit bit graphic pattern, a unit recording graphic pattern creating step in which the computer adds an alignment mark to the unit bit graphic pattern, thereby creating a unit recording graphic pattern, a drawing data creating step in which the computer creates drawing data for drawing the unit recording graphic pattern, a beam exposure step in which beam exposure which uses electron beams or laser light is performed on a substrate in which the resist layer is added on the first recording medium, thereby conducting drawing on the basis of the drawing data, and a patterning step in which patterning processing is performed on the substrate which has been exposed, thereby creating the master medium having a physically structured pattern depending on the drawing data, and wherein, in the unit bit graphic pattern creating step, one of individual bits "1" and individual bits "0" which constitute the unit bit matrix is converted to individual bit figures composed of a closed domain, in the drawing data creating step, there is created drawing data which shows a contour line of the individual bit figures, in the beam exposure step, beam exposure is performed on a part inside the contour line of the individual bit figures, and in the patterning step, there is formed a physically structured pattern which has a recess and protrusion structure composed of a recess which shows one of a bit "1" and a bit "0" and a protrusion which shows the other of them.

10. The method for manufacturing an information recording medium according to claim 9, wherein the first attribute medium includes a quartz glass substrate.

11. The method for manufacturing an information recording medium according to claim 10, wherein in the master medium preparation step, a medium in which a chromium layer is formed on the upper face of the quartz glass substrate is used as the first recording medium, thereby forming a resist layer on a surface of the first recording medium, beam exposure is performed on a surface of the resist layer to draw a graphic pattern which shows bit information of digital data to be stored, and the resist layer is developed to remove a part thereof, etching processing is performed on the chromium layer, with a remaining part of the resist layer given as a mask, after the remaining part of the resist layer has been peeled and removed, etching processing is performed on the quartz glass substrate, with a remaining part of the chromium layer given as a mask, and the remaining part of the chromium layer is peeled and removed, thereby preparing the master medium composed of a quartz glass substrate having a recess and protrusion structure pattern on the surface thereof.

12. The method for manufacturing an information recording medium according to claim 10, wherein in the intermediate medium preparation step, a resin layer having a property to cure by light irradiation is coated after curing on an upper face of the recess and protrusion structure formed on a surface of the master medium, a resin supporting layer is laminated on an upper face of the resin layer, and a laminated structure body composed of the resin layer and the resin supporting layer is utilized as the second recording medium, the resin layer is cured by light irradiation, and a laminated structure body composed of the cured resin layer and the resin supporting layer is curved and peeled from the master medium, thereby preparing the intermediate medium composed of the thus peeled laminated structure body.

13. The method for manufacturing an information recording medium according to claim 10, wherein in the reproduction medium preparation step, a medium in which a chromium layer is formed on an upper face of the quartz glass substrate is used as the third recording medium, and a resin layer having a property to cure by light irradiation is coated on a surface of the chromium layer of the third recording medium, the intermediate medium is covered on an upper face of the resin layer and pressed so that a resin of the resin layer is filled into a recess on the recess and protrusion structure surface, the resin layer is cured by light irradiation, the intermediate medium is curved by utilizing flexibility thereof and peeled from the cured resin layer, a mask part which is formed by a recess and protrusion structure of the cured resin layer is utilized as a mask to perform etching processing on the chromium layer, and a part thereof is removed, after the remaining part of the resin layer is peeled and removed, etching processing is performed on the quartz glass substrate, with a remaining part of the chromium layer given as a mask, and the remaining part of the chromium layer is peeled and removed to prepare the reproduction medium composed of a quartz glass substrate having a recess and protrusion structure pattern on the surface thereof.

14. The method for manufacturing an information recording medium according to claim 9, wherein, in the patterning step, patterning processing is performed so as to form the master medium in which an interior of each bit figure is given as a recess and an exterior thereof is given as a protrusion.

15. The method for manufacturing an information recording medium according to claim 9, wherein in the unit data creating step, the digital data is divided into unit data composed of (m×n) bits, in the unit bit matrix creating step, there is formed a unit bit matrix composed of m rows and n columns, and in the unit bit graphic pattern creating step, individual bits which constitute the unit bit matrix are allowed to correspond to grid points arranged in an m-row and n-column matrix form, a predetermined-shaped bit figure is arranged on a grid point corresponding to a bit "1" or a bit "0," thereby creating a unit bit graphic pattern.

16. The method for manufacturing an information recording medium according to claim 15, wherein in the unit bit graphic pattern creating step, there is created a unit bit graphic pattern arranged inside a rectangular bit recording domain, in the unit recording graphic pattern creating step, an alignment mark is added outside the rectangular bit recording domain, thereby creating a unit recording graphic pattern arranged inside a rectangular unit recording domain which includes the bit recording domain and the alignment mark, and in the drawing data creating step, the rectangular unit recording domain is arranged in a two-dimensional matrix form, thereby creating a drawing pattern which includes a plurality of unit recording graphic patterns and also creating drawing data for drawing the drawing pattern.

17. The method for manufacturing an information recording medium according to claim 15, wherein, in the unit bit graphic pattern creating step, there is created a unit bit graphic pattern which is arranged inside a rectangular bit recording domain, in the unit recording graphic pattern creating step, an alignment mark is added outside the rectangular bit recording domain, thereby creating a unit recording graphic pattern which is arranged inside a rectangular unit recording domain including the bit recording domain and the alignment mark, in the drawing data creating step, the rectangular unit recording domain is partially overlapped vertically and laterally and arranged in a two-dimensional matrix form, thereby creating a drawing pattern which includes a plurality of unit recording graphic patterns and creating the drawing data for drawing the drawing pattern, and at a domain overlapped by a pair of unit recording domains adjacently arranged laterally, an alignment mark which is included at a right end of a unit recording domain on a left side is overlapped with an alignment mark which is included at a left end of a unit recording domain on a right side to form a common alignment mark on left and right sides, and at a domain overlapped by a pair of unit recording domains adjacently arranged vertically, an alignment mark which is included at a lower end of a unit recording domain on an upper side is overlapped with an alignment mark which is included at an upper end of a unit recording domain on a lower side to form a common alignment mark on upper and lower sides.

* * * * *